(12) United States Patent
Uchida

(10) Patent No.: US 12,538,707 B2
(45) Date of Patent: Jan. 27, 2026

(54) THERMOELECTRIC CONVERSION MODULE AND METHOD OF PRODUCING THERMOELECTRIC CONVERSION MODULE

(71) Applicant: ZEON CORPORATION, Tokyo (JP)

(72) Inventor: Hideki Uchida, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 63 days.

(21) Appl. No.: 18/249,969

(22) PCT Filed: Oct. 25, 2021

(86) PCT No.: PCT/JP2021/039358
§ 371 (c)(1),
(2) Date: Apr. 21, 2023

(87) PCT Pub. No.: WO2022/092039
PCT Pub. Date: May 5, 2022

(65) Prior Publication Data
US 2023/0389429 A1 Nov. 30, 2023

(30) Foreign Application Priority Data
Oct. 30, 2020 (JP) .................... 2020-183236

(51) Int. Cl.
*H10N 19/00* (2023.01)
*H10N 10/01* (2023.01)

(52) U.S. Cl.
CPC ............. *H10N 19/00* (2023.02); *H10N 10/01* (2023.02)

(58) Field of Classification Search
CPC ............. H10N 10/00; H10N 10/80–82; H10N 10/856; H10N 10/857; H10N 19/00
See application file for complete search history.

(56) References Cited

U.S. PATENT DOCUMENTS 3,554,815 A 1/1971 Otto
8,318,308 B2 11/2012 Hata et al.
(Continued)

FOREIGN PATENT DOCUMENTS

CN    105576112 A * 5/2016 ............. H01L 31/02
EP    2975660 A1   1/2016
(Continued)

OTHER PUBLICATIONS

English machine translation of Suzuki et al. (WO 2017/038553) published Mar. 9, 2017.*
(Continued)

*Primary Examiner* — Christina Chern
(74) *Attorney, Agent, or Firm* — KENJA IP LAW PC

(57) ABSTRACT

A thermoelectric conversion module includes an electrically insulating sheet substrate having opposite front and rear surfaces, a plurality of thermoelectric conversion elements, and a connector. The plurality of thermoelectric conversion elements have an elongated shape extending along a first direction. The connector electrically connects the plurality of thermoelectric conversion elements in series at a lengthwise end of each thermoelectric conversion element from a first electrode to a second electrode. Odd-numbered thermoelectric conversion elements among the plurality of thermoelectric conversion elements electrically connected in (Continued)

series through the connector, as counted from the first electrode, are located at the front surface side and lined up along a second direction intersecting the first direction. Even-numbered thermoelectric conversion elements among the plurality of thermoelectric conversion elements electrically connected in series through the connector, as counted from the first electrode, are located at the rear surface side and lined up along the second direction.

11 Claims, 22 Drawing Sheets

(56) References Cited

U.S. PATENT DOCUMENTS

| | | | |
|---|---|---|---|
| 10,868,077 B2 | 12/2020 | Carroll | |
| 10,910,542 B2 | 2/2021 | Nakamura et al. | |
| 2002/0139123 A1* | 10/2002 | Bell | F25B 21/02 |
| | | | 136/204 |
| 2006/0048809 A1* | 3/2006 | Onvural | H10N 10/17 |
| | | | 136/212 |
| 2016/0233402 A1* | 8/2016 | Suda | H10N 10/81 |

FOREIGN PATENT DOCUMENTS

| | | | |
|---|---|---|---|
| JP | 2017152682 A | 8/2017 | |
| WO | WO-2005124881 A1 * | 12/2005 | ............ H01L 35/10 |
| WO | 2006011655 A1 | 2/2006 | |
| WO | 2009028337 A1 | 3/2009 | |
| WO | 2015019811 A1 | 2/2015 | |
| WO | 2017038553 A1 | 3/2017 | |

OTHER PUBLICATIONS

English machine translation of Huang et al. (CN 105576112) published May 11, 2016.*
English machine translation of Takahashi (WO 2005/124881) published Dec. 29, 2005.*
Sep. 6, 2024, The Extended European Search Report issued by the European Patent Office in the corresponding European Patent Application No. 21886157.3.
Jan. 18, 2022, International Search Report issued in the International Patent Application No. PCT/JP2021/039358.
May 2, 2023, International Preliminary Report on Patentability issued in the International Patent Application No. PCT/JP2021/039358.

* cited by examiner

THERMOELECTRIC CONVERSION MODULE AND METHOD OF PRODUCING THERMOELECTRIC CONVERSION MODULE

TECHNICAL FIELD

The present disclosure relates to a thermoelectric conversion module and a method of producing a thermoelectric conversion module.

BACKGROUND

Thermoelectric conversion devices that convert thermal energy to electrical energy are conventionally known (for example, refer to Patent Literature (PTL) 1). A thermoelectric conversion device that is described in PTL 1 includes a stacked structure of a p-type layer and an n-type layer.

CITATION LIST

Patent Literature

PTL 1: JP2017-152682A

SUMMARY

Technical Problem

In the thermoelectric conversion device described in PTL 1, it is desirable to line up stacked structures of a p-type layer and an n-type layer so as to increase generated electrical power. However, lining up stacked structures of a p-type layer and an n-type layer results in increased thermoelectric conversion device size.

Accordingly, an object of the present disclosure is to solve the problem set forth above and provide a thermoelectric conversion module and a method of producing a thermoelectric conversion module having increased generated electrical power while also having reduced size.

Solution to Problem

The present disclosure aims to advantageously solve the problem set forth above, and a presently disclosed thermoelectric conversion module comprises: a sheet substrate that is electrically insulating and that has a front surface and a rear surface that are opposite to each other; a plurality of thermoelectric conversion elements having an elongated shape extending along a first direction; and a connector that, from a first electrode to a second electrode, electrically connects the plurality of thermoelectric conversion elements in series at a lengthwise end of each thermoelectric conversion element, wherein odd-numbered thermoelectric conversion elements among the plurality of thermoelectric conversion elements that are electrically connected in series through the connector, as counted from the first electrode, are located at a side corresponding to the front surface and are lined up along a second direction intersecting the first direction, and even-numbered thermoelectric conversion elements among the plurality of thermoelectric conversion elements that are electrically connected in series through the connector, as counted from the first electrode, are located at a side corresponding to the rear surface and are lined up along the second direction. As a result of the thermoelectric conversion elements being located at both the front surface and the rear surface of the sheet substrate in this manner, it is possible to increase the density of thermoelectric conversion elements in the thermoelectric conversion module. By increasing the density of thermoelectric conversion elements in the thermoelectric conversion module, it is possible to increase generated electrical power while also reducing the size of the thermoelectric conversion module.

In the presently disclosed thermoelectric conversion module, it is preferable that the odd-numbered thermoelectric conversion elements that are located at the side corresponding to the front surface are located such as to overlap with the even-numbered thermoelectric conversion elements that are located at the side corresponding to the rear surface in plan view of the sheet substrate. A configuration such as set forth above enables compactization of the thermoelectric conversion module.

In the presently disclosed thermoelectric conversion module, it is preferable that the thermoelectric conversion elements that are located at the side corresponding to the front surface are p-type thermoelectric conversion elements, and the thermoelectric conversion elements that are located at the side corresponding to the rear surface are n-type thermoelectric conversion elements.

In the presently disclosed thermoelectric conversion module, it is preferable that the plurality of thermoelectric conversion elements included in the thermoelectric conversion module are all p-type thermoelectric conversion elements. Depending on the thermoelectric conversion material forming the thermoelectric conversion elements, durability may be higher for p-type thermoelectric conversion elements than n-type thermoelectric conversion elements. Thus, the thermoelectric conversion module can be provided with excellent durability through the plurality of thermoelectric conversion elements all being p-type thermoelectric conversion elements.

In the presently disclosed thermoelectric conversion module, it is preferable that the plurality of thermoelectric conversion elements included in the thermoelectric conversion module all contain carbon nanotubes. A configuration such as set forth above can further improve mechanical strength of the thermoelectric conversion module and enables weight reduction of the thermoelectric conversion module.

In the presently disclosed thermoelectric conversion module, it is preferable that the plurality of thermoelectric conversion elements included in the thermoelectric conversion module all have rectangular shapes that are of roughly the same dimensions. A configuration such as set forth above enables compactization of the thermoelectric conversion module.

In the presently disclosed thermoelectric conversion module, it is preferable that for the plurality of thermoelectric conversion elements included in the thermoelectric conversion module, respective lengths of the plurality of thermoelectric conversion elements along the first direction, respective widths of the plurality of thermoelectric conversion elements along the second direction, and respective thicknesses of the plurality of thermoelectric conversion elements are adjusted such that respective electrical resistance values of the plurality of thermoelectric conversion elements are roughly the same. Through the plurality of thermoelectric conversion elements each having the same electrical resistance value, electrical power loss in the thermoelectric conversion module can be reduced.

In the presently disclosed thermoelectric conversion module, it is preferable that the respective thicknesses of the plurality of thermoelectric conversion elements included in the thermoelectric conversion module are roughly the same, the respective lengths of the plurality of thermoelectric conversion elements differ, and the respective widths of the plurality of thermoelectric conversion elements differ.

In the presently disclosed thermoelectric conversion module, it is preferable that the sheet substrate has a trapezoidal shape, the sheet substrate has a first edge corresponding to one leg among two legs of a trapezoid and a second edge corresponding to another leg among the two legs, a distance between the first edge and the second edge in the first direction increases along the second direction, and the plurality of thermoelectric conversion elements extend along the first direction from the first edge to the second edge. Through the sheet substrate having a trapezoidal shape, the degree of freedom of arrangement location of the thermoelectric conversion module can increase.

The present disclosure aims to advantageously solve the problem set forth above, and a presently disclosed method of producing a thermoelectric conversion module is a method of producing a thermoelectric conversion module that includes: a sheet substrate that is electrically insulating and that has a front surface and a rear surface that are opposite to each other; a plurality of thermoelectric conversion elements having an elongated shape extending along a first direction; and a connector that electrically connects the plurality of thermoelectric conversion elements in series at a lengthwise end of each thermoelectric conversion element, the method comprising: an electrode layer formation step of, with respect to a substrate that is electrically insulating and that has a front surface and a rear surface that are opposite to each other, forming an electrode layer on either or both of the front surface and the rear surface; an insulating layer formation step of forming an insulating layer on the electrode layer that has been formed on the substrate, where the sheet substrate has a configuration including the substrate and the insulating layer; an element formation step of forming a thermoelectric conversion element layer on the insulating layer and on a surface of the substrate where the electrode layer is not formed; a thermoelectric conversion element formation step of cutting the thermoelectric conversion element layer along the first direction to form a plurality of thermoelectric conversion elements lined up along a second direction intersecting the first direction; and a connection step of connecting both lengthwise ends of each thermoelectric conversion element through a connector such that the plurality of thermoelectric conversion elements are all electrically connected in series. A production method such as set forth above makes it possible to provide a thermoelectric conversion module having increased generated electrical power while also having reduced size.

In the presently disclosed method of producing a thermoelectric conversion module, it is preferable that the electrode layer is only formed on the front surface of the substrate.

In the presently disclosed method of producing a thermoelectric conversion module, the thermoelectric conversion element layer is preferably a layer that contains carbon nanotubes. Through a configuration such as set forth above, mechanical strength can be further improved, and a lightweight thermoelectric conversion module can be produced.

In the presently disclosed method of producing a thermoelectric conversion module, the thermoelectric conversion element formation step is preferably performed using a UV laser, a nanosecond laser, or a femtosecond laser. By using a UV laser, a nanosecond laser, or a femtosecond laser, it is possible to reduce heat generation due to the laser. Reducing heat generation due to the laser makes it possible to suppress widening of gaps between the thermoelectric conversion elements in the second direction and to increase the density of thermoelectric conversion elements in the thermoelectric conversion module.

Advantageous Effect

According to the present disclosure, it is possible to provide a thermoelectric conversion module and a method of producing a thermoelectric conversion module having increased generated electrical power while also having reduced size.

DETAILED DESCRIPTION

Figure 1:
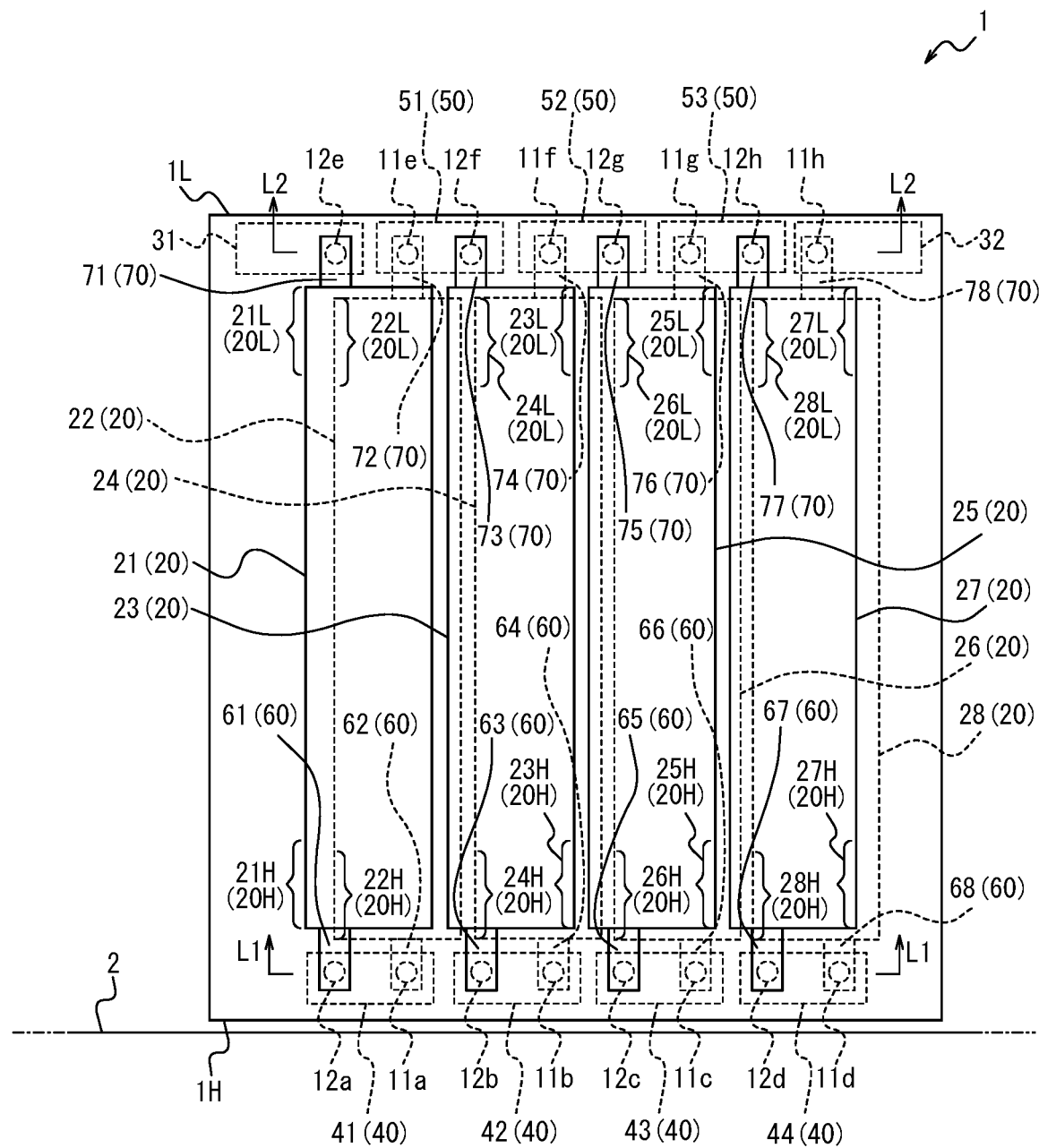
FIG. 1 is an external view of a thermoelectric conversion module according to a first embodiment of the present disclosure.

The following describes embodiments according to the present disclosure with reference to the drawings. Common elements of configuration in the drawings are allotted the same reference signs.

FIRST EMBODIMENT

Figure 2:
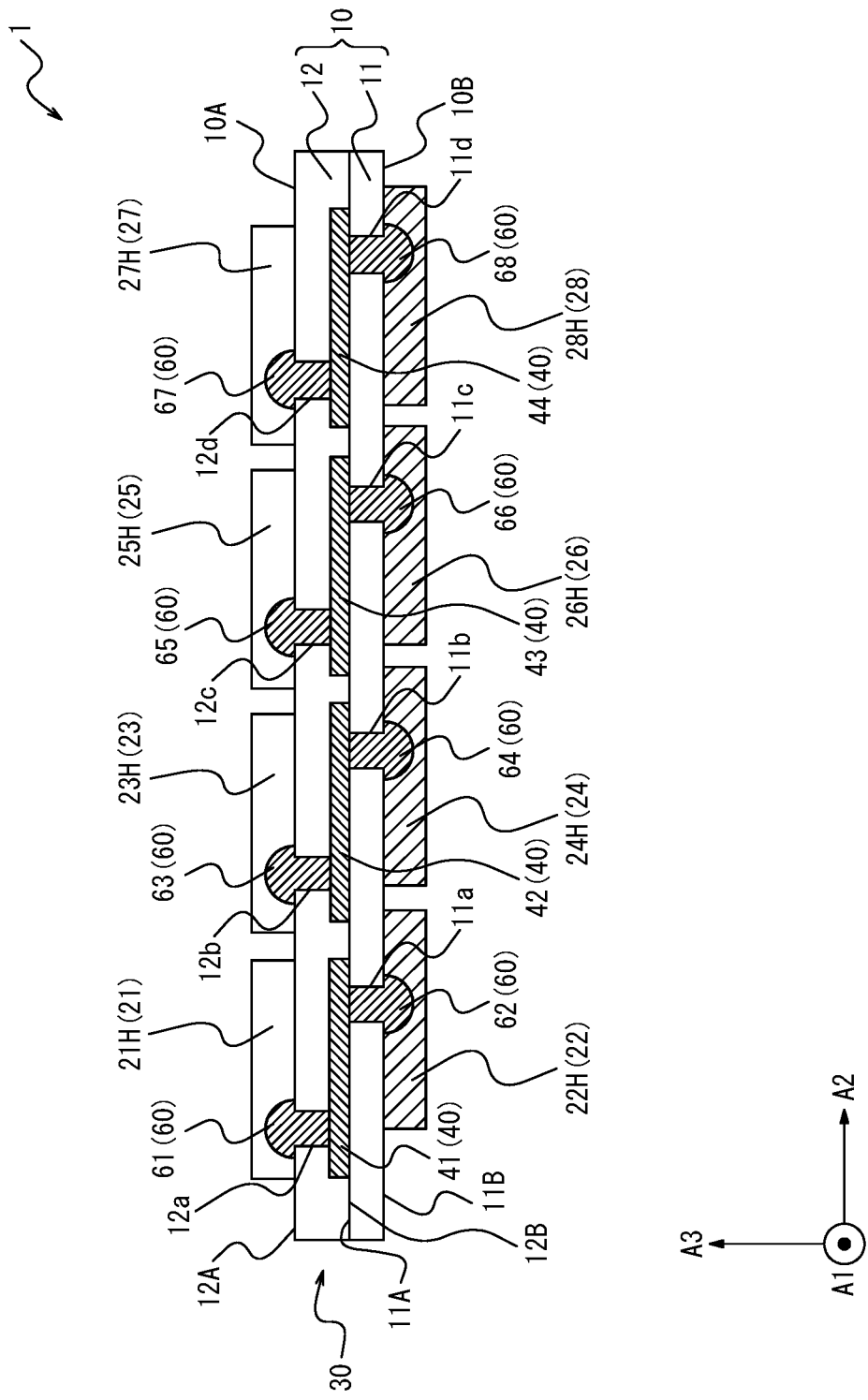
FIG. 2 is a cross-sectional view of the thermoelectric conversion module along a line L1-L1 illustrated in FIG. 1.
Figure 3:
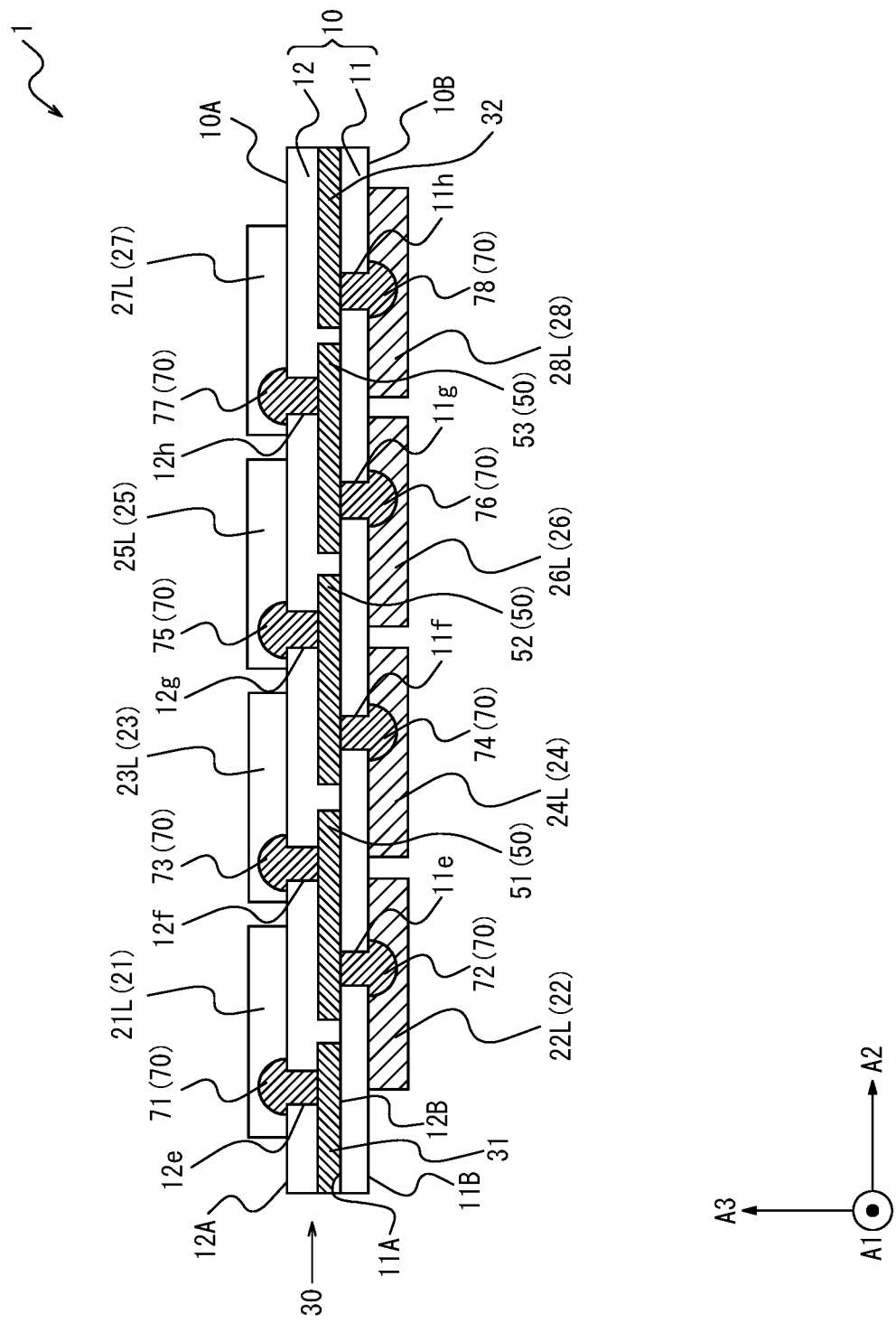
FIG. 3 is a cross-sectional view of the thermoelectric conversion module along a line L2-L2 illustrated in FIG. 1.
Figure 4:
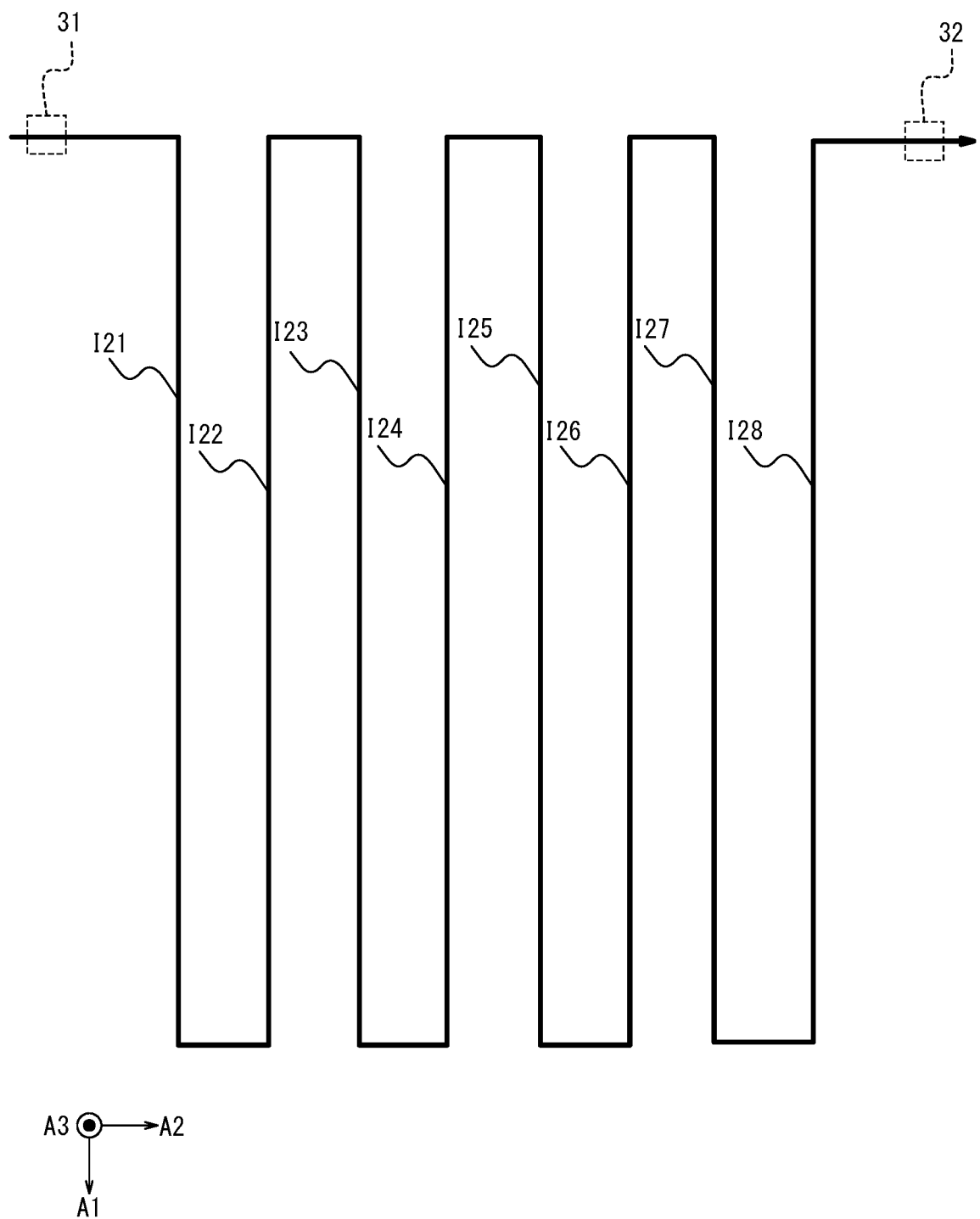
FIG. 4 illustrates a current path in the thermoelectric conversion module illustrated in FIG. 1.

FIG. 1 is an external view of a thermoelectric conversion module 1 according to a first embodiment of the present disclosure. FIG. 2 is a cross-sectional view of the thermoelectric conversion module 1 along a line L1-L1 illustrated in FIG. 1. FIG. 3 is a cross-sectional view of the thermoelectric conversion module along a line L2-L2 illustrated in FIG. 1. FIG. 4 illustrates a current path in the thermoelectric conversion module illustrated in FIG. 1.

As illustrated in FIG. 1, the thermoelectric conversion module 1 can be arranged at a heat source 2. The thermoelectric conversion module 1 has a first edge 1H and a second edge 1L on a sheet substrate 10, which is described further below. The first edge 1H and the second edge 1L are opposite to each other. The first edge 1H can be located close to the heat source 2 when the thermoelectric conversion module 1 is arranged at the heat source 2. The second edge 1L can be located far from the heat source 2 when the thermoelectric conversion module 1 is arranged at the heat source 2.

The temperature around the first edge 1H can be higher than the temperature around the second edge 1L as a result of the first edge 1H being located further toward the heat source 2 than the second edge 1L. In other words, the temperature around the second edge 1L can be lower than the temperature around the first edge 1H.

In FIG. 1, a first direction A1 is a direction in which the first edge 1H and the second edge 1L are opposite to each other. In the present embodiment, the first direction A1 is defined as a direction toward the first edge 1H from the second edge 1L of the thermoelectric conversion module 1.

In FIG. 1, a second direction A2 is a direction that is orthogonal to the first direction A1. However, it is not essential for the second direction A2 to be orthogonal to the first direction A1 so long as the second direction A2 intersects the first direction A1. In the present embodiment, the second direction A2 is defined as a direction toward the right side of the page from the left side of the page in FIG. 1.

In FIG. 1, a third direction A3 is a direction that is orthogonal to a plane including the first direction A1 and the second direction A2. In the present embodiment, the third direction A3 is defined as a direction toward the foreground of the page from the background of the page in FIG. 1.

In the following description, "above" indicates a side in the third direction A3 unless otherwise specified. Moreover, "below" indicates a side in an opposite direction to the third direction A3 unless otherwise specified.

As illustrated in FIG. 1, the shape of the thermoelectric conversion module 1 as viewed from the third direction A3 is a quadrilateral shape such as a rectangular shape. However, the shape of the thermoelectric conversion module 1 as viewed from the third direction A3 may be any shape such as a circular sector shape. The thermoelectric conversion module 1 includes the sheet substrate 10 and thermoelectric conversion elements 21, 22, 23, 24, 25, 26, 27, and 28 as illustrated in FIG. 1. The thermoelectric conversion module 1 also includes a connector 30, a first electrode 31, and a second electrode 32 as illustrated in FIG. 2 and FIG. 3. The connector 30 includes electrodes 41, 42, 43, and 44, electrodes 51, 52, and 53, first joining members 61, 62, 63, 64, 66, 67, and 68, and second joining members 71, 72, 73, 74, 75, 76, 77, and 78.

In the following description, the thermoelectric conversion elements 21 to 28 are also referred to collectively as "thermoelectric conversion elements 20" when no specific distinction is made therebetween. FIG. 1 illustrates a thermoelectric conversion module 1 that includes 8 thermoelectric conversion elements 20. However, the number of thermoelectric conversion elements 20 included in the thermoelectric conversion module 1 may be any number.

In the following description, the electrodes 41 to 44 are also referred to collectively as "electrodes 40" when no specific distinction is made therebetween. Moreover, the electrodes 51 to 53 are also referred to collectively as "electrodes 50" when no specific distinction is made therebetween. Furthermore, the first joining members 61 to 68 are also referred to collectively as "first joining members 60" when no specific distinction is made therebetween. Also, the second joining members 71 to 78 are also referred to collectively as "second joining members 70" when no specific distinction is made therebetween. FIG. 2 and FIG. 3 illustrate a connector 30 that includes 4 electrodes 40, 3 electrodes 50, 8 first joining members 60, and 8 second joining members 70. However, the number of electrodes 40, the number of electrodes 50, the number of first joining members 60, and the number of second joining members 70 included in the connector 30 may be numbers in accordance with the number of thermoelectric conversion elements included in the thermoelectric conversion module 1.

The sheet substrate 10 such as illustrated in FIG. 1 is electrically insulating. The sheet substrate 10 may be flexible. The material for forming the sheet substrate 10 can be any electrically insulating material without any specific limitations. The shape of the sheet substrate 10 as viewed from the third direction A3 is a quadrilateral shape such as a rectangular shape. However, the shape of the sheet substrate 10 as viewed from the third direction A3 may be any shape such as a circular sector shape. The sheet substrate 10 may be parallel to a plane including the first direction A1 and the second direction A2.

The sheet substrate 10 has the first edge 1H described above and the second edge 1L described above. The sheet substrate 10 also has a front surface and a rear surface 10B as illustrated in FIG. 2 and FIG. 3. The front surface and the rear surface 10B are opposite to each other. The front surface 10A is a surface that faces in the third direction A3 among surfaces of the sheet substrate 10. The rear surface 10B is a surface that faces in an opposite direction to the third direction A3 among surfaces of the sheet substrate 10.

As illustrated in FIG. 2 and FIG. 3, the sheet substrate 10 includes a substrate 11 and an insulating layer 12.

The substrate 11 is electrically insulating. The substrate 11 may be flexible. The material for forming the substrate 11 can be any material such as polyimide or epoxy glass without any specific limitations. As illustrated in FIG. 1, the shape of the substrate 11 as viewed from the third direction A3 is a quadrilateral shape such as a rectangular shape. However, the shape of the substrate 11 as viewed from the third direction A3 may be any shape such as a circular sector shape. The substrate 11 may be parallel to a plane including the first direction A1 and the second direction A2.

The substrate 11 has a front surface 11A and a rear surface 11B as illustrated in FIG. 2. The front surface 11A and the rear surface 11B are opposite to each other. The front surface 11A is a surface that faces in the third direction A3 among surfaces of the substrate 11. The rear surface 11B is a surface that faces in an opposite direction to the third direction A3 among surfaces of the substrate 11. The rear surface 11B may correspond to the rear surface 10B of the sheet substrate 10.

As illustrated in FIG. 2, the substrate 11 includes openings 11a, 11b, 11c, and 11d. Locations of the openings 11a to 11d as viewed from the third direction A3 may correspond to locations of the electrodes 41 to 44, respectively, as illustrated in FIG. 1. As illustrated in FIG. 3, the substrate 11 includes openings 11e, 11f, 11g, and 11h. Locations of the openings 11e to 11g as viewed from the third direction A3 may correspond to locations of the electrodes 51 to 53, respectively, as illustrated in FIG. 1. The location of the opening 11h as viewed from the third direction A3 may correspond to the location of the second electrode 32. The shape of the openings 11a to 11h as viewed from the third direction A3 is a circular shape. However, the shape of the openings 11a to 11h may be any shape.

The insulating layer 12 is electrically insulating. The insulating layer 12 may be flexible. The material for forming the insulating layer 12 can be any electrically insulating material without any specific limitations. The insulating layer 12 may be located at the front surface 11A of the substrate 11. As illustrated in FIG. 1, the shape of the insulating layer 12 as viewed from the third direction A3 is a quadrilateral shape such as a rectangular shape. However, the shape of the insulating layer 12 as viewed from the third direction A3 may be any shape such as a circular sector shape. The insulating layer 12 may be parallel to a plane including the first direction A1 and the second direction A2.

The insulating layer 12 has a front surface 12A and a rear surface 12B as illustrated in FIG. 2. The front surface 12A and the rear surface 12B are opposite to each other. The front surface 12A is a surface that faces in the third direction A3 among surfaces of the insulating layer 12. The front surface 12A may correspond to the front surface 10A of the sheet substrate 10. The rear surface 12B is a surface that faces in an opposite direction to the third direction A3 among surfaces of the insulating layer 12.

As illustrated in FIG. 2, the insulating layer 12 includes openings 12a, 12b, 12c, and 12d. Locations of the openings 12a to 12d as viewed from the third direction A3 may correspond with locations of the electrodes 41 to 44, respectively, as illustrated in FIG. 1. As illustrated in FIG. 3, the insulating layer 12 includes openings 12e, 12f, 12g, and 12h. The location of the opening 12e as viewed from the third direction A3 may correspond to the location of the first electrode 31 as illustrated in FIG. 1. Moreover, locations of the openings 12f to 12h as viewed from the third direction A3 may correspond with locations of the electrodes 51 to 53, respectively. The shape of the openings 12a to 12h as viewed from the third direction A3 is a circular shape. However, the shape of the openings 12a to 12h may be any shape.

The thermoelectric conversion elements 20 are p-type thermoelectric conversion elements or are n-type thermoelectric conversion elements. In the present embodiment, the thermoelectric conversion elements 21, 23, 25, and 27 are p-type thermoelectric conversion elements and the thermoelectric conversion elements 22, 24, 26, and 28 are n-type thermoelectric conversion elements. In FIG. 2 and FIG. 3, the thermoelectric conversion elements 22, 24, 26, and 28 that are n-type thermoelectric conversion elements are hatched.

The thermoelectric conversion material for forming the thermoelectric conversion elements 20 can be a bismuth-tellurium-based compound, an antimony-based compound, a silicon-based compound, a metal oxide-based compound, a Heusler alloy-based compound, a conductive polymer compound, conductive fibers, a composite material of any thereof, or the like, without any specific limitations. In particular, it is preferable to use conductive fibers, and more preferable to use fibrous carbon nanostructures such as carbon nanotubes (hereinafter, also referred to as "CNTs"). This is because the mechanical strength of the presently disclosed thermoelectric conversion module 1 can be further improved and the weight thereof can be reduced by using CNTs. Although single-walled CNTs and/or multi-walled CNTs can be used as the CNTs without any specific limitations, it is preferable that the CNTs are single-walled CNTs. This is because single-walled CNTs tend to have superior thermoelectric characteristics (Seebeck coefficient). Note that the single-walled carbon nanotubes may be CNTs produced in accordance with a method (super growth method; refer to WO2006/011655A1) in which, during synthesis of CNTs through chemical vapor deposition (CVD) by supplying a feedstock compound and a carrier gas onto a substrate having a catalyst layer for CNT production at the surface thereof, a trace amount of an oxidant (catalyst activating material) is provided in the system so as to dramatically improve catalytic activity of the catalyst layer (hereinafter, CNTs produced in accordance with this method are also referred to as "SGCNTs"). In addition, a feature of SGCNTs is that they have a large number of bends. Although CNTs have high thermal conductivity through movement of electrons, an effect of reduction of thermal conductivity thereof through phonon vibration is also thought to be high. However, SGCNTs have a structure that impairs amplification of phonon vibration due the large number of bends compared to CNTs produced by other typical methods, and thus the reduction of thermal conductivity caused by phonon vibration can be suppressed. Consequently, SGCNTs can act as superior thermoelectric conversion materials compared to other typical CNTs.

The thermoelectric conversion elements 21 to 28 may all contain CNTs. Such a configuration can further improve mechanical strength of the thermoelectric conversion module 1 and enables weight reduction of the thermoelectric conversion module 1.

The thermoelectric conversion elements 20 extend along the first direction A1 as illustrated in FIG. 1. The shape of the thermoelectric conversion elements 20 as viewed from the third direction A3 is an elongated shape such as a rectangular shape. However, the shape of the thermoelectric conversion elements 20 as viewed from the third direction A3 may be any shape such as a circular sector shape. A lengthwise direction of the thermoelectric conversion elements 20 is along the first direction A1. The lengthwise direction of the thermoelectric conversion elements 20 may be parallel to the first direction A1. The thermoelectric conversion elements 21 to 28 may each have the same shape. The cross-sectional shape of the thermoelectric conversion elements 20 may be a thin film shape as illustrated in FIG. 2 and FIG. 3.

The thermoelectric conversion elements 20 each have a first end 20H and a second end 20L in the first direction A1. The first end 20H is located toward the first edge 1H of the thermoelectric conversion module 1. The second end 20L is located toward the second edge 1L of the thermoelectric conversion module 1. Note that the first ends 20H of the thermoelectric conversion elements 21 to 28 are also referred to as "first end 21H", "first end 22H", "first end 23H", "first end 24H", "first end 25H", "first end 26H", "first end 27H", and "first end 28H", respectively. Moreover, the second ends 20L of the thermoelectric conversion elements 21 to 28 are also referred as "second end 21L", "second end 22L", "second end 23L", "second end 24L", "second end 25L", "second end 26L", "second end 27L", and "second end 28L", respectively. Note that in the configuration illustrated in FIG. 1, the first ends 21H to 28H have different locations in the first direction A1. However, the locations of the first ends 21H to 28H in the first direction A1 may be the same. Also note that in the configuration illustrated in FIG. 1, the second ends 21L to 28L have different locations in the first direction A1. However, the locations of the second ends 21L to 28L in the first direction A1 may be the same.

The thermoelectric conversion elements 20 can exploit a temperature difference between the first ends 20H and the second ends 20L to generate electricity. More specifically, the temperature of the first ends 20H of the thermoelectric conversion elements 20 can be higher than the temperature of the second ends 20L as a result of the first ends 20H being located further toward the first edge 1H than the second ends 20L. A temperature difference can arise between the first ends 20H and the second ends 20L through the temperature of the first ends 20H becoming higher than the temperature of the second ends 20L. When a temperature difference arises between the first ends and the second ends 20L, this can create a temperature gradient in the thermoelectric conversion elements 20. Electromotive force arising through the Seebeck effect as a result of this temperature gradient enables generation of electricity by the thermoelectric conversion elements 20.

In the present embodiment, the plurality of thermoelectric conversion elements 20, in order from the thermoelectric conversion element 21 to the thermoelectric conversion element 28, are electrically connected in series from the first electrode 31 to the second electrode 32 through the subsequently described connector 30. As a result of the plurality of thermoelectric conversion elements 20 being electrically connected in series in this manner, it is possible for a single current path to form in the thermoelectric conversion module 1 as illustrated in FIG. 4 when the plurality of thermoelectric conversion elements 20 generate electricity. In FIG. 4, currents 121, 122, 123, 124, 125, 126, 127, and 128 are currents that flow in the thermoelectric conversion elements 21 to 28, respectively.

Odd-numbered thermoelectric conversion elements 20 among the plurality of thermoelectric conversion elements 20 that are electrically connected in series through the connector 30, as counted from the first electrode 31, are located at a side corresponding to the front surface 10A of the sheet substrate 10. In the present embodiment, the odd-numbered thermoelectric conversion elements 20 as counted from the first electrode 31 are a No. 1 thermoelectric conversion element 21, a No. 3 thermoelectric conversion element 23, a No. 5 thermoelectric conversion element 25, and a No. 7 thermoelectric conversion element 27. In other words, the thermoelectric conversion elements 21, 23, 25, and 27 are located at a side corresponding to the front surface 10A of the sheet substrate 10 (for example, a side corresponding to the front surface 12A of the insulating layer 12). The thermoelectric conversion elements 21, 23, 25, and 27 are lined up along the second direction A2 at the front surface 10A. The thermoelectric conversion elements 21, 23, 25, and 27 may be lined up along the second direction A2 with gaps therebetween. The width of these gaps may be any width so long as it is possible to ensure electrical insulation between two thermoelectric conversion elements 20 that are adjacent to each other in the second direction A2.

Even-numbered thermoelectric conversion elements 20 among the plurality of thermoelectric conversion elements 20 that are electrically connected in series through the connector 30, as counted from the first electrode 31, are located at a side corresponding to the rear surface 10B of the sheet substrate 10. In the present embodiment, the even-numbered thermoelectric conversion elements 20 as counted from the first electrode 31 are a No. 2 thermoelectric conversion element 22, a No. 4 thermoelectric conversion element 24, a No. 6 thermoelectric conversion element 26, and a No. 8 thermoelectric conversion element 28. In other words, the thermoelectric conversion elements 22, 24, 26, and 28 are located at a side corresponding to the rear surface 10B of the sheet substrate 10 (for example, a side corresponding to the rear surface 11B of the substrate 11). The thermoelectric conversion elements 22, 24, 26, and 28 are lined up along the second direction A2 at the rear surface 10B. The thermoelectric conversion elements 22, 24, 26, and 28 may be lined up along the second direction A2 with gaps therebetween. The width of these gaps may be any width so long as it is possible to ensure electrical insulation between two thermoelectric conversion elements 20 that are adjacent to each other in the second direction A2.

Through the thermoelectric conversion elements 20 being located at both the front surface 10A and the rear surface 10B of the sheet substrate 10 in this manner, it is possible to increase the density of thermoelectric conversion elements 20 in the thermoelectric conversion module 1. Increasing the density of thermoelectric conversion elements 20 in the thermoelectric conversion module 1 can increase generated electrical power while also enabling compactization of the thermoelectric conversion module 1.

At least one part of the thermoelectric conversion elements 20 located at the side corresponding to the front surface 10A of the sheet substrate 10 may overlap with at least one part of the thermoelectric conversion elements 20 located at the side corresponding to the rear surface 10B of the sheet substrate in plan view of the sheet substrate 10 as illustrated in FIG. 1 (i.e., as viewed from the third direction A3). A configuration such as set forth above enables compactization of the thermoelectric conversion module 1. However, it may be the case that at least one part of the thermoelectric conversion elements 20 located at the side corresponding to the front surface 10A of the sheet substrate does not overlap with at least one part of the thermoelectric conversion elements 20 located at the side corresponding to the rear surface 10B of the sheet substrate 10 as viewed from the third direction A3.

The thermoelectric conversion elements 21 to 28 may all have rectangular shapes that are of roughly the same dimensions. As a result of the thermoelectric conversion elements 21 to 28 all having rectangular shapes that are of roughly the same dimensions, thermoelectric conversion elements 20 can be efficiently arranged at each of the front surface 10A and the rear surface of the sheet substrate 10. A configuration such as set forth above enables compactization of the thermoelectric conversion module. However, the thermoelectric conversion elements 21 to 28 may have any shape such as a circular sector shape so long as the thermoelectric conversion elements 21 to 28 all have shapes that are of roughly the same dimensions. As a result of the thermoelectric conversion elements 21 to 28 all having shapes that are of roughly the same dimensions, thermoelectric conversion elements 20 can be efficiently arranged at each of the front surface 10A and the rear surface 10B of the sheet substrate 10.

Respective lengths of the thermoelectric conversion elements 21 to 28 along the first direction A1, respective widths of the thermoelectric conversion elements 21 to 28 along the second direction A2, and respective thicknesses of the thermoelectric conversion elements 21 to 28 in the third direction A3 may be adjusted such that respective electrical resistance values of the thermoelectric conversion elements 21 to 28 are roughly the same. When the respective electrical resistance values of the thermoelectric conversion elements 21 to 28 differ, electrically connecting the thermoelectric conversion elements 21 to 28 is series results in current that can be generated in the thermoelectric conversion module 1 being determined by a thermoelectric conversion element 20 having a small electrical resistance value. It is possible to inhibit current that can be generated in the thermoelectric conversion module 1 being determined by a thermoelectric conversion element 20 having a small electrical resistance value through the respective electrical resistance values of the thermoelectric conversion elements 21 to 28 being roughly the same. A configuration such as set forth above can reduce electrical power loss in the thermoelectric conversion module 1.

The first electrode 31 and the second electrode 32 such as illustrated in FIG. 1 are each electrically conductive. The electrically conductive material for forming each of the first electrode 31 and the second electrode 32 can be any metal such as copper or aluminum without any specific limitations.

Lead-out wires for extracting electrical power generated by the thermoelectric conversion module 1 may be electrically connected to the first electrode 31 and the second electrode 32.

As illustrated in FIG. 3, the first electrode 31 and the second electrode 32 may each be located in the sheet substrate 10 (for example, at the front surface 11A of the substrate 11). The first electrode 31 may be located further than the electrode 51 toward a side in an opposite direction to the second direction A2. The width of a gap between the first electrode 31 and the electrode 51 may be any width so long as it is possible to ensure electrical insulation between the first electrode 31 and the electrode 51. The second electrode 32 may be located further than the electrode 53 toward a side in the second direction A2. The width of a gap between the second electrode 32 and the electrode 53 may be any width so long as it is possible to ensure electrical insulation between the second electrode 32 and the electrode 53.

The first electrode 31 functions as a negative electrode, for example. The first electrode 31 is electrically connected to an end constituting a negative electrode among two ends of the plurality of thermoelectric conversion elements 20 that are electrically connected in series. In the present embodiment, the first electrode 31 is electrically connected to the second end 21L of the thermoelectric conversion element 21 as illustrated in FIG. 3. For example, at least one part of the first electrode 31 is exposed from the opening 12e in the insulating layer 12. The at least one part of the first electrode 31 that is exposed from the opening 12e is electrically connected to the second end 21L of the thermoelectric conversion element 21 through the second joining member 71.

The second electrode 32 functions as a positive electrode, for example. The second electrode 32 is electrically connected to an end constituting a positive electrode among two ends of the plurality of thermoelectric conversion elements 20 that are electrically connected in series. In the present embodiment, the second electrode 32 is electrically connected to the second end 28L of the thermoelectric conversion element 28 as illustrated in FIG. 3. For example, at least one part of the second electrode 32 is exposed from the opening 11h in the substrate 11. The at least one part of the second electrode 32 that is exposed from the opening 11h is electrically connected to the second end 28L of the thermoelectric conversion element 28 through the second joining member 78.

The connector 30 electrically connects the plurality of thermoelectric conversion elements 20 in series at a lengthwise end of each thermoelectric conversion element 20 (i.e., at the first end 20H or the second end 20L) from the first electrode 31 to the second electrode 32. In the present embodiment, the connector 30 electrically connects the plurality of thermoelectric conversion elements 20 in series from the first electrode 31 to the second electrode 32 in order from the thermoelectric conversion element 21 to the thermoelectric conversion element 28. The following describes one example of this connection configuration. As previously described, the connector 30 includes a plurality of electrodes 40, a plurality of electrodes 50, a plurality of first joining members 60, and a plurality of second joining members 70.

The electrodes 40 are electrically conductive. The electrically conductive material for forming the electrodes 40 can be any metal such as copper or aluminum without any specific limitations.

As illustrated in FIG. 2, the electrodes 40 may be located in the sheet substrate 10 (for example, at the front surface 11A of the substrate 11). The electrodes 41 to 44 may be lined up along the second direction A2 with gaps therebetween. The width of these gaps may be any width so long as it is possible to ensure electrical insulation between two electrodes 40 that are adjacent to each other in the second direction A2.

The electrodes 40 are electrically connected to the first ends 20H of the thermoelectric conversion elements 20 that are located at the side corresponding to the front surface 10A of the sheet substrate 10 and the first ends 20H of the thermoelectric conversion elements 20 that are located at the side corresponding to the rear surface 10B of the sheet substrate 10.

The electrode 41 is electrically connected to the first end 21H of the thermoelectric conversion element 21 that is located at the side corresponding to the front surface 10A and the first end 22H of the thermoelectric conversion element 22 that is located at the side corresponding to the rear surface 10B. For example, at least one part of the first electrode 41 is exposed from the opening 12a in the insulating layer. The at least one part of the electrode 41 that is exposed from the opening 12a is electrically connected to the first end 21H of the thermoelectric conversion element 21 through the first joining member 61. Moreover, at least one part of the electrode 41 is exposed from the opening 11a in the substrate 11. The at least one part of the electrode 41 that is exposed from the opening 11 a is electrically connected to the first end 22H of the thermoelectric conversion element 22 through the first joining member 62. The location of the electrode 41 in the second direction A2 may be set as appropriate depending on the location of the thermoelectric conversion element 21 in the second direction A2 and the location of the thermoelectric conversion element 22 in the second direction A2.

The electrode 42 is electrically connected to the first end 23H of the thermoelectric conversion element 23 that is located at the side corresponding to the front surface 10A and the first end 24H of the thermoelectric conversion element 24 that is located at the side corresponding to the rear surface 10B. For example, at least one part of the electrode 42 is exposed from the opening 12b in the insulating layer 12. The at least one part of the electrode 42 that is exposed from the opening 12b is electrically connected to the first end 23H of the thermoelectric conversion element 23 through the first joining member 63. Moreover, at least one part of the electrode 42 is exposed from the opening 11b in the substrate 11. The at least one part of the electrode 42 that is exposed from the opening 11b is electrically connected to the first end 24H of the thermoelectric conversion element 24 through the first joining member 64. The location of the electrode 42 in the second direction A2 may be set as appropriate depending on the location of the thermoelectric conversion element 23 in the second direction A2 and the location of the thermoelectric conversion element 24 in the second direction A2.

The electrode 43 is electrically connected to the first end 25H of the thermoelectric conversion element 25 that is located at the side corresponding to the front surface 10A and the first end 26H of the thermoelectric conversion element 26 that is located at the side corresponding to the rear surface 10B. For example, at least one part of the electrode 43 is exposed from the opening 12c in the insulating layer 12. The at least one part of the electrode 43 that is exposed from the opening 12c is electrically connected to the first end 25H of the thermoelectric conversion element 25 through the first joining member 65. Moreover, at least one part of the electrode 43 is exposed from the opening 11c in the substrate 11. The at least one part of the electrode 43 that is exposed from the opening 11c is electrically connected to the first end 26H of the thermoelectric conversion element 26 through the first joining member 66. The location of the electrode 43 in the second direction A2 may be set as appropriate depending on the location of the thermoelectric conversion element in the second direction A2 and the location of the thermoelectric conversion element 26 in the second direction A2.

The electrode 44 is electrically connected to the first end 27H of the thermoelectric conversion element 27 that is located at the side corresponding to the front surface 10A and the first end 28H of the thermoelectric conversion element 28 that is located at the side corresponding to the rear surface 10B. For example, at least one part of the electrode 44 is exposed from the opening 12d in the insulating layer 12. The at least one part of the electrode 44 that is exposed from the opening 12d is electrically connected to the first end 27H of the thermoelectric conversion element 27 through the first joining member 67. Moreover, at least one part of the electrode 44 is exposed from the opening 11d in the substrate 11. The at least one part of the electrode 44 that is exposed from the opening 11d is electrically connected to the first end 28H of the thermoelectric conversion element 28 through the first joining member 68. The location of the electrode 44 in the second direction A2 may be set as appropriate depending on the location of the thermoelectric conversion element 27 in the second direction A2 and the location of the thermoelectric conversion element 28 in the second direction A2.

The electrodes 50 are electrically conductive. The electrically conductive material for forming the electrodes 50 may be any metal such as copper or aluminum without any specific limitations.

As illustrated in FIG. 3, the electrodes 50 may be located in the sheet substrate 10 (for example, at the front surface 11A of the substrate 11). The electrodes 51 to 53 are lined up along the second direction A2 with gaps therebetween, in-between the first electrode 31 and the second electrode 32. The width of these gaps may be any width so long as it is possible to ensure electrical insulation between two electrodes 50 that are adjacent to each other in the second direction A2.

The electrodes 50 are electrically connected to the second ends 20L of the thermoelectric conversion elements 20 that are located at the side corresponding to the front surface 10A of the sheet substrate 10 and the second ends 20L of the thermoelectric conversion elements 20 that are located at the side corresponding to the rear surface 10B of the sheet substrate 10.

The electrode 51 is electrically connected to the second end 22L of the thermoelectric conversion element 22 that is located at the side corresponding to the front surface 10B and the second end 23L of the thermoelectric conversion element 23 that is located at the side corresponding to the rear surface 10A. For example, at least one part of the electrode 51 is exposed from the opening 11e in the substrate 11. The at least one part of the electrode 51 that is exposed from the opening 11e is electrically connected to the second end 22L of the thermoelectric conversion element 22 through the second joining member 72. Moreover, at least one part of the electrode 51 is exposed from the opening 12f in the insulating layer 12. The at least one part of the electrode 51 that is exposed from the opening 12f is electrically connected to the second end 23L of the thermoelectric conversion element 23 through the second joining member 73. The location of the electrode 51 in the second direction A2 may be set as appropriate depending on the location of the thermoelectric conversion element 22 in the second direction A2 and the location of the thermoelectric conversion element 23 in the second direction A2.

The electrode 52 is electrically connected to the second end 24L of the thermoelectric conversion element 24 that is located at the side corresponding to the front surface 10B and the second end 25L of the thermoelectric conversion element 25 that is located at the side corresponding to the rear surface 10A. For example, the electrode 52 is exposed from the opening 11f in the substrate 11. The at least one part of the electrode 52 that is exposed from the opening 11f is electrically connected to the second end 24L of the thermoelectric conversion element 24 through the second joining member 74. Moreover, at least one part of the electrode 52 is exposed from the opening 12g in the insulating layer 12. The at least one part of the electrode 52 that is exposed from the opening 12g is electrically connected to the second end 25L of the thermoelectric conversion element 25 through the second joining member 75. The location of the electrode 52 in the second direction A2 may be set as appropriate depending on the location of the thermoelectric conversion element 24 in the second direction A2 and the location of the thermoelectric conversion element 25 in the second direction A2.

The electrode 53 is electrically connected to the second end 26L of the thermoelectric conversion element 26 that is located at the side corresponding to the front surface 10B and the second end 27L of the thermoelectric conversion element 27 that is located at the side corresponding to the rear surface 10A. For example, at least one part of the electrode 53 is exposed from the opening 11g in the substrate 11. The at least one part of the electrode 53 that is exposed from the opening 11g is electrically connected to the second end 26L of the thermoelectric conversion element 26 through the second joining member 76. Moreover, at least one part of the electrode 53 is exposed from the opening 12h in the insulating layer 12. The at least one part of the electrode 53 that is exposed from the opening 12h is electrically connected to the second end 27L of the thermoelectric conversion element 27 through the second joining member 77.

The first joining members 60 are electrically conductive. The first joining members 60 may each be formed of any member such as silver paste or solder.

The first joining member 61 electrically connects the electrode 41 and the first end 21H of the thermoelectric conversion element 21 that is located at the side corresponding to the front surface 10A of the sheet substrate 10. For example, as illustrated in FIG. 2, at least one part of the first joining member 61 is located in the opening 12a in the insulating layer 12. The first joining member 61 electrically connects the electrode 41 and the first end 21H of the thermoelectric conversion element 21 via the opening 12a. The first joining member 61 may extend from the opening 12a to the first end 21H of the thermoelectric conversion element 21 as illustrated in FIG. 1.

The first joining member 62 electrically connects the electrode 41 and the first end 22H of the thermoelectric conversion element 22 that is located at the side corresponding to the rear surface 10B of the sheet substrate 10. For example, as illustrated in FIG. 2, at least one part of the first joining member 62 is located in the opening 11a in the substrate 11. The first joining member 62 electrically connects the electrode 41 and the first end 22H of the thermoelectric conversion element 22 via the opening 11a. The first joining member 62 may extend from the opening 11a to the first end 22H of the thermoelectric conversion element 22 as illustrated in FIG. 1.

The first joining member 63 electrically connects the electrode 42 and the first end 23H of the thermoelectric conversion element 23 that is located at the side corresponding to the front surface 10A of the sheet substrate 10. For example, as illustrated in FIG. 2, at least one part of the first joining member 63 is located in the opening 12b in the insulating layer 12. The first joining member 63 electrically connects the electrode 42 and the first end 23H of the thermoelectric conversion element 23 via the opening 12b. The first joining member 63 may extend from the opening 12b to the first end 23H of the thermoelectric conversion element 23 as illustrated in FIG. 1.

The first joining member 64 electrically connects the electrode 42 and the first end 24H of the thermoelectric conversion element 24 that is located at the side corresponding to the rear surface 10B of the sheet substrate 10. For example, as illustrated in FIG. 2, at least one part of the first joining member 64 is located in the opening 11b in the substrate 11. The first joining member 64 electrically connects the electrode 42 and the first end 24H of the thermoelectric conversion element 24 via the opening 11b. The first joining member 64 may extend from the opening 11b to the first end 24H of the thermoelectric conversion element 24 as illustrated in FIG. 1.

The first joining member 65 electrically connects the electrode 43 and the first end 25H of the thermoelectric conversion element 25 that is located at the side corresponding to the front surface 10A of the sheet substrate 10. For example, as illustrated in FIG. 2, at least one part of the first joining member is located in the opening 12c in the insulating layer 12. The first joining member 65 electrically connects the electrode 43 and the first end 25H of the thermoelectric conversion element 25 via the opening 12c. The first joining member 65 may extend from the opening 12c to the first end 25H of the thermoelectric conversion element 25 as illustrated in FIG. 1.

The first joining member 66 electrically connects the electrode 43 and the first end 26H of the thermoelectric conversion element 26 that is located at the side corresponding to the rear surface 10B of the sheet substrate 10. For example, as illustrated in FIG. 2, at least one part of the first joining member 66 is located in the opening 11c in the substrate 11. The first joining member 66 electrically connects the electrode 43 and the first end 26H of the thermoelectric conversion element 26 via the opening 11c. The first joining member 66 may extend from the opening 11c to the first end 26H of the thermoelectric conversion element 26 as illustrated in FIG. 1.

The first joining member 67 electrically connects the electrode 44 and the first end 27H of the thermoelectric conversion element 27 that is located at the side corresponding to the front surface 10A of the sheet substrate 10. For example, as illustrated in FIG. 2, at least one part of the first joining member 67 is located in the opening 12d in the insulating layer 12. The first joining member 67 electrically connects the electrode 44 and the first end 27H of the thermoelectric conversion element 27 via the opening 12d. The first joining member 67 may extend from the opening 12d to the first end 27H of the thermoelectric conversion element 27 as illustrated in FIG. 1.

The first joining member 68 electrically connects the electrode 44 and the first end 28H of the thermoelectric conversion element 28 that is located at the side corresponding to the rear surface 10B of the sheet substrate 10. For example, as illustrated in FIG. 2, at least one part of the first joining member 68 is located in the opening 11d in the substrate 11. The first joining member 68 electrically connects the electrode 44 and the first end 28H of the thermoelectric conversion element 28 via the opening 11d. The first joining member 68 may extend from the opening 11d to the first end 28H of the thermoelectric conversion element 28 as illustrated in FIG. 1.

The second joining members 70 are electrically conductive. The second joining members 70 may each be formed of any member such as silver paste or solder.

The second joining member 71 electrically connects the first electrode 31 and the second end 21L of the thermoelectric conversion element 21 that is located at the side corresponding to the front surface 10A of the sheet substrate 10. For example, as illustrated in FIG. 3, at least one part of the second joining member 71 is located in the opening 12e in the insulating layer 12. The second joining 71 member electrically connects the first electrode 31 and the second end 21L of the thermoelectric conversion element 21 via the opening 12e. The second joining member 71 may extend from the opening 12e to the second end 21L of the thermoelectric conversion element 21 as illustrated in FIG. 1.

The second joining member 72 electrically connects the electrode 51 and the second end 22L of the thermoelectric conversion element 22 that is located at the side corresponding to the rear surface 10B of the sheet substrate 10. For example, as illustrated in FIG. 3, at least one part of the second joining member 72 is located in the opening 11e in the substrate 11. The second joining member 72 electrically connects the electrode 51 and the second end 22L of the thermoelectric conversion element 22 via the opening 11e. The second joining member 72 may extend from the opening 11e to the second end 22L of the thermoelectric conversion element 22 as illustrated in FIG. 1.

The second joining member 73 electrically connects the electrode 51 and the second end 23L of the thermoelectric conversion element 23 that is located at the side corresponding to the front surface 10A of the sheet substrate For example, as illustrated in FIG. 3, at least one part of the second joining member 73 is located in the opening 12f in the insulating layer 12. The second joining member 73 electrically connects the electrode 51 and the second end 23L of the thermoelectric conversion element 23 via the opening 12f. The second joining member 73 may extend from the opening 12f to the second end 23L of the thermoelectric conversion element 23 as illustrated in FIG. 1.

The second joining member 74 electrically connects the electrode 52 and the second end 24L of the thermoelectric conversion element 24 that is located at the side corresponding to the rear surface 10B of the sheet substrate For example, as illustrated in FIG. 3, at least one part of the second joining member 74 is located in the opening 11f in the substrate 11. The second joining member 74 electrically connects the electrode 52 and the second end 24L of the thermoelectric conversion element 24 via the opening 11f. The second joining member 74 may extend from the opening 11f to the second end 24L of the thermoelectric conversion element 24 as illustrated in FIG. 1.

The second joining member 75 electrically connects the electrode 52 and the second end 25L of the thermoelectric conversion element 25 that is located at the side corresponding to the front surface 10A of the sheet substrate 10. For example, as illustrated in FIG. 3, at least one part of the second joining member 75 is located in the opening 12g in the insulating layer 12. The second joining member 75 electrically connects the electrode 52 and the second end of the thermoelectric conversion element 25 via the opening 12g. The second joining member 75 may extend from the opening 12g to the second end of the thermoelectric conversion element 25 as illustrated in FIG. 1.

The second joining member 76 electrically connects the electrode 53 and the second end 26L of the thermoelectric conversion element 26 that is located at the side corresponding to the rear surface 10B of the sheet substrate 10. For example, as illustrated in FIG. 3, at least one part of the second joining member 76 is located in the opening 11g in the substrate 11. The second joining member 76 electrically connects the electrode 53 and the second end 26L of the thermoelectric conversion element 26 via the opening 11g. The second joining member 76 may extend from the opening 11g to the second end 26L of the thermoelectric conversion element 26 as illustrated in FIG. 1.

The second joining member 77 electrically connects the electrode 53 and the second end 27L of the thermoelectric conversion element 27 that is located at the side corresponding to the front surface 10A of the sheet substrate For example, as illustrated in FIG. 3, at least one part of the second joining member 77 is located in the opening 12h in the insulating layer 12. The second joining member 77 electrically connects the electrode 53 and the second end 27L of the thermoelectric conversion element 27 via the opening 12h. The second joining member 77 may extend from the opening 12h to the second end 27L of the thermoelectric conversion element 27 as illustrated in FIG. 1.

The second joining member 78 electrically connects the second electrode 32 and the second end 28L of the thermoelectric conversion element 28 that is located at the side corresponding to the rear surface 10B of the sheet substrate 10. For example, as illustrated in FIG. 3, at least one part of the second joining member 78 is located in the opening 11h in the substrate 11. The second joining member electrically 78 connects the second electrode 32 and the second end 28L of the thermoelectric conversion element 28 via the opening 11h. The second joining member 78 may extend from the opening 11h to the second end 28L of the thermoelectric conversion element 28 as illustrated in FIG. 1.

In this manner, thermoelectric conversion elements 20 are located at both the front surface 10A and the rear surface 10B of the sheet substrate 10 in the thermoelectric conversion module 1. Such a configuration can increase the density of thermoelectric conversion elements 20 in the thermoelectric conversion module 1 while also enabling compactization of the thermoelectric conversion module 1. Consequently, through the present embodiment, it is possible to provide a thermoelectric conversion module 1 that has increased generated electrical power while also having reduced size.

Modified Example of First Embodiment

Figure 5:
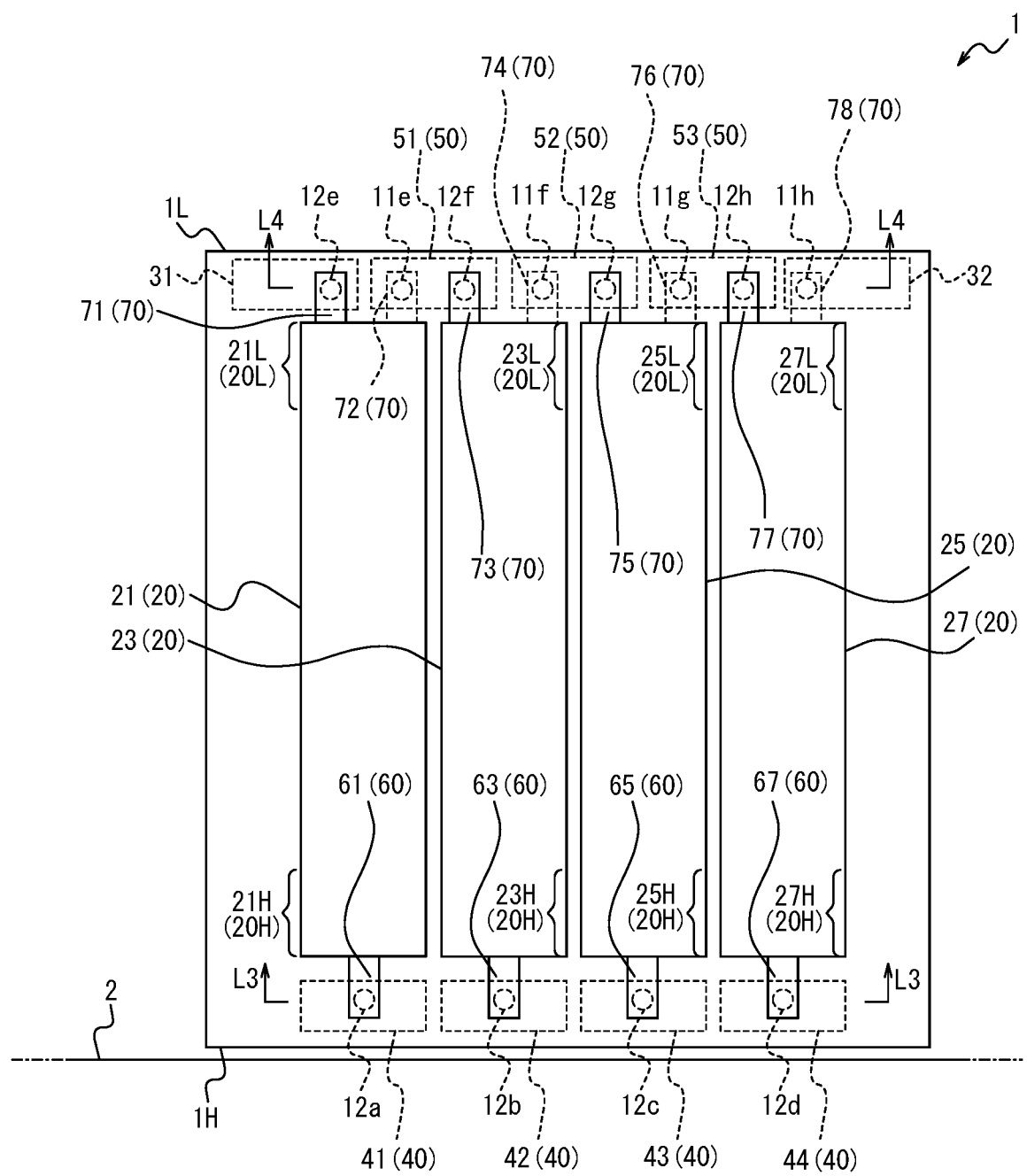
FIG. 5 is an external view of a thermoelectric conversion module according to a modified example of the first embodiment of the present disclosure.
Figure 6:
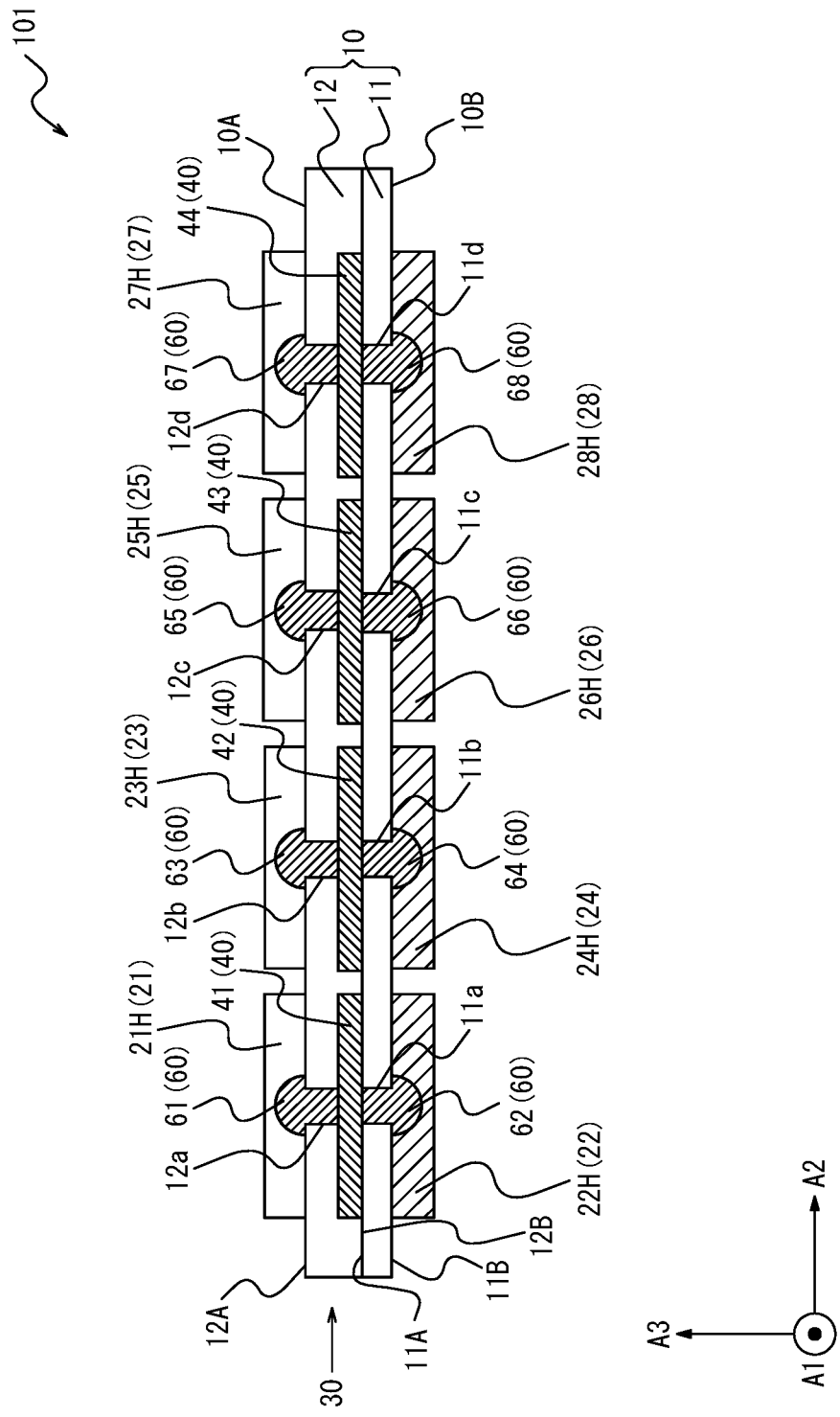
FIG. 6 is a cross-sectional view of the thermoelectric conversion module along a line L3-L3 illustrated in FIG. 5.
Figure 7:
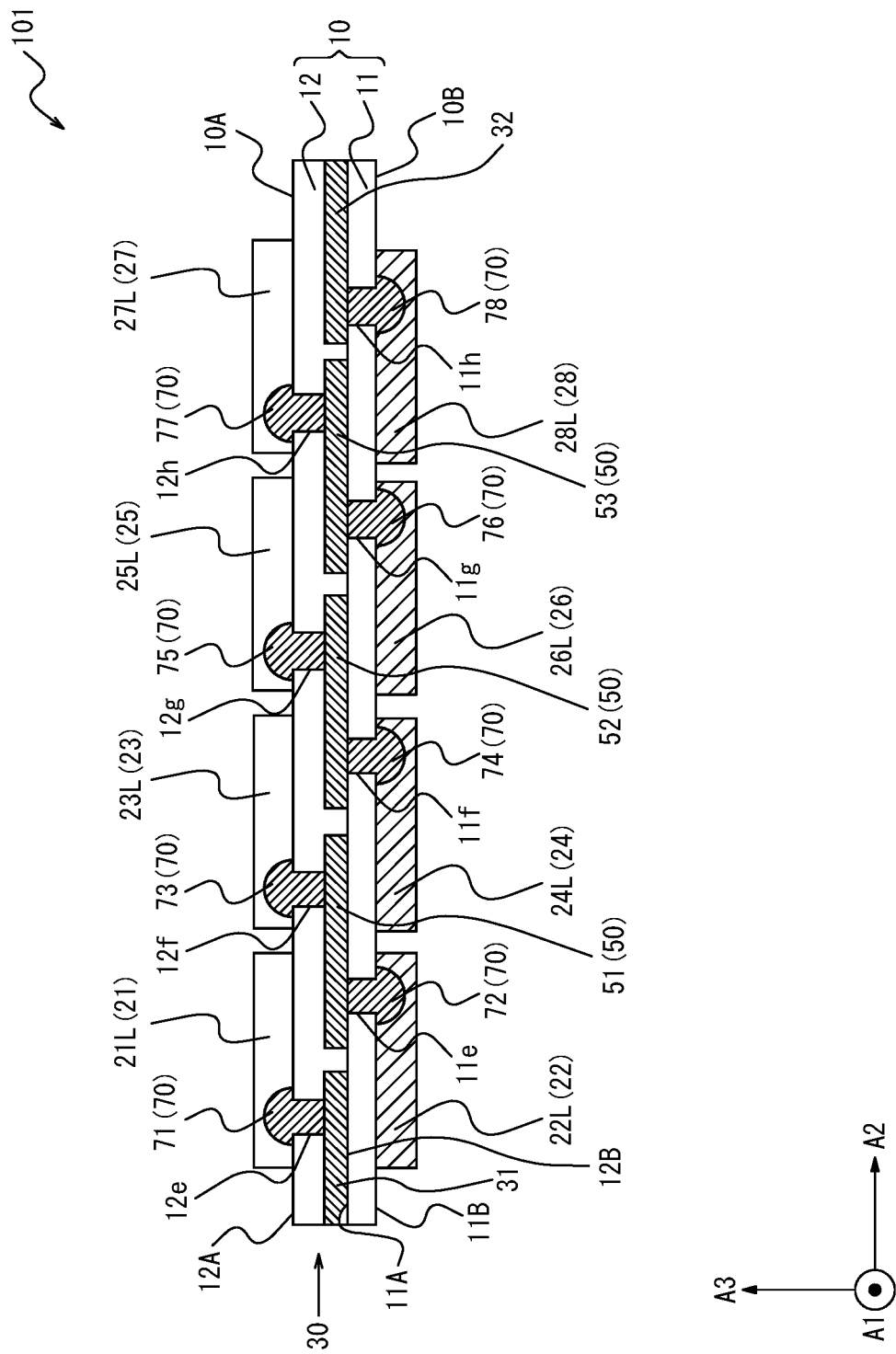
FIG. 7 is a cross-sectional view of the thermoelectric conversion module along a line L4-L4 illustrated in FIG. 5.

FIG. 5 is an external view of a thermoelectric conversion module 101 according to a modified example of the first embodiment of the present disclosure. FIG. 6 is a cross-sectional view of the thermoelectric conversion module 101 along a line L3-L3 illustrated in FIG. 5. FIG. 7 is a cross-sectional view of the thermoelectric conversion module 101 along a line L4-L4 illustrated in FIG. 5.

In the thermoelectric conversion module 101 according to the modified example, the entirety of the thermoelectric conversion elements 20 located at the side corresponding to the front surface 10A of the sheet substrate 10 overlaps with the entirety of the thermoelectric conversion elements 20 located at the side corresponding to the rear surface 10B of the sheet substrate 10 when viewed from the third direction A3. Such a configuration can further increase the density of thermoelectric conversion elements 20 in the thermoelectric conversion module 101 while also enabling compactization of the thermoelectric conversion module 101.

In the modified example, locations of the openings 12a to 12d in the insulating layer 12 and locations of the openings 11a to 11d in the substrate 11 may be the same when viewed from the third direction A3 as illustrated in FIG. 6. Moreover, locations of the first joining members 61, 63, 65, and 67 and locations of the first joining members 62, 64, 66, and 68 may be the same when viewed from the third direction A3.

Other configurations and effects of the thermoelectric conversion module 101 according to the modified example of the first embodiment are the same as for the thermoelectric conversion module 1 according to the first embodiment.

Method of Producing Thermoelectric Conversion Module

Figure 8:
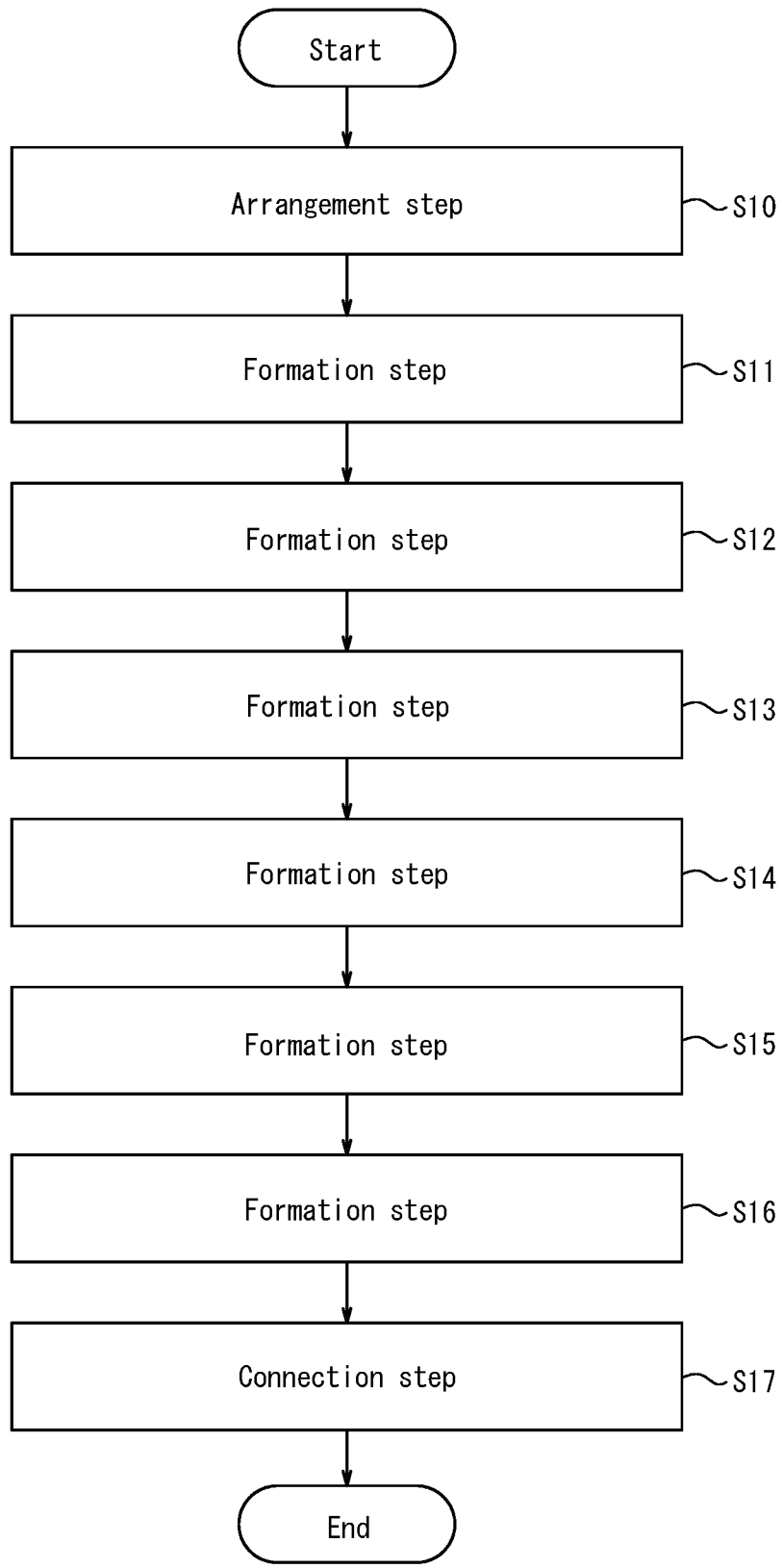
FIG. 8 is a flowchart illustrating a method of producing the thermoelectric conversion module illustrated in FIG. 1.

FIG. 8 is a flowchart illustrating a method of producing the thermoelectric conversion module 1 illustrated in FIG. 1. The method of producing the thermoelectric conversion module 1 includes an arrangement step S10, formation steps S11, S12, S13, S14, S15, and S16, and a connection step S17. However, the method by which the thermoelectric conversion module 1 according to the present embodiment is produced is not limited to the production method described below. Note that FIGS. 11 to 14 correspond to the cross-sectional view illustrated in FIG. 2.

<Arrangement Step S10>

Figure 9:
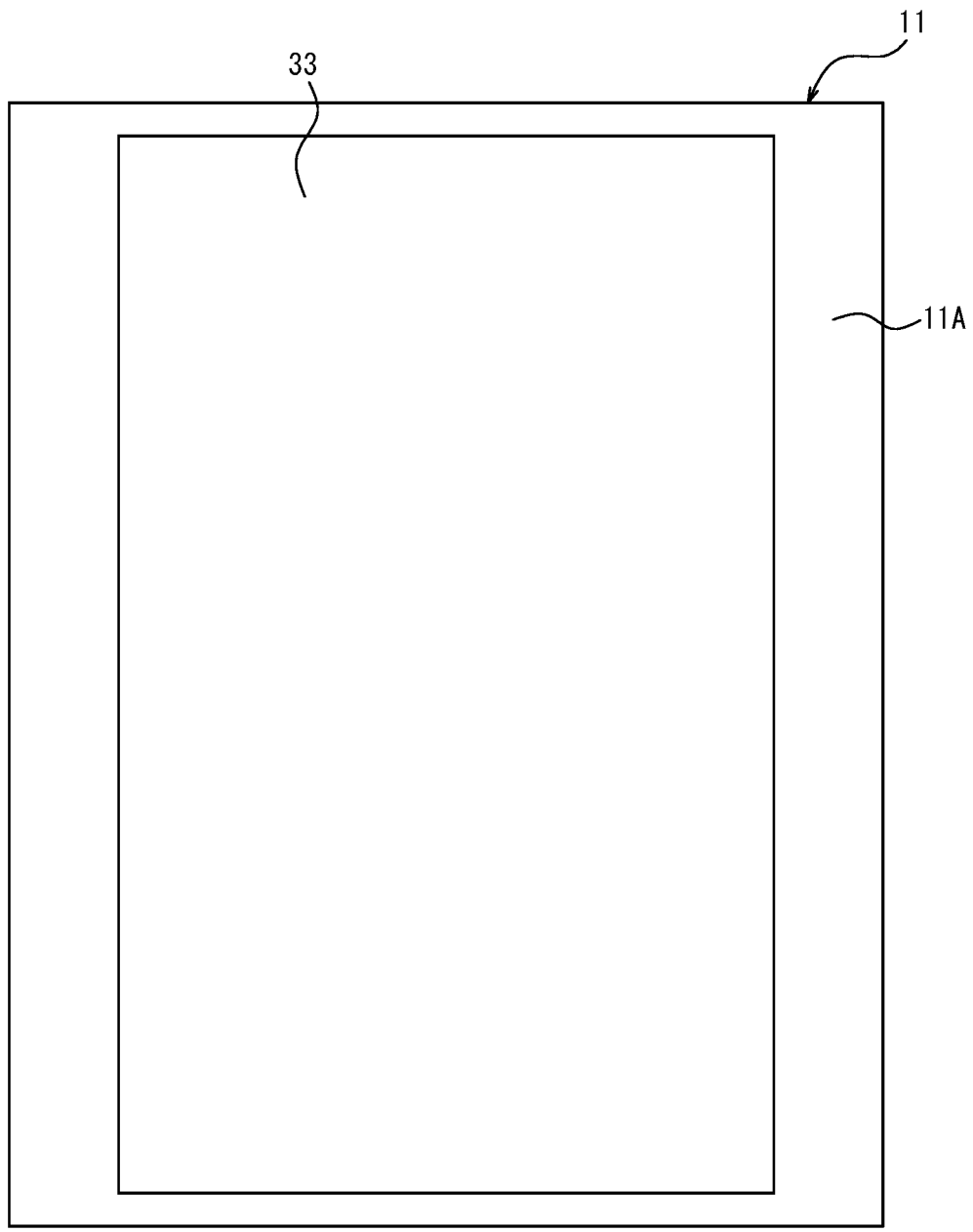
FIG. 9 illustrates configuration after an arrangement step of metal foil is performed.

The arrangement step S10 is a step of arranging metal foil 33 on a substrate 11 as illustrated in FIG. 9. The metal foil 33 may be arranged at a front surface 11A of the substrate 11. The metal foil 33 may be adhered to the front surface 11A of the substrate 11 through any adhesive having thermal conductivity. The metal foil 33 may be formed at the front surface 11A of the substrate 11 by any film formation method such as vapor deposition, sputtering, or plating. The metal foil 33 can constitute a first electrode 31, a second electrode 32, electrodes 40, and electrodes 50 after undergoing the formation step S11 and the like described below. The metal foil 33 may be any metal foil such as copper or aluminum.

<Formation Step S11>

Figure 10:
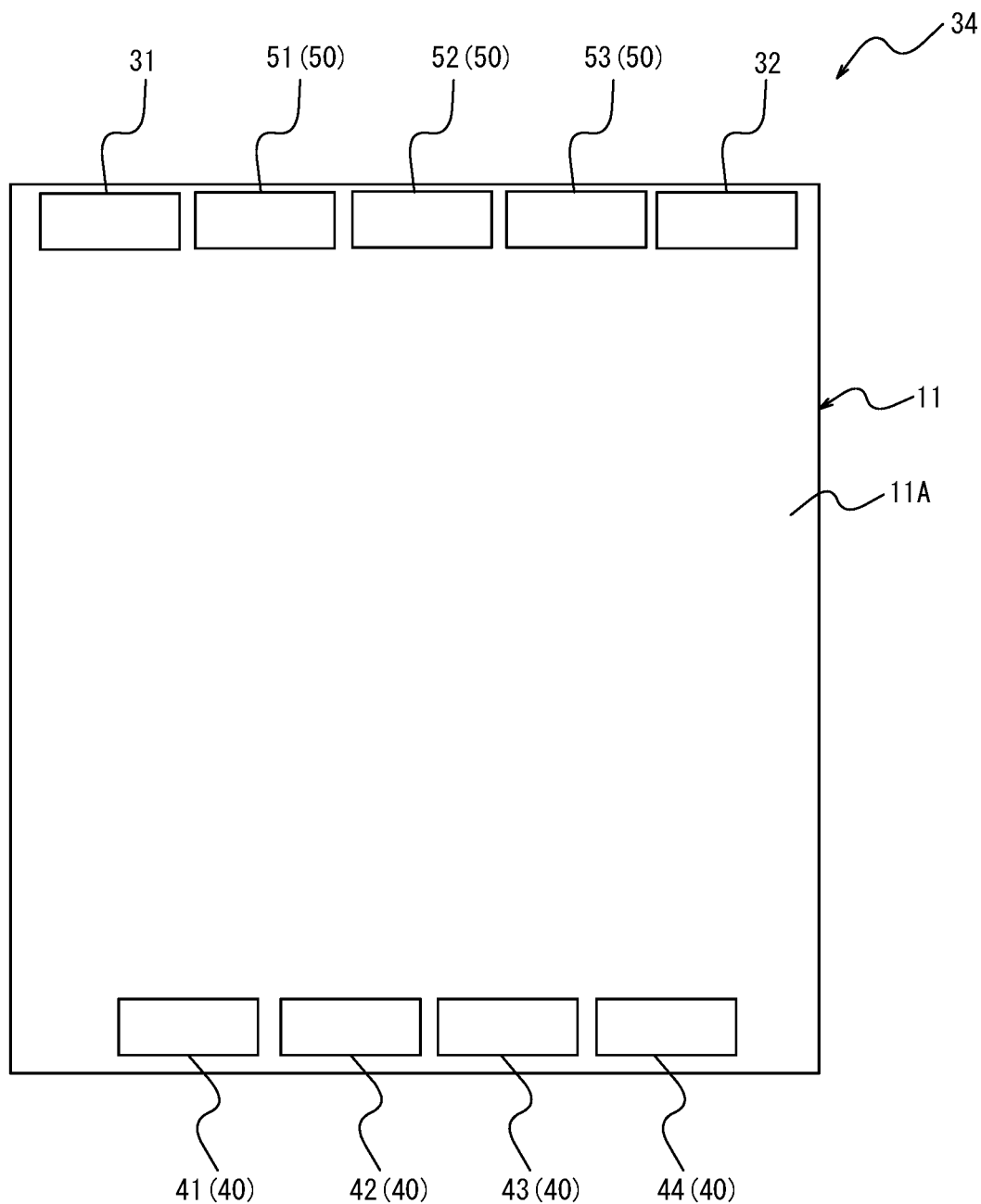
FIG. 10 illustrates configuration after a formation step of an electrode layer is performed.

The formation step S11 (electrode layer formation step) is a step of forming an electrode layer 34 such as illustrated in FIG. 10 through patterning of the metal foil 33. Commonly known photolithography or the like may be used in the patterning of the metal foil 33. The electrode layer 34 includes a first electrode 31, a second electrode 32, electrodes 40, and electrodes 50. In the present embodiment, the electrode layer 34 is only formed on the front surface 11A of the substrate 11. However, the electrode layer 34 may be formed on either or both of the front surface 11A and a rear surface 11B.

<Formation Step S12>

Figure 11:
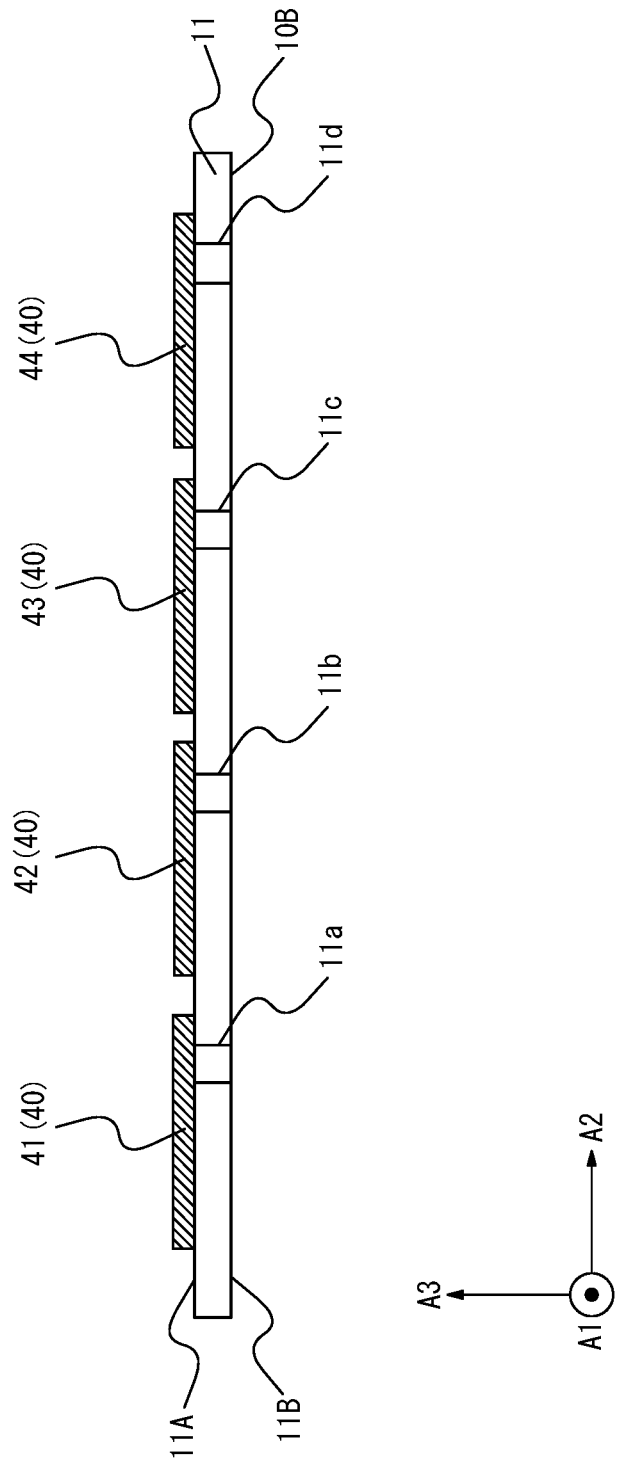
FIG. 11 illustrates configuration after a formation step of openings in a substrate is performed.

The formation step S12 is a step of forming openings 11a, 11b, 11c, and 11d in the substrate 11 as illustrated in FIG. 11 and forming openings 11e, 11f, 11g, and 11h in the substrate 11 such as illustrated in FIG. 3. The openings 11a to 11h may be formed using any heating laser.

<Formation Step S13>

Figure 12:
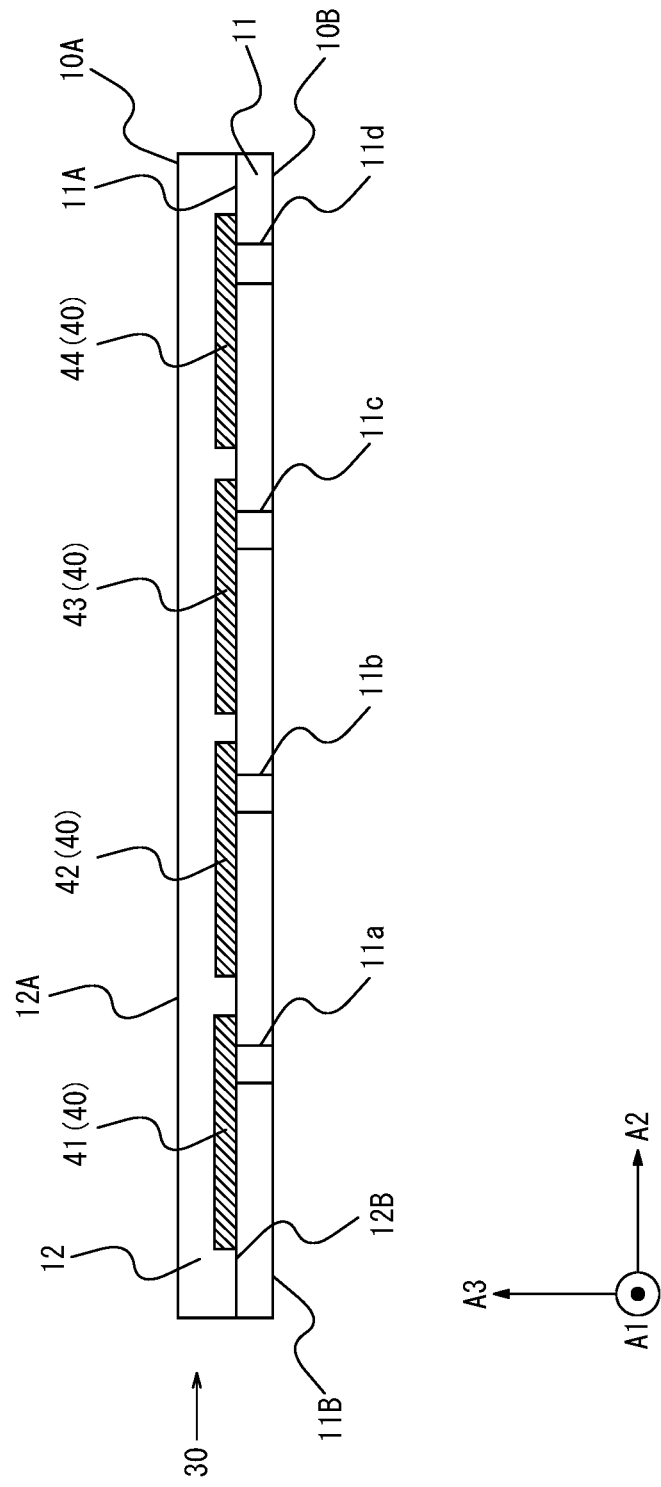
FIG. 12 illustrates configuration after a formation step of an insulating layer is performed.

The formation step S13 (insulating layer formation step) is a step of forming an insulating layer 12 on the electrode layer 34 that has been formed on the substrate 11 as illustrated in FIG. 12. The insulating layer 12 may be formed on the substrate 11 and the electrode layer 34. The insulating layer 12 may be formed by applying an electrically insulating material onto the electrode layer 34 in the formation step S13. A sheet substrate 10 has a configuration including the substrate 11 and the insulating layer 12.

<Formation Step S14>

Figure 13:
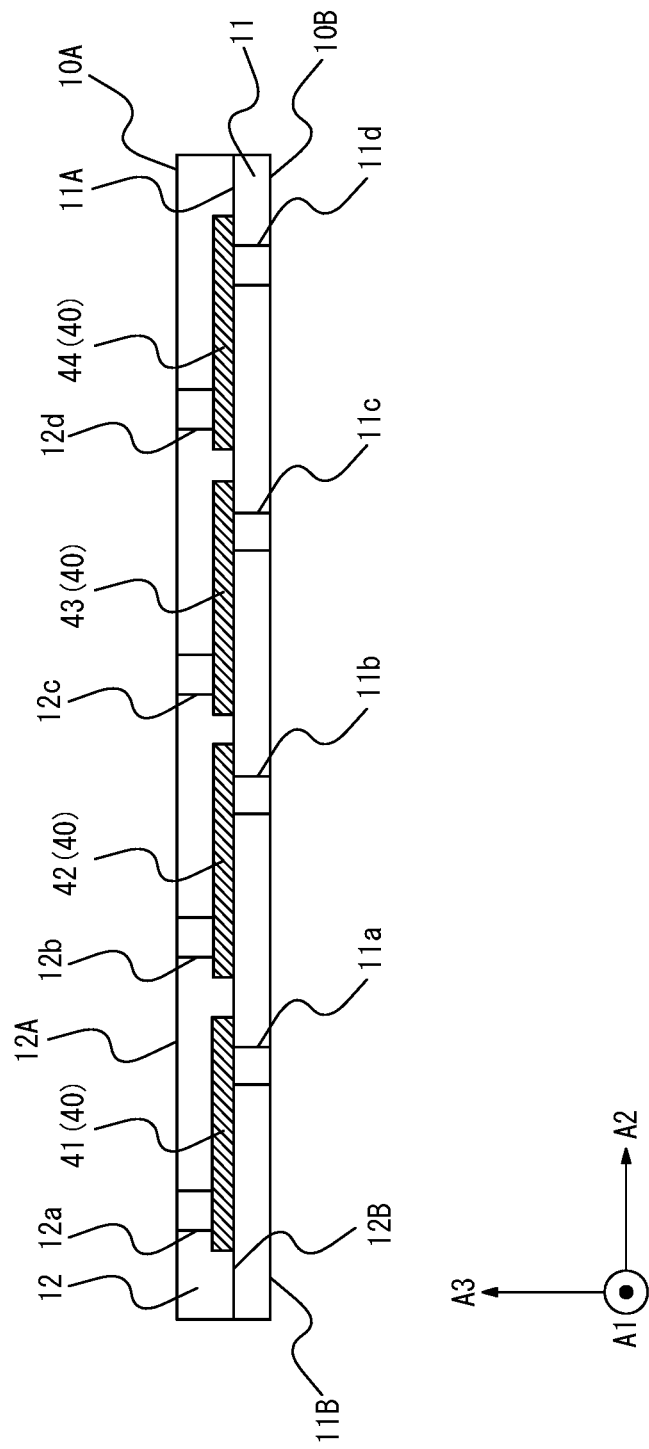
FIG. 13 illustrates configuration after a formation step of openings in the insulating layer is performed.

The formation step S14 is a step of forming openings 12a, 12b, 12c, and 12d in the insulating layer 12 as illustrated in FIG. 13 and forming openings 12e, 12f, 12g, and 12h in the insulating layer 12 such as illustrated in FIG. 3. The openings 12a to 12h may be formed using any heating laser.

<Formation step S15>

The formation step S15 (element formation step) is a step of forming a thermoelectric conversion element layer on the insulating layer 12 and on a surface of the substrate 11 where the electrode layer 34 is not formed. The formation step S15 may be a step of forming a thermoelectric conversion element layer at each of a front surface 10A and a rear surface 10B of the sheet substrate 10. The thermoelectric conversion element layer is a layer that contains CNTs. The thermoelectric conversion element layer can constitute thermoelectric conversion elements 20 after undergoing the formation step S16 and the like described below. As previously described, the use of CNTs in the thermoelectric conversion material for forming the thermoelectric conversion elements 20 can further improve mechanical strength of the thermoelectric conversion module 1 and enables weight reduction. As a result of the thermoelectric conversion element layer containing CNTs, it is possible to produce a thermoelectric conversion module 1 having further improved mechanical strength and reduced weight.

Figure 14:
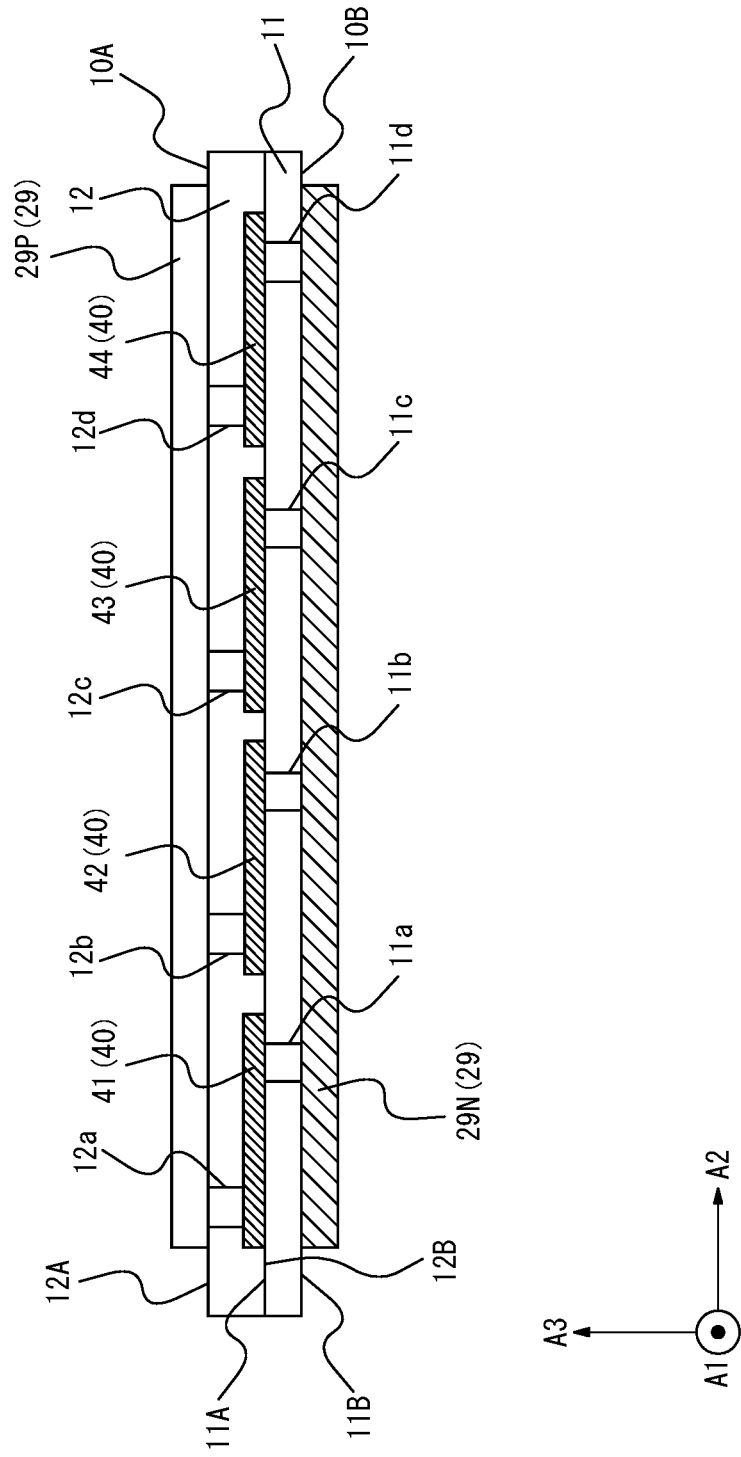
FIG. 14 illustrates configuration after arrangement of carbon nanotube sheets.

In the present embodiment, the thermoelectric conversion element layer is taken to be a CNT sheet (carbon nanotube sheet) 29P and a CNT sheet 29N such as illustrated in FIG. 14. The CNT sheets 29P and 29N contain CNTs.

In the present embodiment, the formation step S15 is a step of arranging the CNT sheet 29P at the front surface 10A of the sheet substrate 10 (for example, at a front surface 12A of the insulating layer 12) and arranging the CNT sheet 29N at the rear surface 10B of the sheet substrate 10 (for example, at the rear surface 11B of the substrate 11).

The CNT sheet 29P is a p-type CNT sheet. The CNT sheet 29P may be adhered to the front surface 10A of the sheet substrate 10 through any adhesive sheet such as epoxy resin. The CNT sheet 29P can constitute thermoelectric conversion elements 21, 23, 25, and 27 after undergoing the formation step S16 and the like described below.

The CNT sheet 29N is an n-type CNT sheet. The CNT sheet 29N may be adhered to the rear surface 10B of the sheet substrate 10 through any adhesive sheet such as epoxy resin. The CNT sheet 29N can constitute thermoelectric conversion elements 22, 24, 26, and 28 after undergoing the formation step S16 and the like described below.

In the following description, the CNT sheet 29P and the CNT sheet 29N are also referred to collectively as "CNT sheets 29" when no specific distinction is made therebetween.

The thickness of the CNT sheets 29 in the third direction A3 may be approximately 50 μm. A thickness of approximately 50 μm for the CNT sheets 29 makes it possible for electrical characteristics of the thermoelectric conversion elements 20 to be displayed. For example, the amount of electricity generated by the thermoelectric conversion elements 20, as an electrical characteristic of the thermoelectric conversion elements 20, can be ensured to a certain extent.

Note that in the formation step S15, a CNT coating film formed by a known application method using a CNT dispersion liquid may be arranged on the insulating layer 12 or the substrate 11 instead of a CNT sheet 29. However, a CNT coating film suffers from a problem that CNTs aggregate during a process of drying the CNT dispersion liquid, resulting in reduction of electrical conductivity of the CNT coating film and reduction of free-standing ability of the CNT coating film. Moreover, in order to produce a CNT coating film of 50 μm in thickness by an application method, it is desirable to add a binder to the CNT dispersion liquid. However, adding a binder to the CNT dispersion liquid ultimately results in a problem of reduction of electrical conductivity of the CNT coating film. Such problems can be solved by using CNT sheets 29 in the formation step S15.

The CNT sheets 29 can be any of those described in Japanese Patent Application No. 2018-065290, but are not specifically limited thereto. The CNT sheets 29 may contain bundles in which a plurality of single-walled CNTs are entangled. The thickness of these bundles may be 1 μm or less. Through the thickness of the bundles being 1 μm or less, it is possible to reduce fuzzing of a cut surface of a thermoelectric conversion element 20 caused by a laser in the subsequently described formation step S16. By reducing fuzzing of thermoelectric conversion elements 20, it is possible to inhibit the occurrence of a short-circuit caused by fuzzing of the thermoelectric conversion elements Depending on the state of each of the CNT sheets 29, a sheet serving as a cover may be arranged on the CNT sheet 29 or a resin material may be applied onto the CNT sheet 29 in the formation step S15 in order to reduce damage caused by a laser in the subsequently described formation step S16.

<Formation Step S16>

The formation step S16 (thermoelectric conversion element formation step) is a step of cutting the thermoelectric conversion element layer (i.e., the CNT sheets 29) along the first direction A1 to form a plurality of thermoelectric conversion elements 20 lined up in the second direction A2. Cutting of the CNT sheets 29 along the first direction A1 forms gaps s1 such as illustrated in FIG. These gaps s1 make it possible to partition two thermoelectric conversion elements 20 that are adjacent to each other in the second direction A2.

Figure 15:
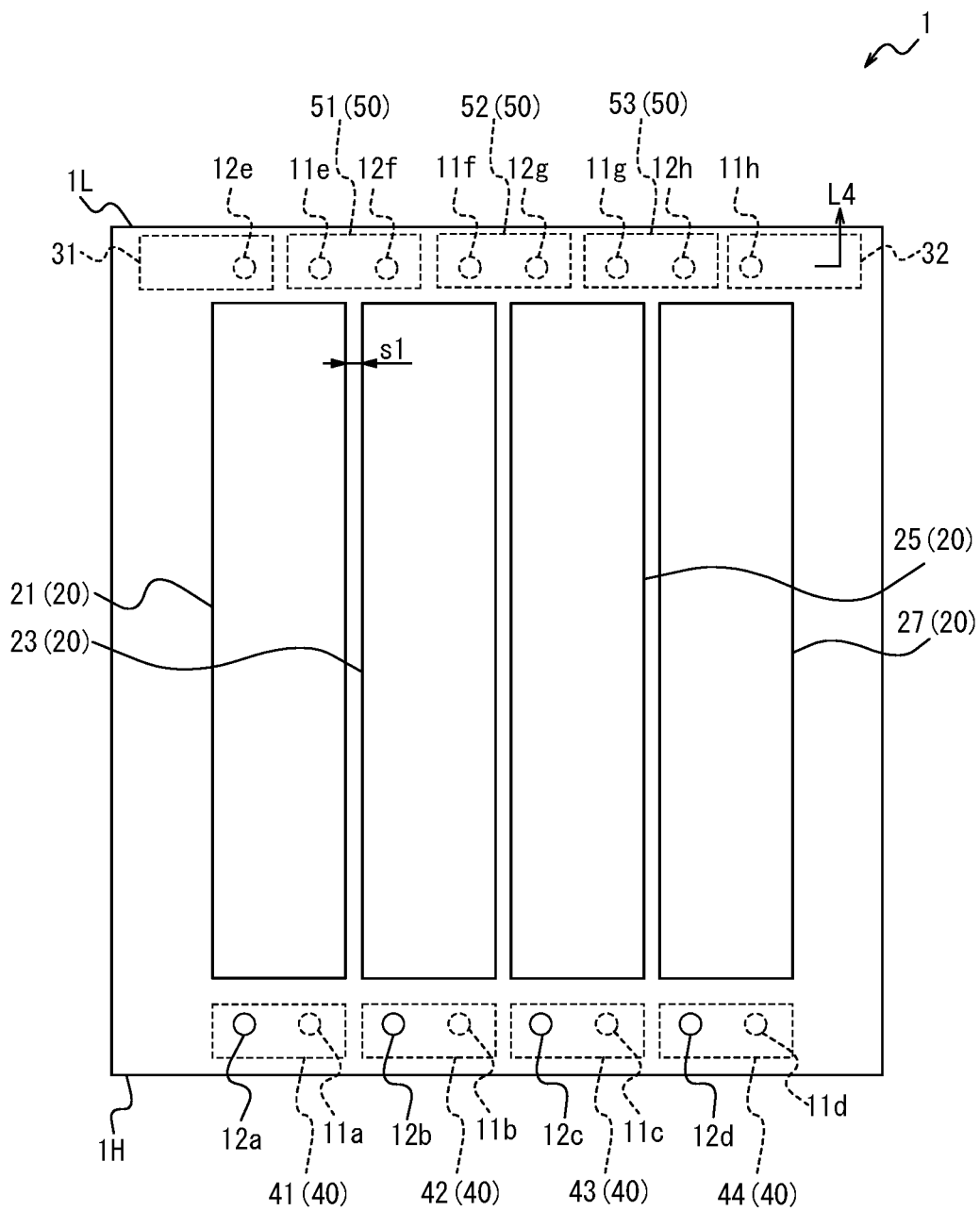
FIG. 15 illustrates configuration after arrangement of carbon nanotube sheets.

The formation step S16 may be performed using a laser. In the formation step S16, the CNT sheets 29P and 29N may each be cut along the first direction A1 by the laser. The CNT sheet 29P may be irradiated with the laser from a side corresponding to the third direction A3. Moreover, the CNT sheet 29N may be irradiated with the laser from a side corresponding to the opposite direction to the third direction A3. Cutting of the CNT sheets 29 along the first direction A1 by the laser makes it possible to form gaps s1 such as illustrated in FIG. 15.

In the formation step S16, the CNT sheets 29 may be cut along the first direction A1 by a UV (UltraViolet) laser, a nanosecond laser, or a femtosecond laser. However, the laser used in the formation step S16 is not limited to these lasers. Any laser the enables cutting of just the CNT sheet 29P when the CNT sheet 29P is irradiated from a side corresponding to the third direction A3 and that enables cutting of just the CNT sheet 29N when the CNT sheet 29N is irradiated from a side corresponding to the opposite direction to the third direction A3 may be used in the formation step S16. In a case in which a UV laser having a power of 5 W is used, the UV laser may be scanned along the first direction A1 about 10 times to several 10 s of times at sites corresponding to gaps s1 in the CNT sheets 29.

The thermal conductivity of the CNT sheets 29 in an in-plane direction can be approximately 100 times the thermal conductivity of the CNT sheets 29 in a thickness direction. For example, the thermal conductivity of the CNT sheets 29 in the second direction A2 can be approximately 100 times the thermal conductivity of the CNT sheets 29 in the third direction A3. For this reason, in a case in which a heating laser such as a YAG (Yttrium Aluminum Garnet) laser is used in the formation step S16, the gaps s1 may widen in the second direction A2 as the CNT sheets 29 are cut along the first direction A1 by the heating laser. In a case in which the thickness of the CNT sheets 29 in the third direction A3 is approximately 50 µm, the use of a heating laser in the formation step S16 may result in widening of the gaps s1 by approximately 5 mm in the second direction A2.

In contrast, generation of heat due to the laser can be reduced by using a laser such as a UV laser, a nanosecond laser, or a femtosecond laser in the formation step S16. By reducing heat generation due to the laser in the formation step S16, widening of the gaps s1 in the second direction A2 can be suppressed. Suppressing widening of the gaps s1 in the second direction A2 makes it possible to increase the density of thermoelectric conversion elements 20 in the thermoelectric conversion module 1. Increasing the density of thermoelectric conversion elements 20 in the thermoelectric conversion module 1 enables compactization of the thermoelectric conversion module 1.

The spot diameter of a UV laser can be smaller than the spot diameter of other lasers. For example, the spot diameter of a UV laser can be approximately 8 µm. Through a UV laser having a smaller spot diameter, it is possible to narrow the focus of the UV laser on the CNT sheets 29. In a case in which a UV laser is used in the formation step S16, narrowing of the focus of the UV laser on the CNT sheets 29 and reduction of heat generation due to the UV laser make it possible to improve processing accuracy in patterning of the CNT sheets 29. For example, the width of the gaps s1 in the second direction A2 can be approximately 0.05 mm to 0.1 mm. By improving processing accuracy in patterning of the CNT sheets 29, the density of thermoelectric conversion elements 20 in the thermoelectric conversion module 1 can be further increased, and the size of the thermoelectric conversion module 1 can be further reduced.

The use of a laser in the formation step S16 makes it possible to perform patterning of the CNT sheets 29 by the laser through computer control. Such a configuration can simplify the formation step S16.

<Connection Step S17>

The connection step S17 is a step of electrically connecting an end of each thermoelectric conversion element 20 (i.e., a first end 20H or a second end 20L) through a connector 30 such that the plurality of thermoelectric conversion elements 20 are all electrically connected in series.

The connection step S17 according to the present embodiment is a step of applying silver paste.

In the connection step S17, silver paste is applied along the first direction A1 from the openings 12a to 12d in the insulating layer 12, such as illustrated in FIG. 1, up to a first end 21H of a thermoelectric conversion element 21, a first end 23H of a thermoelectric conversion element 23, a first end 25H of a thermoelectric conversion element 25, and a first end 27H of a thermoelectric conversion element 27, respectively. Some of this silver paste is filled into the openings 12a to 12d and is electrically connected to the electrodes 41 to 44. This silver paste can constitute first joining members 61, 63, 65, and 67 after drying.

In the connection step S17, silver paste is applied along the first direction A1 from the openings 11a to 11d in the substrate 11, such as illustrated in FIG. 1, up to a first end 22H of a thermoelectric conversion element 22, a first end 24H of a thermoelectric conversion element 24, a first end 26H of a thermoelectric conversion element 26, and a first end 28H of a thermoelectric conversion element 28, respectively. Some of this silver paste is filled into the openings 11a to 11d and is electrically connected to the electrodes 41 to 44. This silver paste can constitute first joining members 62, 64, 66, and 68 after drying.

In the connection step S17, silver paste is applied along the first direction A1 from the opening 12e in the insulating layer 12, such as illustrated in FIG. 1, up to a second end 21L of the thermoelectric conversion element 21. Some of this silver paste is filled into the opening 12e and is electrically connected to the first electrode 31. This silver paste can constitute a second joining member 71 after drying.

In the connection step S17, silver paste is applied along the first direction A1 from the openings 12f and 12g in the insulating layer 12, such as illustrated in FIG. 1, up to a second end 23L of the thermoelectric conversion element 23 and a second end 25L of the thermoelectric conversion element 25, respectively. Some of this silver paste is filled into the openings 12f and 12g and is electrically connected to the electrodes 51 and 52, respectively. This silver paste can constitute second joining members 73 and 75 after drying.

In the connection step S17, silver paste is applied along the first direction A1 from the openings 11e to 11g in the substrate 11, such as illustrated in FIG. 1, up to a second end 22L of the thermoelectric conversion element 22, a second end 24L of the thermoelectric conversion element 24, and a second end 26L of the thermoelectric conversion element 26, respectively. Some of this silver paste is filled into the openings 11e to 11g and is electrically connected to the electrodes 51 to 53, respectively. This silver paste can constitute second joining members 72, 74, and 76 after drying.

In the connection step S17, silver paste is applied along the first direction A1 from the opening 11h in the substrate 11, such as illustrated in FIG. 1, up to a second end 28L of the thermoelectric conversion element 28. Some of this silver paste is filled into the opening 11h and is electrically connected to the second electrode 32. This silver paste can constitute a second joining member 78 after drying.

In this manner, the CNT sheets 29 can be cut along the first direction A1 by a UV laser, a nanosecond laser, or a femtosecond laser in the formation step S16 of the method of producing the thermoelectric conversion module 1 according to the present embodiment. A configuration such as set forth above can suppress widening of gaps s1 such as illustrated in FIG. 15 in the second direction A2 as previously described. Suppressing widening of the gaps s1 in the second direction A2 makes it possible to increase the density of thermoelectric conversion elements 20 in the thermoelectric conversion module 1 and reduce the size of the thermoelectric conversion module 1.

Note that the thermoelectric conversion module 1 according to the first embodiment has been described as only including an electrode layer 34 at the front surface 11A of the substrate 11. Moreover, the thermoelectric conversion elements 20 located at the side corresponding to the front surface 10A of the sheet substrate 10 have been described as being electrically connected to the thermoelectric conversion elements 20 located at the side corresponding to the rear surface 10B of the sheet substrate 10 via the substrate 11, the electrode layer 34, and the insulating layer 12. However, the thermoelectric conversion module 1 may include electrode layers 34 at both the front surface 11A and the rear surface 11B of the substrate 11. In this case, the thermoelectric conversion module 1 may include insulating layers 12 on both of the electrode layers 34 that are formed at both the front surface 11A and the rear surface 11B of the substrate 11. In this case, the thermoelectric conversion elements 20 located at the side corresponding to the front surface 10A of the sheet substrate 10 may be electrically connected to the thermoelectric conversion elements 20 located at the side corresponding to the rear surface 10B of the sheet substrate 10 via an insulating layer 12, an electrode layer 34, a substrate 11, an electrode layer 34, and an insulating layer 12.

SECOND EMBODIMENT

Figure 16:
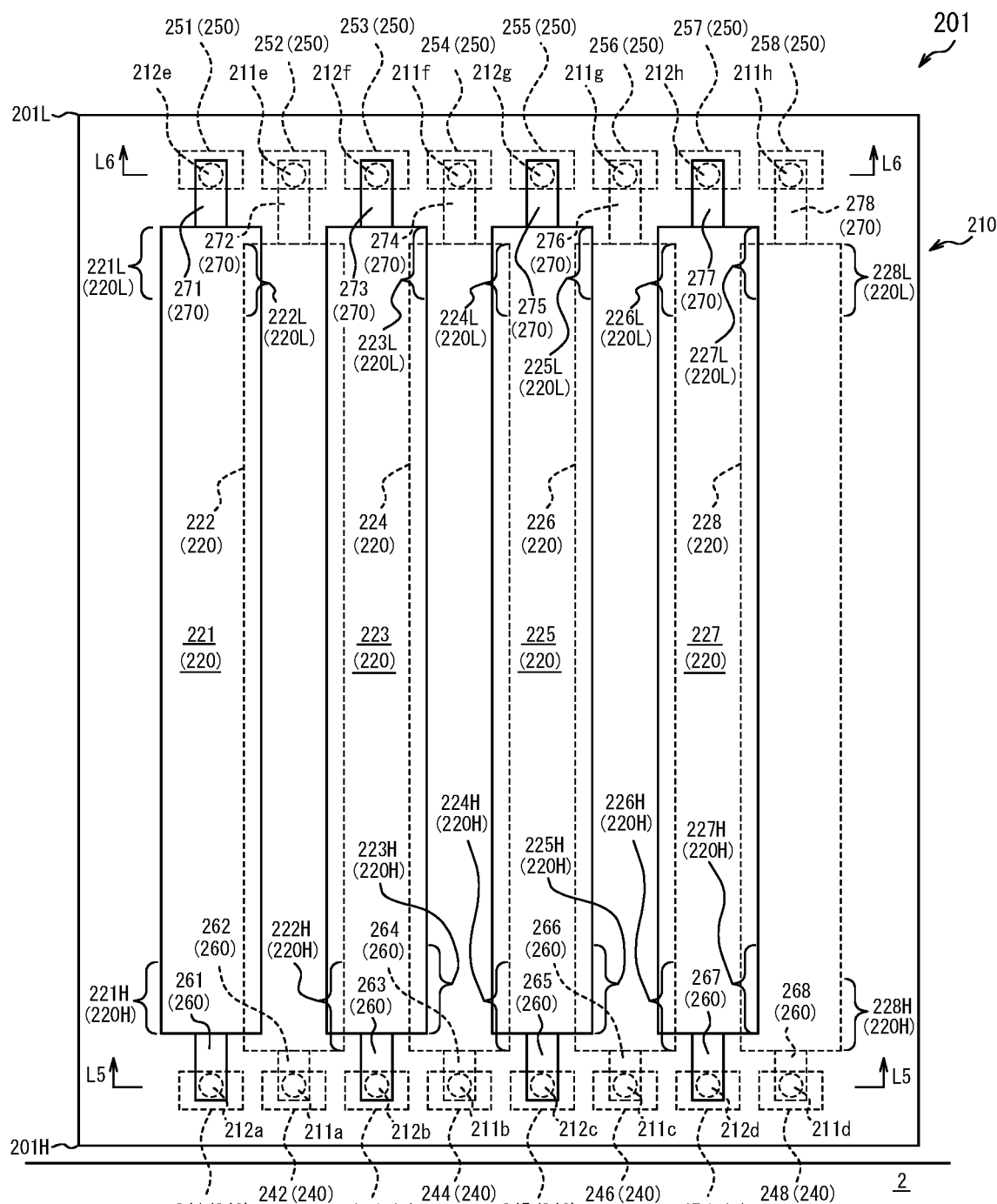
FIG. 16 is an external view of a thermoelectric conversion module according to a second embodiment of the present disclosure.
Figure 17:
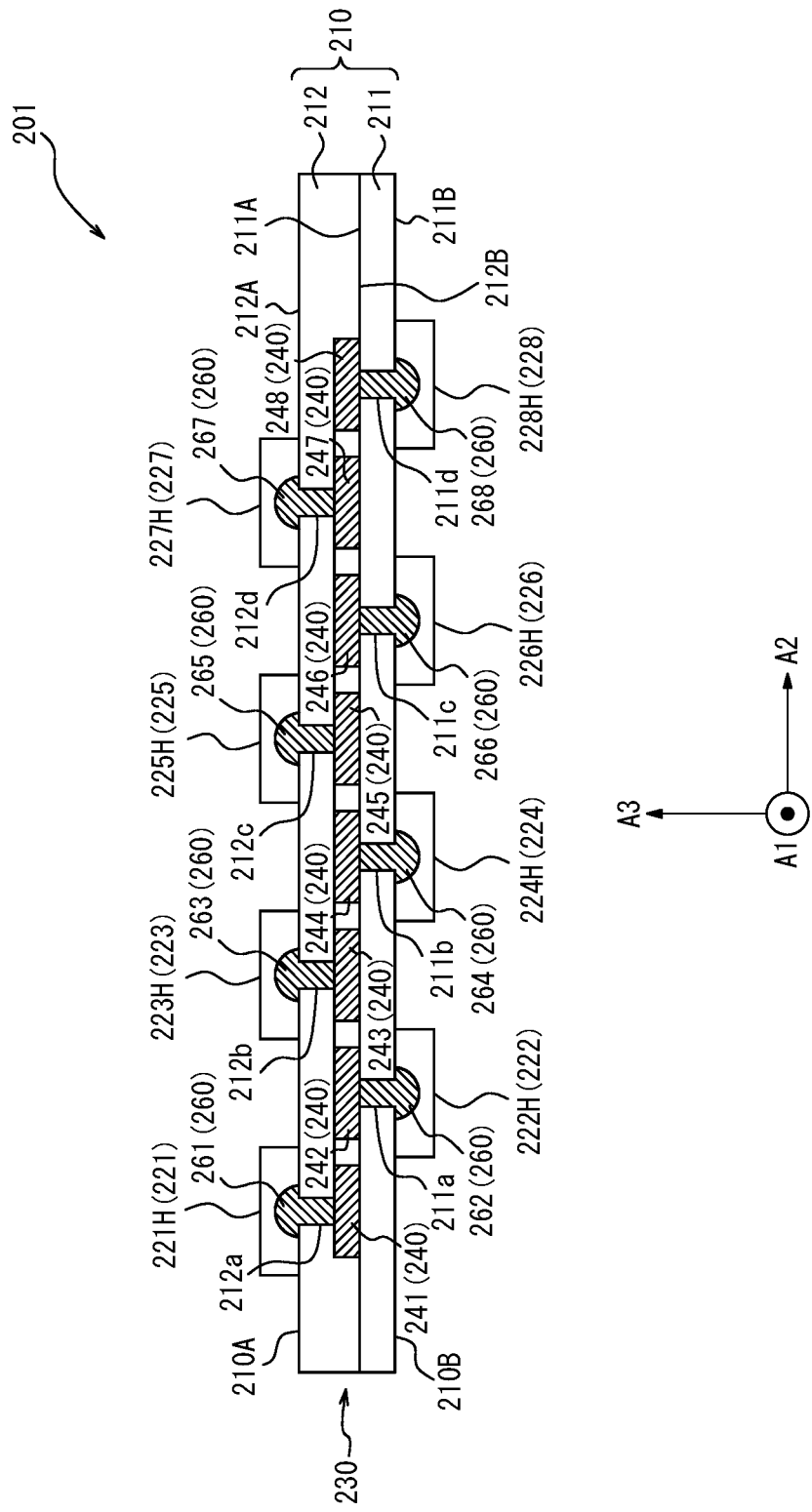
FIG. 17 is a cross-sectional view of the thermoelectric conversion module along a line L5-L5 illustrated in FIG. 16.
Figure 18:
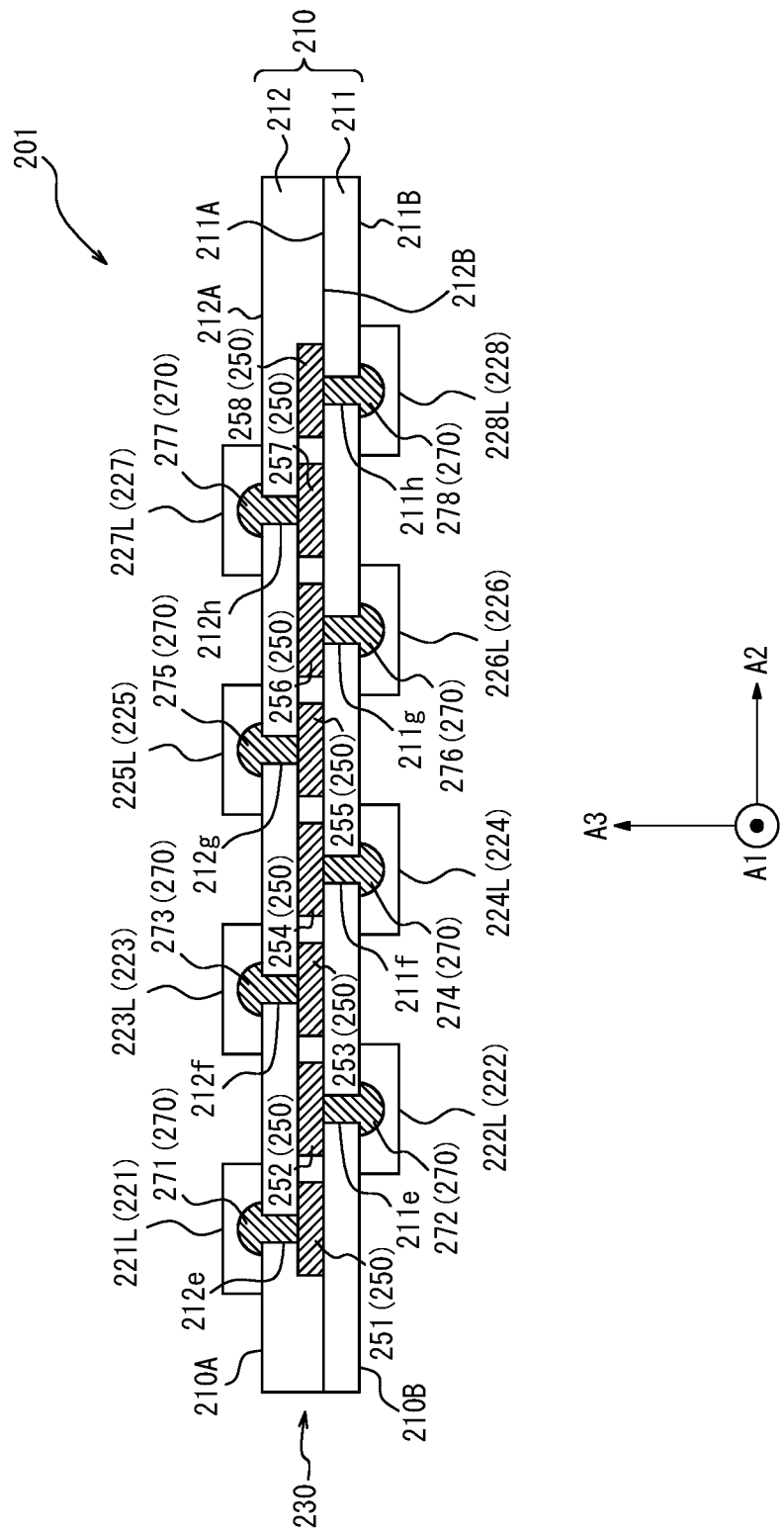
FIG. 18 is a cross-sectional view of the thermoelectric conversion module along a line L6-L6 illustrated in FIG. 16.
Figure 19:
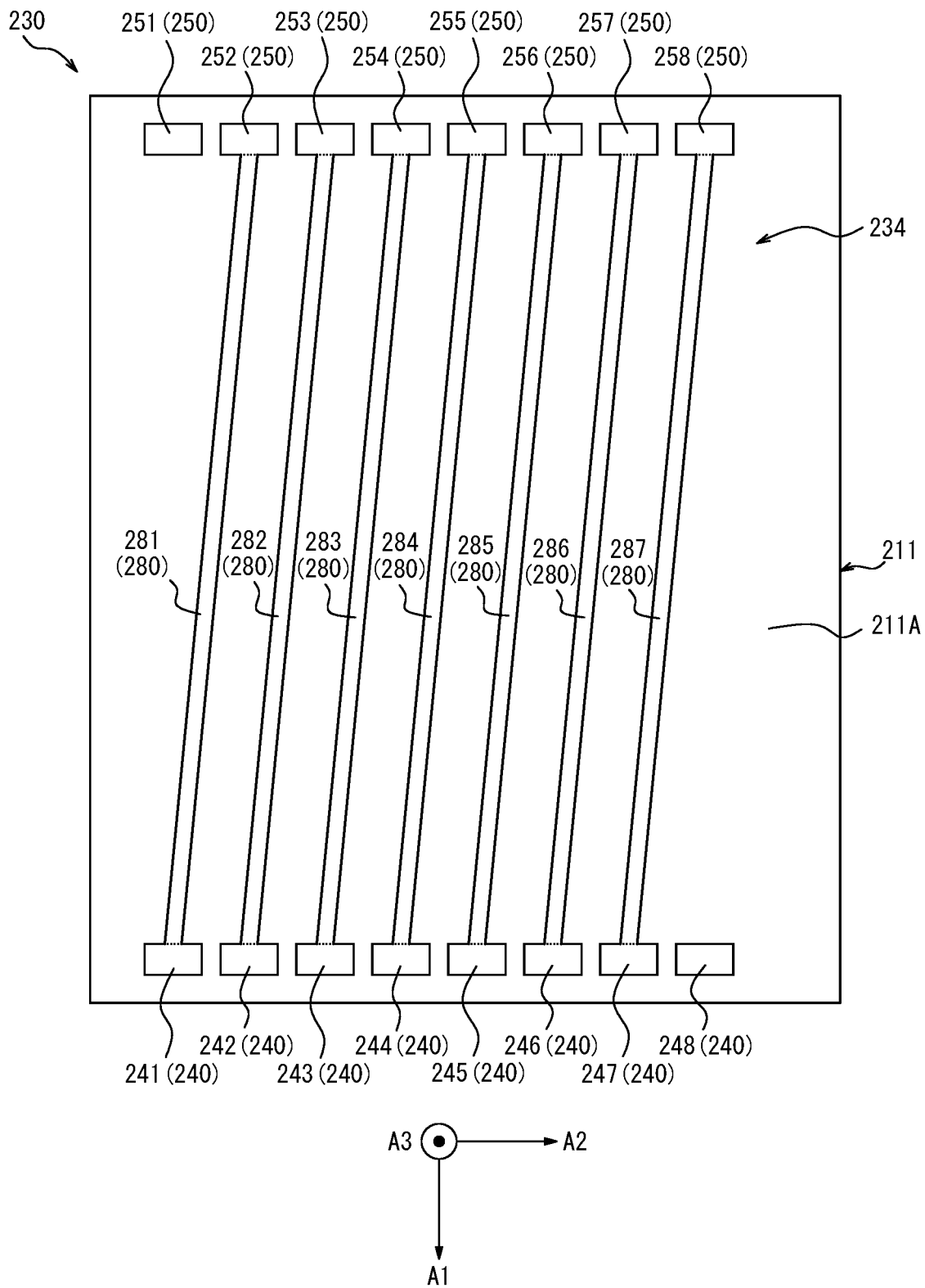
FIG. 19 illustrates an electrode layer illustrated in FIG. 14.
Figure 20:
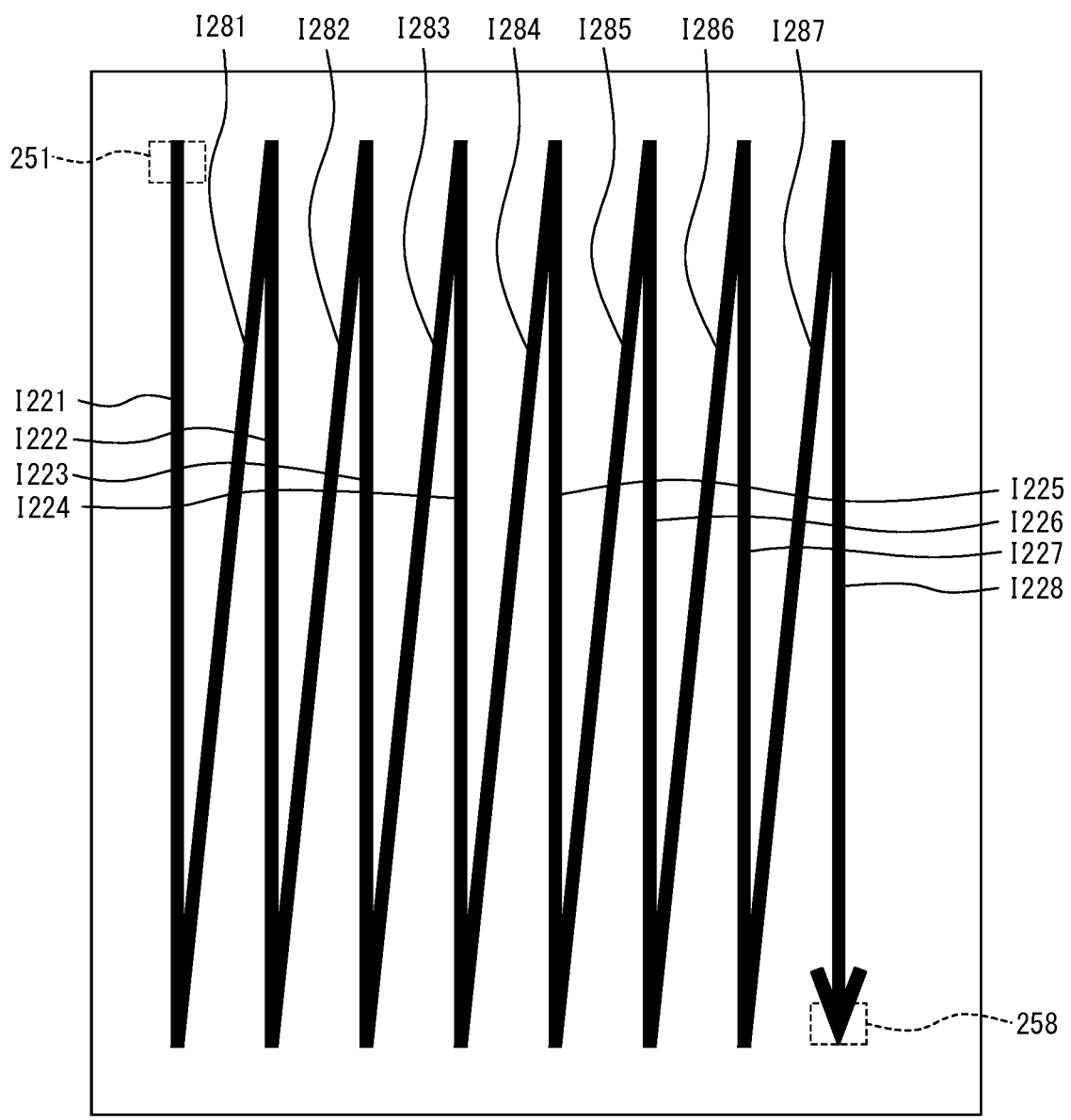
FIG. 20 illustrates a current path in the thermoelectric conversion module illustrated in FIG. 16.

FIG. 16 is an external view of a thermoelectric conversion module 201 according to a second embodiment of the present disclosure. FIG. 17 is a cross-sectional view of the thermoelectric conversion module 201 along a line L5-L5 illustrated in FIG. 16. FIG. 18 is a cross-sectional view of the thermoelectric conversion module 201 along a line L6-L6 illustrated in FIG. 16. FIG. 19 illustrates an electrode layer 234 that is illustrated in FIG. 14. The configuration illustrated in FIG. 19 corresponds to a configuration after implementation of a formation step S11 of the electrode layer 234 described further below. FIG. 20 illustrates a current path in the thermoelectric conversion module 201 illustrated in FIG. 16.

The thermoelectric conversion module 201 can be arranged at a heat source 2 in the same manner as in the first embodiment. The thermoelectric conversion module 201 has a first edge 201H and a second edge 201L on a sheet substrate 210, which is described further below. The first edge 201H and the second edge 201L are opposite to each other. The first edge 201H can be located close to the heat source 2 when the thermoelectric conversion module 201 is arranged at the heat source 2 in the same manner as the first edge 1H such as illustrated in FIG. 1. The second edge 201L can be located far from the heat source 2 when the thermoelectric conversion module 201 is arranged at the heat source 2 in the same manner as the second edge 1L such as illustrated in FIG. 1.

The temperature around the first edge 201H can be higher than the temperature around the second edge 201L in the same manner as for the first edge 1H such as illustrated in FIG. 1. In other words, the temperature around the second edge 201L can be lower than the temperature around the first edge 201H.

The first direction A1, the second direction A2, and the third direction A3 can be adopted in the second embodiment in the same manner as in the first embodiment. In the second embodiment, the first direction A1 is a direction in which the first edge 201H and the second edge 201L are opposite to each other. The first direction A1 is defined as a direction toward the first edge 201H from the second edge 201L. Moreover, in the present embodiment, the third direction A3 is defined as a direction toward the foreground of the page from the background of the page in FIG. 16.

As illustrated in FIG. 16, the shape of the thermoelectric conversion module 201 as viewed from the third direction A3 is a quadrilateral shape such as a rectangular shape. However, the shape of the thermoelectric conversion module 201 as viewed from the third direction A3 may be any shape such as a circular sector shape. The thermoelectric conversion module 201 includes the sheet substrate 210 and thermoelectric conversion elements 221, 222, 223, 224, 225, 226, 227, and 228. The thermoelectric conversion module 201 also includes a connector 230, a first electrode 251, and a second electrode 248 as illustrated in FIG. 17 and FIG. 18. As illustrated in FIG. 17 and FIG. 18, the connector 230 includes electrodes 241, 242, 243, 244, 245, 246, and 247, electrodes 252, 253, 254, 255, 256, 257, and 258, first joining members 261, 262, 263, 264, 265, 266, 267, and 268, second joining members 271, 272, 273, 274, 275, 276, 277, and 278, and wires 281, 282, 283, 284, 285, 286, and 287.

In the following description, the thermoelectric conversion elements 221 to 228 are also referred to collectively as "thermoelectric conversion elements 220" when no specific distinction is made therebetween. FIG. 16 illustrates a thermoelectric conversion module 201 that includes 8 thermoelectric conversion elements 220. However, the number of thermoelectric conversion elements 220 included in the thermoelectric conversion module 201 may be any number.

In the following description, the electrodes 241 to 247 and the second electrode 248 are also collectively referred to as "electrodes 240" when no specific distinction is made therebetween. Moreover, the first electrode 251 and the electrodes 252 to 258 are also collectively referred to as "electrodes 250" when no specific distinction is made therebetween. Furthermore, the wires 281 to 287 are also referred to collectively as "wires 280" when no specific distinction is made therebetween. FIG. 19 illustrates a connector 230 that includes 8 electrodes 240, 8 electrodes 250, and 7 wires 280. However, the number of electrodes 240, the number of electrodes 250, and the number of wires 280 included in the connector 230 may be numbers in accordance with the number of thermoelectric conversion elements 220 included in the thermoelectric conversion module 201.

In the following description, the first joining members 261 to 268 are also referred to collectively as "first joining members 260" when no specific distinction is made therebetween. Moreover, the second joining members 271 to 278 are also referred to collectively as "second joining members 270" when no specific distinction is made therebetween. FIG. 16 illustrates a thermoelectric conversion module 201 that includes 8 first joining members 260 and 8 second joining members 270. However, the number of first joining members 260 and the number of second joining members 270 included in the thermoelectric conversion module 201 may be numbers in accordance with the number of thermoelectric conversion elements 220 included in the thermoelectric conversion module 201.

The sheet substrate 210 is electrically insulating. The sheet substrate 210 may be flexible. The material for forming the sheet substrate 210 can be any electrically insulating material without any specific limitations. The shape of the sheet substrate 210 as viewed from the third direction A3 is a quadrilateral shape such as a rectangular shape. However, the shape of the sheet substrate 210 as viewed from the third direction A3 may be any shape such as a circular sector shape. The sheet substrate 210 may be parallel to a plane including the first direction A1 and the second direction A2.

The sheet substrate 210 has the first edge 201H described above and the second edge 201L described above. As illustrated in FIG. 17, the sheet substrate 210 has a front surface 210A and a rear surface 210B. The front surface 210A and the rear surface 210B are opposite to each other. The front surface 210A is a surface that faces in the third direction A3 among surfaces of the sheet substrate 210. The rear surface 210B is a surface that faces in an opposite direction to the third direction A3 among surfaces of the sheet substrate 210.

As illustrated in FIG. 17, the sheet substrate 210 includes a substrate 211 and an insulating layer 212.

The substrate 211 is electrically insulating. The substrate 211 may be flexible. The material of the substrate 211 may be the same as the material of the substrate 11 such as illustrated in FIG. 2. The shape of the substrate 211 as viewed from the third direction A3 is a quadrilateral shape such as a rectangular shape. However, the shape of the substrate 211 as viewed from the third direction A3 may be any shape such as a circular sector shape. The substrate 211 may be parallel to a plane including the first direction A1 and the second direction A2.

The substrate 211 has a front surface 211A and a rear surface 211B. The front surface 211A and the rear surface 211B are opposite to each other. The front surface 211A is a surface that faces in the third direction A3 among surfaces of the substrate 211. The rear surface 211B is a surface that faces in an opposite direction to the third direction A3 among surfaces of the substrate 211. The rear surface 211B may correspond to the rear surface 210B of the sheet substrate 210.

As illustrated in FIG. 17, the substrate 211 includes openings 211a, 211b, 211c, and 211d. Locations of the openings 211a to 211d as viewed from the third direction A3 may correspond to locations of the electrodes 242, 244, and 246 and the second electrode 248, respectively, as illustrated in FIG. 16. As illustrated in FIG. 18, the substrate 211 includes openings 211e, 211f, 211g, and 211h. Locations of the openings 211e to 211h as viewed from the third direction A3 may correspond to locations of the electrodes 252, 254, 256, and 258, respectively, as illustrated in FIG. 16. The shape of the openings 211a to 211h as viewed from the third direction A3 is a circular shape. However, the shape of the openings 211a to 211h may be any shape.

The insulating layer 212 is electrically insulating. The insulating layer 212 may be flexible. The material of the insulating layer 212 may be the same as the material of the insulating layer 12 such as illustrated in FIG. 2. The shape of the insulating layer 212 as viewed from the third direction A3 is a quadrilateral shape such as a rectangular shape. However, the shape of the insulating layer 212 as viewed from the third direction A3 may be any shape such as a circular sector shape. The insulating layer 212 may be parallel to a plane including the first direction A1 and the second direction A2.

The insulating layer 212 has a front surface 212A and a rear surface 212B. The front surface 212A and the rear surface 212B are opposite to each other. The front surface 212A is a surface that faces in the third direction A3 among surfaces of the insulating layer 212. The front surface 212A may correspond to the front surface 210A of the sheet substrate 210. The rear surface 212B is a surface that faces in an opposite direction to the third direction A3 among surfaces of the insulating layer 212.

As illustrated in FIG. 17, the insulating layer 212 includes openings 212a, 212b, 212c, and 212d. Locations of the openings 212a to 212d as viewed from the third direction A3 may correspond to locations of the electrodes 241, 243, 245, and 247, respectively, as illustrated in FIG. 16. As illustrated in FIG. 18, the insulating layer 212 includes openings 212e, 212f, 212g, and 212h. Locations of the openings 212e to 212h as viewed from the third direction A3 may correspond to locations of the first electrode 251 and the electrodes 253, 255, and 257, respectively, as illustrated in FIG. 16. The shape of the openings 212a to 212h as viewed from the third direction A3 is a circular shape. However, the shape of the openings 212a to 212h may be any shape.

The thermoelectric conversion elements 221 to 228 are all p-type thermoelectric conversion elements. In other words, among thermoelectric conversion elements 220 located at both the front surface 210A and the rear surface 210B of the sheet substrate 210 as described further below, thermoelectric conversion elements 220 that are located at a side corresponding to the front surface 210A and thermoelectric conversion elements 220 that are located at a side corresponding to the rear surface 210B are all p-type thermoelectric conversion elements. However, all of the thermoelectric conversion elements 221 to 228 may alternatively be n-type thermoelectric conversion elements. The thermoelectric conversion material for forming the thermoelectric conversion elements 220 can be any of the thermoelectric conversion materials previously described in the first embodiment without any specific limitations. Depending on the thermoelectric conversion material forming a thermoelectric conversion element 220, durability may be higher for one of a p-type thermoelectric conversion element and an n-type thermoelectric conversion element than for the other thereof. Through the plurality of thermoelectric conversion elements 220 included in the thermoelectric conversion module 201 all being p-type thermoelectric conversion elements or all being n-type thermoelectric conversion elements, the thermoelectric conversion module 201 can have excellent durability.

The thermoelectric conversion elements 221 to 228 may all contain CNTs in the same manner as previously described in the first embodiment. Oxidation of the thermoelectric conversion elements 220 through oxygen, moisture, or the like in the atmosphere may act as a major cause of deterioration of characteristics of the thermoelectric conversion elements 220 in a case in which the thermoelectric conversion material is an organic material. In this case, p-type thermoelectric conversion elements can have higher durability than n-type thermoelectric conversion elements because n-type thermoelectric conversion elements are more easily affected by oxidation through oxygen, moisture, or the like in the atmosphere than p-type thermoelectric conversion elements. In a case in which the thermoelectric conversion material is an organic material, for example, the thermoelectric conversion module 201 can be provided with excellent durability through the plurality of thermoelectric conversion elements 220 included in the thermoelectric conversion module 201 all being p-type thermoelectric conversion elements.

The thermoelectric conversion elements 220 extend along the first direction A1. The shape of the thermoelectric conversion elements 220 as viewed from the third direction A3 is an elongated shape such as a rectangular shape. However, the shape of the thermoelectric conversion elements 220 as viewed from the third direction A3 may be any shape such as a circular sector shape. A lengthwise direction of the thermoelectric conversion elements 220 is along the first direction A1. The lengthwise direction of the thermoelectric conversion elements 220 may be parallel to the first direction A1. The thermoelectric conversion elements 221 to 228 may each have the same shape.

The thermoelectric conversion elements 220 each have a first end 220H and a second end 220L in the first direction A1 in the same manner as the thermoelectric conversion elements 20 such as illustrated in FIG. 1. The first end 220H is located toward the first edge 201H of the thermoelectric conversion module 201. The second end 220L is located toward the second edge 201L of the thermoelectric conversion module 201. Note that the first ends 220H of the thermoelectric conversion elements 221 to 228 are also referred to as "first end 221H", "first end 222H", "first end 223H", "first end 224H", "first end 225H", "first end 226H", "first end 227H", and "first end 228H", respectively. Moreover, the second ends 220L of the thermoelectric conversion elements 221 to 228 are also referred to as "second end 221L", "second end 222L", "second end 223L", "second end 224L", "second end 225L", "second end 226L", "second end 227L", and "second end 228L", respectively. Note that in the configuration illustrated in FIG. 16, the first ends 221H to 228H have different locations in the first direction A1. However, the locations of the first ends 221H to 228H in the first direction A1 may be the same. Also note that in the configuration illustrated in FIG. 16, the second ends 221L to 228L have different locations in the first direction A1. However, the locations of the second ends 221L to 228L in the first direction A1 may be the same.

The thermoelectric conversion elements 220 can generate electricity as a result of a temperature difference arising between the first ends 220H and the second ends 220L in the same manner as the thermoelectric conversion elements 20 illustrated in FIG. 1.

The plurality of thermoelectric conversion elements 220, in order from the thermoelectric conversion element 221 to the thermoelectric conversion element 228, are electrically connected in series from the first electrode 251 to the second electrode 248 through the subsequently described connector 230. As a result of the plurality of thermoelectric conversion elements 220 being electrically connected in series in this manner, it is possible for a single current path to form in the thermoelectric conversion module 201 as illustrated in FIG. 20 when the plurality of thermoelectric conversion elements 220 generate electricity. In FIG. 20, currents 1221, 1222, 1223, 1224, 1225, 1226, 1227, and 1228 are currents that flow in the thermoelectric conversion elements 221, 222, 223, 224, 225, 226, 227, and 228, respectively. Moreover, currents 1281, 1282, 1283, 1284, 1285, 1286, and 1287 are currents that flow in the subsequently described wires 281 to 287, respectively.

Odd-numbered thermoelectric conversion elements 220 among the plurality of thermoelectric conversion elements 220 that are electrically connected in series through the connector 230, as counted from the first electrode 251, are located at a side corresponding to the front surface 210A of the sheet substrate 210. In the present embodiment, the odd-numbered thermoelectric conversion elements 220 as counted from the first electrode 251 are a No. 1 thermoelectric conversion element 221, a No. 3 thermoelectric conversion element 223, a No. 5 thermoelectric conversion element 225, and a No. 7 thermoelectric conversion element 227. In other words, the thermoelectric conversion elements 221, 223, 225, and 227 are located at a side corresponding to the front surface 210A of the sheet substrate 210 (for example, a side corresponding to the front surface 212A of the insulating layer 212). The thermoelectric conversion elements 221, 223, 225, and 227 are lined up along the second direction A2 at the front surface 210A. The thermoelectric conversion elements 221, 223, 225, and 227 may be lined up along the second direction A2 with gaps therebetween. The width of these gaps may be any width so long as it is possible to ensure electrical insulation between two thermoelectric conversion elements 220 that are adjacent to each other in the second direction A2.

Even-numbered thermoelectric conversion elements 220 among the plurality of thermoelectric conversion elements 220 that are electrically connected in series through the connector 230, as counted from the first electrode 251, are located at a side corresponding to the rear surface 210B of the sheet substrate 210. In the present embodiment, the even-numbered thermoelectric conversion elements 220 as counted from the first electrode 251 are a No. 2 thermoelectric conversion element 222, a No. 4 thermoelectric conversion element 224, a No. 6 thermoelectric conversion element 226, and a No. 8 thermoelectric conversion element 228. In other words, the thermoelectric conversion elements 222, 224, 226, and 228 are located at a side corresponding to the rear surface 210B of the sheet substrate 210 (for example, a side corresponding to the rear surface 211B of the substrate 211). The thermoelectric conversion elements 222, 224, 226, and 228 are lined up along the second direction A2 at the rear surface 210B. The thermoelectric conversion elements 222, 224, 226, and 228 may be lined up along the second direction A2 with gaps therebetween. The width of these gaps may be any width so long as it is possible to ensure electrical insulation between two thermoelectric conversion elements 220 that are adjacent to each other in the second direction A2.

As a result of thermoelectric conversion elements 220 being located at both the front surface 210A and the rear surface 210B of the sheet substrate 210 in this manner, the thermoelectric conversion module 201 can increase generated electrical power while also having reduced size in the same manner as in the first embodiment.

At least one part of the thermoelectric conversion elements 220 located at the side corresponding to the front surface 210A of the sheet substrate 210 may overlap with at least one part of the thermoelectric conversion elements 220 located at the side corresponding to the rear surface 210B of the sheet substrate 210 in plan view of the sheet substrate 210 as illustrated in FIG. 16 (i.e., as viewed from the third direction A3). A configuration such as set forth above enables compactization of the thermoelectric conversion module 201. However, it may be the case that the thermoelectric conversion elements 220 located at the side corresponding to the front surface 210A of the sheet substrate 210 do not overlap with the thermoelectric conversion elements 220 located at the side corresponding to the rear surface 210B as viewed from the third direction A3.

The thermoelectric conversion elements 221 to 228 may all have rectangular shapes of roughly the same dimensions in the same manner as previously described in the first embodiment. However, the thermoelectric conversion elements 221 to 228 may have any shape such as a circular sector shape so long as the thermoelectric conversion elements 221 to 228 all have shapes that are of roughly the same dimensions in the same manner as previously described in the first embodiment.

Respective lengths of the thermoelectric conversion elements 221 to 228 along the first direction A1, respective widths of the thermoelectric conversion elements 221 to 228 along the second direction A2, and respective thicknesses of the thermoelectric conversion elements 221 to 228 in the third direction A3 may be adjusted such that respective electrical resistance values of the thermoelectric conversion elements 221 to 228 are roughly the same in the same manner as previously described in the first embodiment.

The connector 230 electrically connects the plurality of thermoelectric conversion elements 220 in series at an end of each thermoelectric conversion element 220 (i.e., at the first end 220H or the second end 220L) from the first electrode 251 to the second electrode 248. In the present embodiment, the connector 230 electrically connects the plurality of thermoelectric conversion elements 220 in series from the first electrode 251 to the second electrode 248, in order from the thermoelectric conversion element 221 to the thermoelectric conversion element 228. As previously described, the connector 230 includes electrodes 241 to 247, electrodes 252 to 258, first joining members 261 to 268, second joining members 271 to 278, and wires 281 to 287.

The electrodes 240 are electrically conductive. The electrically conductive material for forming the electrodes 240 may be any metal such as copper or aluminum without any specific limitations.

The electrodes 240 may be located in the sheet substrate 210 (for example, at the front surface 211A of the substrate 211). The electrodes 241 to 247 and the second electrode 248 may be lined up along the second direction A2 with gaps therebetween as illustrated in FIG. 16. The width of these gaps may be any width so long as it is possible to ensure electrical insulation between two electrodes 240 that are adjacent to each other in the second direction A2. Locations of the electrodes 240 in the second direction A2 may be set as appropriate depending on locations of the thermoelectric conversion elements 220 in the second direction A2.

The electrode 241 is electrically connected to the first end 221H of the thermoelectric conversion element 221 that is located at the side corresponding to the front surface 210A of the sheet substrate 210. For example, as illustrated in FIG. 17, at least one part of the electrode 241 is exposed from the opening 212a in the insulating layer 212. The at least one part of the electrode 241 that is exposed from the opening 212a is electrically connected to the first end 221H of the thermoelectric conversion element 221 through the first joining member 261.

The electrode 242 is electrically connected to the first end 222H of the thermoelectric conversion element 222 that is located at the side corresponding to the rear surface 210B of the sheet substrate 210. For example, as illustrated in FIG. 17, at least one part of the electrode 242 is exposed from the opening 211a in the substrate 211. The at least one part of the electrode 242 that is exposed from the opening 211a is electrically connected to the first end 222H of the thermoelectric conversion element 222 through the first joining member 262.

The electrode 243 is electrically connected to the first end 223H of the thermoelectric conversion element 223 that is located at the side corresponding to the front surface 210A of the sheet substrate 210. For example, as illustrated in FIG. 17, at least one part of the electrode 243 is exposed from the opening 212b in the insulating layer 212. The at least one part of the electrode 243 that is exposed from the opening 212b is electrically connected to the first end 223H of the thermoelectric conversion element 223 through the first joining member 263.

The electrode 244 is electrically connected to the first end 224H of the thermoelectric conversion element 224 that is located at the side corresponding to the rear surface 210B of the sheet substrate 210. For example, as illustrated in FIG. 17, at least one part of the electrode 244 is exposed from the opening 211b in the substrate 211. The at least one part of the electrode 244 that is exposed from the opening 211b is electrically connected to the first end 224H of the thermoelectric conversion element 224 through the first joining member 264.

The electrode 245 is electrically connected to the first end 225H of the thermoelectric conversion element 225 that is located at the side corresponding to the front surface 210A of the sheet substrate 210. For example, as illustrated in FIG. 17, at least one part of the electrode 245 is exposed from the opening 212c in the insulating layer 212. The at least one part of the electrode 245 that is exposed from the opening 212c is electrically connected to the first end 225H of the thermoelectric conversion element 225 through the first joining member 265.

The electrode 246 is electrically connected to the first end 226H of the thermoelectric conversion element 226 that is located at the side corresponding to the rear surface 210B of the sheet substrate 210. For example, as illustrated in FIG. 17, at least one part of the electrode 246 is exposed from the opening 211c in the substrate 211. The at least one part of the electrode 246 that is exposed from the opening 211c is electrically connected to the first end 226H of the thermoelectric conversion element 226 through the first joining member 266.

The electrode 247 is electrically connected to the first end 227H of the thermoelectric conversion element 227 that is located at the side corresponding to the front surface 210A of the sheet substrate 210. For example, as illustrated in FIG. 17, at least one part of the electrode 247 is exposed from the opening 212d in the insulating layer 212. The at least one part of the electrode 247 that is exposed from the opening 212d is electrically connected to the first end 227H of the thermoelectric conversion element 227 through the first joining member 267.

The second electrode 248 may be electrically connected to a wire for extracting electrical power generated by the thermoelectric conversion module 201. The second electrode 248 functions as a positive electrode, for example. The second electrode 248 is electrically connected to an end constituting a positive electrode among two ends of the thermoelectric conversion elements 220 that are electrically connected in series. In the present embodiment, the second electrode 248 is electrically connected to the first end 228H of the thermoelectric conversion element 228 that is located at the side corresponding to the rear surface 210B of the sheet substrate 210. For example, as illustrated in FIG. 17, at least one part of the second electrode 248 is exposed from the opening 211*d* in the substrate 211. The at least one part of the second electrode 248 that is exposed from the opening 211*d* is electrically connected to the first end 228H of the thermoelectric conversion element 228 through the first joining member 268.

The electrodes 250 are electrically conductive. The electrically conductive material for forming the electrodes 250 may be any metal such as copper or aluminum without any specific limitations.

The electrodes 250 may be located in the sheet substrate 210 (for example, at the front surface 211A of the substrate 211). The first electrode 251 and the electrodes 252 to 258 may be lined up along the second direction A2 with gaps therebetween as illustrated in FIG. 16. The width of these gaps may be any width so long as it is possible to ensure electrical insulation between two electrodes 250 that are adjacent to each other in the second direction A2. Locations of the electrodes 250 in the second direction A2 may be set as appropriate depending on locations of the thermoelectric conversion elements 220 in the second direction A2.

The first electrode 251 may be electrically connected to a wire for extracting electrical power generated by the thermoelectric conversion module 201. The first electrode 251 functions as a negative electrode, for example. The first electrode 251 is electrically connected to an end constituting a negative electrode among two ends of the thermoelectric conversion elements 220 that are electrically connected in series. In the present embodiment, the first electrode 251 is electrically connected to the second end 221L of the thermoelectric conversion element 221 that is located at the side corresponding to the front surface 210A of the sheet substrate 210. For example, as illustrated in FIG. 18, at least one part of the first electrode 251 is exposed from the opening 212*e* in the insulating layer 212. The at least one part of the first electrode 251 that is exposed from the opening 212*e* is electrically connected to the second end 221L of the thermoelectric conversion element 221 through the second joining member 271.

The electrode 252 is electrically connected to the second end 222L of the thermoelectric conversion element 222 that is located at the side corresponding to the rear surface 210B of the sheet substrate 210. For example, as illustrated in FIG. 18, at least one part of the electrode 252 is exposed from the opening 211*e* in the substrate 211. The at least one part of the electrode 252 that is exposed from the opening 211*e* is electrically connected to the second end 222L of the thermoelectric conversion element 222 through the second joining member 272.

The electrode 253 is electrically connected to the second end 223L of the thermoelectric conversion element 223 that is located at the side corresponding to the front surface 210A of the sheet substrate 210. For example, as illustrated in FIG. 18, at least one part of the electrode 253 is exposed from the opening 212*f* in the insulating layer 212. The at least one part of the electrode 253 that is exposed from the opening 212*f* is electrically connected to the second end 223L of the thermoelectric conversion element 223 through the second joining member 273.

The electrode 254 is electrically connected to the second end 224L of the thermoelectric conversion element 224 that is located at the side corresponding to the rear surface 210B of the sheet substrate 210. For example, as illustrated in FIG. 18, at least one part of the electrode 254 is exposed from the opening 211*f* in the substrate 211. The at least one part of the electrode 254 that is exposed from the opening 211*f* is electrically connected to the second end 224L of the thermoelectric conversion element 224 through the second joining member 274.

The electrode 255 is electrically connected to the second end 225L of the thermoelectric conversion element 225 that is located at the side corresponding to the front surface 210A of the sheet substrate 210. For example, as illustrated in FIG. 18, at least one part of the electrode 255 is exposed from the opening 212*g* in the insulating layer 212. The at least one part of the electrode 255 that is exposed from the opening 212*g* is electrically connected to the second end 225L of the thermoelectric conversion element 225 through the second joining member 275.

The electrode 256 is electrically connected to the second end 226L of the thermoelectric conversion element 226 that is located at the side corresponding to the rear surface 210B of the sheet substrate 210. For example, as illustrated in FIG. 18, at least one part of the electrode 256 is exposed from the opening 211*g* in the substrate 211. The at least one part of the electrode 256 that is exposed from the opening 211*g* is electrically connected to the second end 226L of the thermoelectric conversion element 226 through the second joining member 276.

The electrode 257 is electrically connected to the second end 227L of the thermoelectric conversion element 227 that is located at the side corresponding to the front surface 210A of the sheet substrate 210. For example, as illustrated in FIG. 18, at least one part of the electrode 257 is exposed from the opening 212*h* in the insulating layer 212. The at least one part of the electrode 257 that is exposed from the opening 212*h* is electrically connected to the second end 227L of the thermoelectric conversion element 227 through the second joining member 277.

The electrode 258 is electrically connected to the second end 228L of the thermoelectric conversion element 228 that is located at the side corresponding to the rear surface 210B of the sheet substrate 210. For example, as illustrated in FIG. 18, at least one part of the electrode 258 is exposed from the opening 211*h* in the substrate 211. The at least one part of the electrode 258 that is exposed from the opening 211*h* is electrically connected to the second end 228L of the thermoelectric conversion element 228 through the second joining member 278.

The first joining members 260 are electrically conductive. The first joining members 260 may each be formed of any member such as silver paste or solder.

The first joining member 261 electrically connects the electrode 241 and the first end 221H of the thermoelectric conversion element 221. For example, as illustrated in FIG. 17, at least one part of the first joining member 261 is located in the opening 212*a* in the insulating layer 212. The first joining member 261 electrically connects the electrode 241 and the first end 221H of the thermoelectric conversion element 221 via the opening 212*a*. The first joining member 261 may extend from the opening 212*a* to the first end 221H as illustrated in FIG. 16.

The first joining 262 member electrically connects the electrode 242 and the first end 222H of the thermoelectric conversion element 222. For example, as illustrated in FIG. 17, at least one part of the first joining member 262 is located in the opening 211*a* in the substrate 211. The first joining member 262 electrically connects the electrode 242 and the first end 222H of the thermoelectric conversion element 222 via the opening 211*a*. The first joining member 262 may extend from the opening 211*a* to the first end 222H as illustrated in FIG. 16.

The first joining member 263 electrically connects the electrode 243 and the first end 223H of the thermoelectric conversion element 223. For example, as illustrated in FIG. 17, at least one part of the first joining member 263 is located in the opening 212b in the insulating layer 212. The first joining member 263 electrically connects the electrode 243 and the first end 223H of the thermoelectric conversion element 223 via the opening 212b. The first joining member 263 may extend from the opening 212a to the first end 223H as illustrated in FIG. 16.

The first joining member 264 electrically connects the electrode 244 and the first end 224H of the thermoelectric conversion element 224. For example, as illustrated in FIG. 17, at least one part of the first joining member 264 is located in the opening 211b in the substrate 211. The first joining member 264 electrically connects the electrode 244 and the first end 224H of the thermoelectric conversion element 224 via the opening 211b. The first joining member 264 may extend from the opening 211b to the first end 224H as illustrated in FIG. 16.

The first joining member 265 electrically connects the electrode 245 and the first end 225H of the thermoelectric conversion element 225. For example, as illustrated in FIG. 17, at least one part of the first joining member 265 is located in the opening 212c in the insulating layer 212. The first joining member 265 electrically connects the electrode 245 and the first end 225H of the thermoelectric conversion element 225 via the opening 212c. The first joining member 265 may extend from the opening 212c to the first end 225H as illustrated in FIG. 16.

The first joining member 266 electrically connects the electrode 246 and the first end 226H of the thermoelectric conversion element 226. For example, as illustrated in FIG. 17, at least one part of the first joining member 266 is located in the opening 211c in the substrate 211. The first joining member 266 electrically connects the first end 226H of the thermoelectric conversion element 226 and the electrode 246 via the opening 211c. The first joining member 266 may extend from the opening 211c to the first end 226H as illustrated in FIG. 16.

The first joining member 267 electrically connects the electrode 247 and the first end 227H of the thermoelectric conversion element 227. For example, as illustrated in FIG. 17, at least one part of the first joining member 267 is located in the opening 212d in the insulating layer 212. The first joining member 267 electrically connects the electrode 247 and the first end 227H of the thermoelectric conversion element 227 via the opening 212d. The first joining member 267 may extend from the opening 212d to the first end 227H as illustrated in FIG. 16.

The first joining member 268 electrically connects the second electrode 248 and the first end 228H of the thermoelectric conversion element 228. For example, as illustrated in FIG. 17, at least one part of the first joining member 268 is located in the opening 211d in the substrate 211. The first joining member 268 electrically connects the second electrode 248 and the first end 228H of the thermoelectric conversion element 228 via the opening 211d. The first joining member 268 may extend from the opening 211d to the first end 228H as illustrated in FIG. 16.

The second joining members 270 are electrically conductive. The second joining members 270 may each be formed of any member such as silver paste or solder.

The second joining member 271 connects the first electrode 251 and the second end 221L of the thermoelectric conversion element 221. For example, as illustrated in FIG. 18, at least one part of the second joining member 271 is located in the opening 212e in the insulating layer 212. The second joining member 271 may electrically connect the first electrode 251 and the second end 221L of the thermoelectric conversion element 221 via the opening 212e. The second joining member 271 may extend from the opening 212e to the second end 221L as illustrated in FIG. 16.

The second joining member 272 electrically connects the electrode 252 and the second end 222L of the thermoelectric conversion element 222. For example, as illustrated in FIG. 18, at least one part of the second joining member 272 is located in the opening 211e in the substrate 211. The second joining member 272 electrically connects the electrode 252 and the second end 222L of the thermoelectric conversion element 222 via the opening 211e. The second joining member 272 may extend from the opening 211e to the second end 222L as illustrated in FIG. 16.

The second joining member 273 electrically connects the electrode 253 and the second end 223L of the thermoelectric conversion element 223. For example, as illustrated in FIG. 18, at least one part of the second joining member 273 is located in the opening 212f in the insulating layer 212. The second joining member 273 electrically connects the electrode 253 and the second end 223L of the thermoelectric conversion element 223 via the opening 212f. The second joining member 273 may extend from the opening 212f to the second end 223L as illustrated in FIG. 16.

The second joining member 274 electrically connects the electrode 254 and the second end 224L of the thermoelectric conversion element 224. For example, as illustrated in FIG. 18, at least one part of the second joining member 274 is located in the opening 211f in the substrate 211. The second joining member 274 electrically connects the electrode 254 and the second end 224L of the thermoelectric conversion element 224 via the opening 211f. The second joining member 274 may extend from the opening 211f to the second end 224L as illustrated in FIG. 16.

The second joining member 275 electrically connects the electrode 255 and the second end 225L of the thermoelectric conversion element 225. For example, as illustrated in FIG. 18, at least one part of the second joining member 275 is located in the opening 212g in the insulating layer 212. The second joining member 275 electrically connects the electrode 255 and the second end 225L of the thermoelectric conversion element 225 via the opening 212g. The second joining member 275 may extend from the opening 212g to the second end 225L as illustrated in FIG. 16.

The second joining member 276 electrically connects the electrode 256 and the second end 226L of the thermoelectric conversion element 226. For example, as illustrated in FIG. 18, at least one part of the second joining member 276 is located in the opening 211g in the substrate 211. The second joining member 276 electrically connects the second end 226L of the thermoelectric conversion element 226 and the electrode 256 via the opening 211g. The second joining member 276 may extend from the opening 211g to the second end 226L as illustrated in FIG. 16.

The second joining member 277 electrically connects the electrode 257 and the second end 227L of the thermoelectric conversion element 227. For example, as illustrated in FIG. 18, at least one part of the second joining member 277 is located in the opening 212h in the insulating layer 212. The second joining member 277 electrically connects the second end 227L of the thermoelectric conversion element 227 and the electrode 257 via the opening 212h. The second joining member 277 may extend from the opening 212h to the second end 227L as illustrated in FIG. 16.

The second joining member 278 electrically connects the electrode 258 and the second end 228L of the thermoelectric conversion element 228. For example, as illustrated in FIG. 18, at least one part of the second joining member 278 is located in the opening 211h in the substrate 211. The second joining member 278 electrically connects the electrode 258 and the second end 228L of the thermoelectric conversion element 228 via the opening 211h. The second joining member 278 may extend from the opening 211h to the second end 228L as illustrated in FIG. 16.

The wires 280 are electrically conductive. The electrically conductive material for forming the wires 280 may be any metal such as copper or aluminum without any specific limitations.

The wires 280 may be located in the sheet substrate 210. The wires 280 may be located at the front surface 211A of the substrate 211 together with the electrodes 240 and the electrodes 250 as illustrated in FIG. 19. As described further below, the wires 280 may be formed as an electrode layer 234 together with the electrodes 240 and the electrodes 250.

The wires 280 electrically connect, in series, thermoelectric conversion elements 220 that are adjacent to each other in the second direction A2 at both ends of the thermoelectric conversion elements 220 (i.e., at first ends 220H and second ends 220L). For two thermoelectric conversion elements 220 that are adjacent to each other in the second direction A2, a wire 280 electrically connects an electrode 240 that is electrically connected to the first end 220H of one of these thermoelectric conversion elements 220 and an electrode 250 that is electrically connected to the second end 220L of the other of these thermoelectric conversion elements 220. The wire 280 may extend in a linear shape from that electrode 240 to that electrode 250.

As a result of the plurality of wires 280 electrically connecting the plurality of electrodes 240 and the plurality of electrodes 250, the plurality of wires 280 electrically connect the thermoelectric conversion elements 221 to 228 in series between the first electrode 251 and the second electrode 248.

For example, as illustrated in FIG. 19, one end of the wire 281 is electrically connected to the electrode 241. The other end of the wire 281 is electrically connected to the electrode 252. One end of the wire 282 is electrically connected to the electrode 242. The other end of the wire 282 is electrically connected to the electrode 253. One end of the wire 283 is electrically connected to the electrode 243. The other end of the wire 283 is electrically connected to the electrode 254. One end of the wire 284 is electrically connected to the electrode 244. The other end of the wire 284 is electrically connected to the electrode 255. One end of the wire 285 is electrically connected to the electrode 245. The other end of the wire 285 is electrically connected to the electrode 256. One end of the wire 286 is electrically connected to the electrode 246. The other end of the wire 286 is electrically connected to the electrode 257. One end of the wire 287 is electrically connected to the electrode 247. The other end of the wire 287 is electrically connected to the electrode 258.

Other configurations and effects of the thermoelectric conversion module 201 according to the second embodiment are the same as for the thermoelectric conversion module 1 according to the first embodiment.

(Method of Producing Thermoelectric Conversion Module)

A method of producing the thermoelectric conversion module 201 may include the same steps as the production method of the thermoelectric conversion module 1 according to the first embodiment. The method of producing the thermoelectric conversion module 201 may include an arrangement step S10, formation steps S11, S12, S13, S14, S15, and S16, and a connection step S17 such as illustrated in FIG. 8. Accordingly, the method of producing the thermoelectric conversion module 201 is described below with reference to the flowchart illustrated in FIG. 8. However, the method by which the thermoelectric conversion module 201 is produced is not limited to the production method described below.

<Arrangement Step S10>

The arrangement step S10 is a step of arranging metal foil on a substrate 211 in the same manner as the configuration illustrated in FIG. 9. The metal foil may be arranged at a front surface 211A of the substrate 211. The metal foil may the same as the metal foil 33 such as illustrated in FIG. 9. This metal foil may be adhered to the front surface 211A of the substrate 211 through any adhesive having thermal conductivity. The metal foil may be formed on the front surface 211A of the substrate 211 by any film formation method such as vapor deposition, sputtering, or plating in the same manner as previously described in the first embodiment. The metal foil can constitute electrodes 240, electrodes 250, and wires 280 after undergoing the formation step S11 and the like described below.

<Formation Step S11>

The formation step S11 (electrode layer formation step) is a step of forming an electrode layer 234 such as illustrated in FIG. 19 through patterning of the metal foil that has been arranged on the substrate 211. Commonly known photolithography or the like may be used in the patterning of the metal foil. The electrode layer 234 includes electrodes 240, electrodes 250, and wires 280. In the present embodiment, the electrode layer 234 is only formed at the front surface 211A of the substrate 211. However, the electrode layer 234 may be formed at either or both of the front surface 211A and a rear surface 211B of the substrate 211.

<Formation Step S12>

The formation step S12 is a step of forming openings 211a, 211b, 211c, and 211d in the substrate 211 such as illustrated in FIG. 17 and forming openings 211e, 211f, 211g, and 211h in the substrate 211 such as illustrated in FIG. 18. The openings 211a to 211h may be formed using any laser.

<Formation step S13>

The formation step S13 (insulating layer formation step) is a step of forming an insulating layer 212 on the electrode layer 234 formed on the substrate 211 such as illustrated in FIG. 19. The insulating layer 212 may be formed on the substrate 211 and the electrode layer 234. The insulating layer 212 may be formed by applying an electrically insulating material onto the electrode layer 234 in the formation step S13. A sheet substrate 210 has a configuration including the substrate 211 and the insulating layer 212.

<Formation Step S14>

The formation step S14 is a step of forming openings 212a, 212b, 212c, and 212d in the insulating layer 212 such as illustrated in FIG. 17 and forming openings 212e, 212f, 212g, and 212h in the insulating layer 212 such as illustrated in FIG. 18. The openings 212a to 212h may be formed using any laser.

<Formation Step S15>

Figure 21:
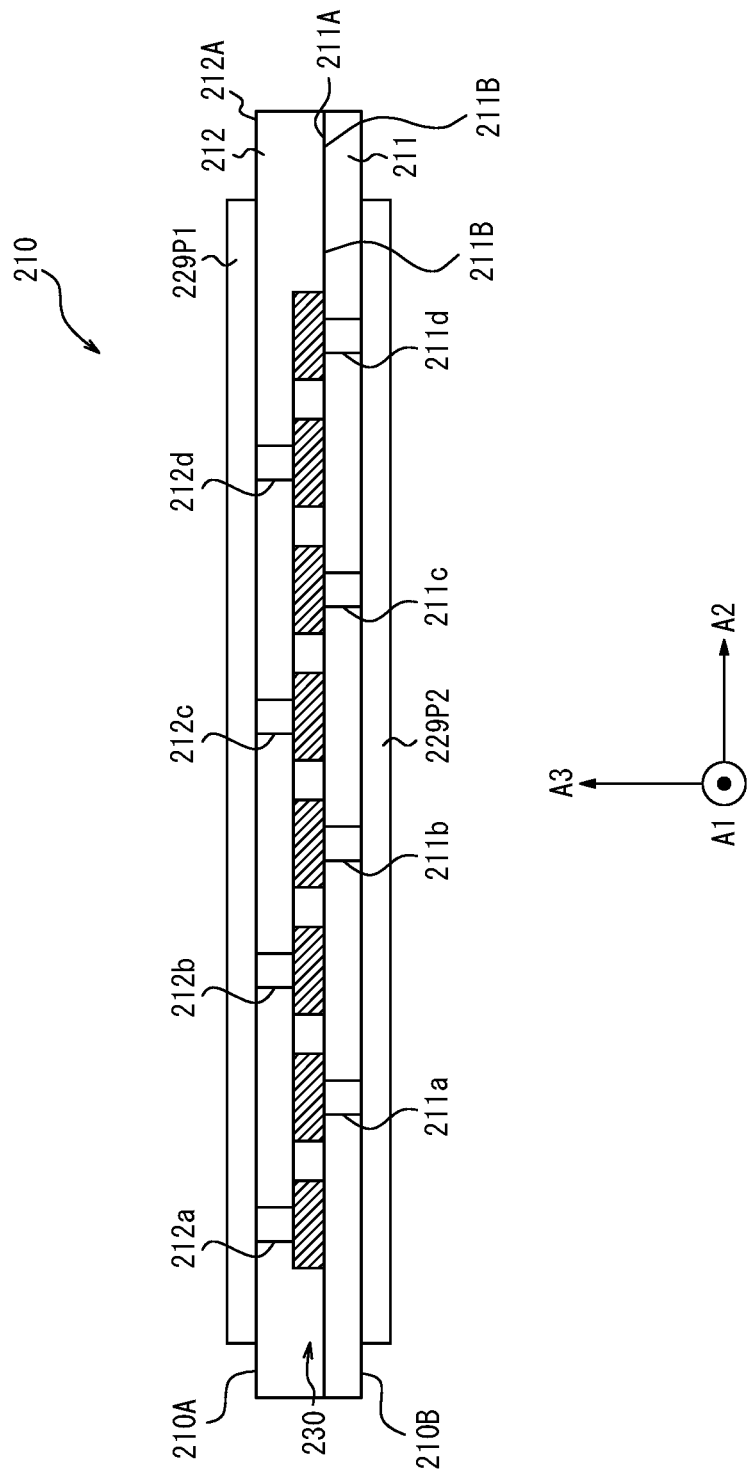
FIG. 21 illustrates configuration after arrangement of carbon nanotube sheets.

The formation step S15 (element formation step) is a step of forming a thermoelectric conversion element layer on the insulating layer 212 and on a surface of the substrate 211 where the electrode layer 234 is not formed. The formation step S15 may be a step of forming a thermoelectric conversion element layer at each of a front surface 210A and a rear surface 210B of the sheet substrate 210. The thermoelectric conversion element layer is a layer that contains CNTs as previously described. In the present embodiment, the thermoelectric conversion element layer is taken to be a CNT sheet 229P1 and a CNT sheet 229P2 such as illustrated in FIG. 21. The CNT sheets 229P1 and 229P2 contain CNTs in the same manner as the CNT sheet 29P and the CNT sheet 29N such as illustrated in FIG. 14. In the present embodiment, the formation step S15 is a step of arranging the CNT sheet 229P1 at the front surface 210A of the sheet substrate 210 (for example, at a front surface 212A of the insulating layer 212) and arranging the CNT sheet 229P2 at the rear surface 210B of the sheet substrate 210 (for example, at a rear surface 211B of the substrate 211).

The CNT sheets 229P1 and 229P2 are p-type CNT sheets. The CNT sheet 229P1 and the CNT sheet 229P2 may be adhered to the front surface 210A and the rear surface 210B, respectively, of the sheet substrate 210 through any adhesive sheet such as epoxy resin. The CNT sheet 229P1 can constitute thermoelectric conversion elements 221, 223, 225, and 227 after undergoing the formation step S16 described below. The CNT sheet 229P2 can constitute thermoelectric conversion elements 222, 224, 226, and 228 after undergoing the formation step S16 described below.

The CNT sheets 229P1 and 229P2 may be the same as those previously described in the first embodiment.

Other configurations and effects of the formation step S15 according to the second embodiment are the same as for the formation step S15 according to the first embodiment.

<Formation Step S16>

The formation step S16 (thermoelectric conversion element formation step) is a step of cutting the thermoelectric conversion element layer (i.e., the CNT sheet 229P1 and the CNT sheet 229P2) along the first direction A1 to form a plurality of thermoelectric conversion elements 220 lined up along the second direction A2. By cutting each of the CNT sheets 229P1 and 229P2 along the first direction A1, gaps each partitioning two thermoelectric conversion elements 220 that are adjacent to each other in the second direction A2 are formed in the same manner as previously described in the first embodiment.

The formation step S16 may be performed using a laser in the same manner as the formation step S16 described in the first embodiment. A UV laser, a nanosecond laser, or a femtosecond laser may be used in the formation step S16 in the same manner as previously described in the first embodiment.

Other configurations and effects of the formation step S16 according to the second embodiment are the same as for the formation step S16 according to the first embodiment.

<Connection Step S17>

The connection step S17 is a step of electrically connecting an end of each of the thermoelectric conversion elements 220 (i.e., a first end 220H or a second end 220L) through the connector 230 such that the plurality of thermoelectric conversion elements 220 are all electrically connected in series.

The connection step S17 according to the present embodiment is a step of applying silver paste.

In the connection step S17, silver paste is applied along the first direction A1 from the openings 212a to 212d in the insulating layer 212, such as illustrated in FIG. 16, up to a first end 221H of a thermoelectric conversion element 221, a first end 223H of a thermoelectric conversion element 223, a first end 225H of a thermoelectric conversion element 225, and a first end 227H of a thermoelectric conversion element 227, respectively. Some of this silver paste is filled into the openings 212a to 212d and is electrically connected to the electrodes 241, 243, 245, and 247. This silver paste can constitute first joining members 261, 263, 265, and 267 after drying.

In the connection step S17, silver paste is applied along the first direction A1 from the openings 211a to 211d in the substrate 211, such as illustrated in FIG. 16, up to a first end 222H of a thermoelectric conversion element 222, a first end 224H of a thermoelectric conversion element 224, a first end 226H of a thermoelectric conversion element 226, and a first end 228H of a thermoelectric conversion element 228, respectively. Some of this silver paste is filled into the openings 211a to 211d and is electrically connected to the electrodes 242, 244, and 246 and the second electrode 248. This silver paste can constitute first joining members 262, 264, 266, and 268 after drying.

In the connection step S17, silver paste is applied along the first direction A1 from the openings 212e to 212h in the insulating layer 212, such as illustrated in FIG. 16, up to a second end 221L of the thermoelectric conversion element 221, a second end 223L of the thermoelectric conversion element 223, a second end 225L of the thermoelectric conversion element 225, and a second end 227L of the thermoelectric conversion element 227, respectively. Some of this silver paste is filled into the openings 212e to 212h and is electrically connected to the first electrode 251 and the electrodes 253, 255, and 257. This silver paste can constitute second joining members 271, 273, 275, and 277 after drying.

In the connection step S17, silver paste is applied along the first direction A1 from the openings 211e to 211h in the substrate 211, such as illustrated in FIG. 16, up to a second end 222L of the thermoelectric conversion element 222, a second end 224L of the thermoelectric conversion element 224, a second end 226L of the thermoelectric conversion element 226, and a second end 228L of the thermoelectric conversion element 228, respectively. Some of this silver paste is filled into the openings 211e to 211h and is electrically connected to the electrodes 252, 254, 256, and 258. This silver paste can constitute second joining members 272, 274, 276, and 278 after drying.

Other configurations and effects of the method of producing the thermoelectric conversion module 201 according to the second embodiment are the same as for the method of producing the thermoelectric conversion module 1 according to the first embodiment.

THIRD EMBODIMENT

Figure 22:
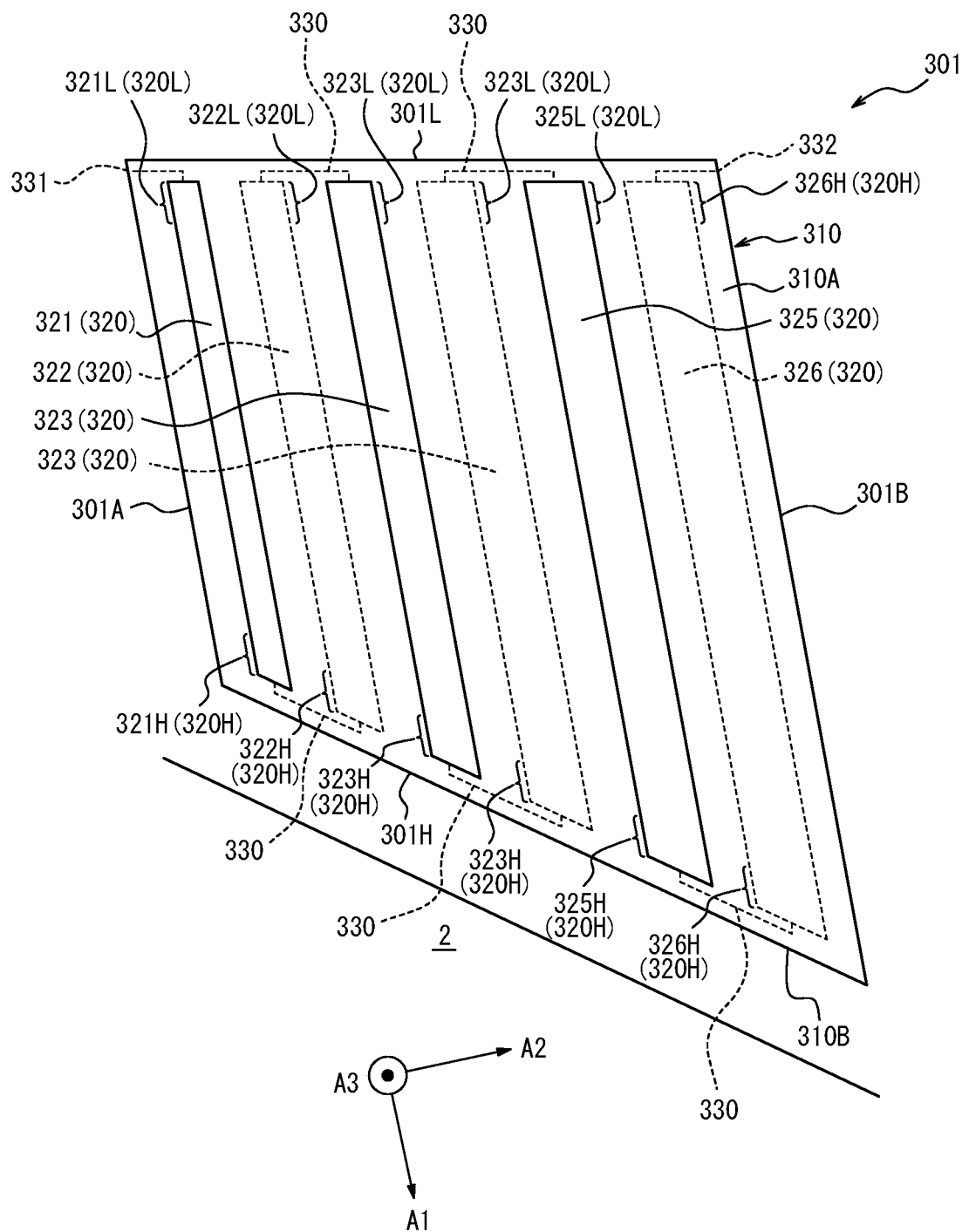
FIG. 22 is an external view of a thermoelectric conversion module according to a third embodiment of the present disclosure.

FIG. 22 is an external view of a thermoelectric conversion module 301 according to a third embodiment of the present disclosure. The thermoelectric conversion module 301 can be arranged at a heat source 2 in the same manner as in the first embodiment. The thermoelectric conversion module 301 has a first edge 301H and a second edge 301L on a sheet substrate 310, which is described further below. The first edge 301H and the second edge 301L are opposite to each other. The first edge 301H can be located close to the heat source 2 when the thermoelectric conversion module 301 is arranged at the heat source 2. The second edge 301L can be located far from the heat source 2 when the thermoelectric conversion module 301 is arranged at the heat source 2.

The temperature around the first edge 301H can be higher than the temperature around the second edge 301L in the same manner as for the first edge 1H such as illustrated in FIG. 1. In other words, the temperature around the second edge 301L can be lower than the temperature around the first edge 301H.

The first direction A1, the second direction A2, and the third direction A3 can be adopted in the third embodiment in the same manner as in the first embodiment. In the third embodiment, the first direction A1 is a direction in which the first edge 301H and the second edge 301L are opposite to each other. In the present embodiment, the first direction A1 is defined as a direction that is toward the first edge 301H from the second edge 301L and that is orthogonal to the second edge 301L. Moreover, in the present embodiment, the second direction A2 is defined as a direction toward the right side of the page from the left side of the page in FIG. 22. Furthermore, in the present embodiment, the third direction A3 is defined as a direction toward the foreground of the page from the background of the page in FIG. 22.

The shape of the thermoelectric conversion module 301 as viewed from the third direction A3 is a trapezoidal shape. The thermoelectric conversion module 301 has a side 301A and a side 301B on the subsequently described sheet substrate 310. The side 301A and the side 301B are parallel. The side 301A and the side 301B correspond to two bases of the trapezoid. The first edge 301H corresponds to one leg among two legs of the trapezoid. The second edge 301L corresponds to the other leg among the two legs of the trapezoid. The distance between the first edge 301H and the second edge 301L in the first direction A1 increases along the second direction A2.

The thermoelectric conversion module 301 includes the sheet substrate 310, thermoelectric conversion elements 321, 322, 323, 324, 325, and 326, a connector 330, a first electrode 331, and a second electrode 332.

In the following description, the thermoelectric conversion elements 321 to 326 are also referred to collectively as "thermoelectric conversion elements 320" when no specific distinction is made therebetween. FIG. 22 illustrates a thermoelectric conversion module 301 that includes 6 thermoelectric conversion elements 320. However, the number of thermoelectric conversion elements 320 included in the thermoelectric conversion module 301 may be any number.

The sheet substrate 310 is electrically insulating. The sheet substrate 310 may be flexible. The shape of the sheet substrate 310 as viewed from the third direction A3 is a trapezoidal shape. The sheet substrate 310 has the first edge 301H described above, the second edge 301L described above, the side 301A described above, and the side 301B described above.

The sheet substrate 310 has a front surface 310A and a rear surface 310B. The front surface 310A and the rear surface 310B are opposite to each other. The front surface 310A is a surface that faces in the third direction A3 among surfaces of the sheet substrate 310. The rear surface 310B is a surface that faces in an opposite direction to the third direction A3 among surfaces of the sheet substrate 310.

The sheet substrate 310 may include a substrate that is the same as the substrate 11 and an insulating layer that is the same as the insulating layer 12 in the same manner as the sheet substrate 10 such as illustrated in FIG. 2.

The connector 330 electrically connects the plurality of thermoelectric conversion elements 320 from the first electrode 331 to the second electrode 332, in order from the thermoelectric conversion element 321 to the thermoelectric conversion element 326, in the same manner as the connector 30 such as illustrated in FIG. 1. The connector 330 may include electrodes that are the same as the electrodes 40 such as illustrated in FIG. 1, electrodes that are the same as the electrodes 50 such as illustrated in FIG. 1, joining members that are the same as the first joining members 60 such as illustrated in FIG. 1, and joining members that are the same as the second joining members 70 such as illustrated in FIG. 1.

The thermoelectric conversion elements 320 are p-type thermoelectric conversion elements or are n-type thermoelectric conversion elements. The thermoelectric conversion material for forming the thermoelectric conversion elements 320 can be any of the thermoelectric conversion materials previously described in the first embodiment without any specific limitations. The thermoelectric conversion elements 321 to 326 may all contain CNTs in the same manner as previously described in the first embodiment.

The thermoelectric conversion elements 320 extend along the first direction A1. The shape of the thermoelectric conversion elements 320 as viewed from the third direction A3 is an elongated shape such as a rectangular shape. However, the shape of the thermoelectric conversion elements 320 as viewed from the third direction A3 may be any shape such as a circular sector shape. A lengthwise direction of the thermoelectric conversion elements 320 is along the first direction A1. The lengthwise direction of the thermoelectric conversion elements 320 may be parallel to the first direction A1. The thicknesses of the thermoelectric conversion elements 320 in the third direction A3 may be roughly the same or may be different. In the following description, the thicknesses of the thermoelectric conversion elements 321 to 326 in the third direction A3 are taken to be roughly the same.

The thermoelectric conversion elements 320 each have a first end 320H and a second end 320L in the first direction A1. The first end 320H is located toward the first edge 301H of the thermoelectric conversion module 301. The second end 320L is located toward the second edge 301L of the thermoelectric conversion module 301. Note that the first ends 320H of the thermoelectric conversion elements 321, 322, 323, 324, 325, and 326 are also referred to as "first end 321H", "first end 322H", "first end 323H", "first end 324H", "first end 325H", and "first end 326H", respectively. Moreover, the second ends 320L of the thermoelectric conversion elements 321, 322, 323, 324, 325, and 326 are also referred to as "second end 321L", "second end 322L", "second end 323L", "second end 324L", "second end 325L", and "second end 326L", respectively.

Odd-numbered thermoelectric conversion elements 320 among the plurality of thermoelectric conversion elements 320 electrically connected in series through the connector 330, as counted from the first electrode 331, are located at a side corresponding to the front surface 310A of the sheet substrate 310. In the present embodiment, the odd-numbered thermoelectric conversion elements 320 as counted from the first electrode 331 are a No. 1 thermoelectric conversion element 321, a No. 3 thermoelectric conversion element 323, and a No. 5 thermoelectric conversion element 325. In other words, the thermoelectric conversion elements 321, 323, and 325 are located at the side corresponding to the front surface 310A of the sheet substrate 310. The thermoelectric conversion elements 321, 323, and 325 are lined up along the second direction A2 at the front surface 310A. The thermoelectric conversion elements 321, 323, and 325 may be lined up along the second direction A2 with gaps therebetween. The width of these gaps may be any width so long as it is possible to ensure electrical insulation between two thermoelectric conversion elements 320 that are adjacent to each other in the second direction A2.

Even-numbered thermoelectric conversion elements 320 among the plurality of thermoelectric conversion elements 320 electrically connected in series through the connector 330, as counted from the first electrode 331, are located at a side corresponding to the rear surface 310B of the sheet substrate 310. In the present embodiment, the even-numbered thermoelectric conversion elements 320 as counted from the first electrode 331 are a No. 2 thermoelectric conversion element 322, a No. 4 thermoelectric conversion element 324, and a No. 6 thermoelectric conversion element 326. In other words, the thermoelectric conversion elements 322, 324, and 326 are located at the side corresponding to the rear surface 310B of the sheet substrate 310. The thermoelectric conversion elements 322, 324, and 326 are lined up along the second direction A2 at the rear surface 310B. The thermoelectric conversion elements 322, 324, and 326 may be lined up along the second direction A2 with gaps therebetween. The width of these gaps may be any width so long as it is possible to ensure electrical insulation between two thermoelectric conversion elements 320 that are adjacent to each other in the second direction A2.

In the configuration illustrated in FIG. 22, the thermoelectric conversion elements 321, 323, and 325 that are located at the side corresponding to the front surface 310A do not overlap with the thermoelectric conversion elements 322, 324, and 326 that are located at the side corresponding to the rear surface 310B when viewed from the third direction A3. However, at least one part of the thermoelectric conversion elements 321, 323, and 325 that are located at the side corresponding to the front surface 310A may overlap with at least one part of the thermoelectric conversion elements 322, 324, and 326 that are located at the side corresponding to the rear surface 310B in the same manner as in the first embodiment.

The thermoelectric conversion elements 321 to 326 have different lengths along the first direction A1. For example, the thermoelectric conversion elements 321 to 326 each extend along the first direction A1 from the first edge 301H to the second edge 301L. As a result of the thermoelectric conversion elements 321 to 326 each extending from the first edge 301H to the second edge 301L, the respective lengths of the thermoelectric conversion elements 321 to 326 increase in order from the thermoelectric conversion element 321 to the thermoelectric conversion element 326. The respective lengths of the thermoelectric conversion elements 321 to 326 along the first direction A1 differ due to the thermoelectric conversion elements 321 to 326 each extending from the first edge 301H to the second edge 301L in this manner.

As a result of the thermoelectric conversion elements 321 to 326 each extending from the first edge 301H to the second edge 301L, a temperature difference between both ends of each of the thermoelectric conversion elements 321 to 326 can increase. Increasing the temperature difference between both ends of each of the thermoelectric conversion elements 321 to 326 makes it possible to increase electrical power generated by each of the thermoelectric conversion elements 321 to 326. Note that the width between each of the first ends 321H to 326H and the first edge 301H may be the same. Also note that the width between each of the second ends 321L to 326L and the second edge 301L may be the same. The width between each of the first ends 321H to 326H and the first edge 301H and the width between each of the second ends 321L to 326L and the second edge 301L may be set as appropriate depending on the production process and the like.

In a case in which the respective lengths of the thermoelectric conversion elements 321 to 326 along the first direction A1 differ, respective electrical resistance values of the thermoelectric conversion elements 321 to 326 will also differ in a situation in which respective widths of the thermoelectric conversion elements 321 to 326 along the second direction A2 are roughly the same, for example. When the respective electrical resistance values of the thermoelectric conversion elements 321 to 326 differ, electrically connecting the thermoelectric conversion elements 321 to 326 in series results in current that can be generated in the thermoelectric conversion module 301 being determined by a thermoelectric conversion element 320 having a small electrical resistance value.

The thermoelectric conversion elements 321 to 326 are configured such that the respective widths of the thermoelectric conversion elements 321 to 326 along the second direction A2 differ so that the respective electrical resistance values of the thermoelectric conversion elements 321 to 326 are roughly the same. As one example, the respective lengths of the thermoelectric conversion elements 321 to 326 increase in order from the thermoelectric conversion element 321 to the thermoelectric conversion element 326 as previously described. In this case, the thermoelectric conversion elements 321 to 326 may be configured such that the respective widths of the thermoelectric conversion elements 321 to 326 along the second direction A2 increase in order from the thermoelectric conversion element 321 to the thermoelectric conversion element 326. The respective widths of the thermoelectric conversion elements 321 to 326 along the second direction A2 may increase in proportion to the respective lengths of the thermoelectric conversion elements 321 to 326 along the first direction A1. For example, in a case in which the length of the thermoelectric conversion element 326 along the first direction A1 is 1.5 times the length of the thermoelectric conversion element 321 along the first direction A1, the width of the thermoelectric conversion element 326 along the second direction A2 is 1.5 times the width of the thermoelectric conversion element 321 along the second direction A2. A configuration such as set forth above makes it possible for the respective electrical resistance values of the thermoelectric conversion elements 321 to 326 to be roughly the same.

Note that in a case in which respective thicknesses of the thermoelectric conversion elements 321 to 326 in the third direction A3 differ, the thermoelectric conversion elements 321 to 326 may be configured such that respective cross-sectional areas of the thermoelectric conversion elements 321 to 326, orthogonal to the first direction A1, differ so that the respective electrical resistance values of the thermoelectric conversion elements 321 to 326 are roughly the same.

Moreover, when the electrical resistivity of a p-type thermoelectric conversion element and the electrical resistivity of an n-type thermoelectric conversion element differ, electrical resistivity may be taken into account in a case in which the plurality of thermoelectric conversion elements 320 included in the thermoelectric conversion module 301 include both p-type thermoelectric conversion elements and n-type thermoelectric conversion elements. In this case, the thermoelectric conversion elements 321 to 326 may be configured such that respective cross-sectional areas of the thermoelectric conversion elements 321 to 326, orthogonal to the first direction A1, differ based on the electrical resistivity of the p-type thermoelectric conversion elements and the electrical resistivity of the n-type thermoelectric conversion elements so that the respective electrical resistance values of the thermoelectric conversion elements 321 to 326 are roughly the same.

In this manner, the sheet substrate 310 in the thermoelectric conversion module 301 according to the third embodiment has a trapezoidal shape. As a result of the sheet substrate 310 having a trapezoidal shape, freedom of arrangement location of the thermoelectric conversion module 301 can increase.

Other configurations and effects of the thermoelectric conversion module 301 according to the third embodiment are the same as for the thermoelectric conversion module 1 according to the first embodiment. The thermoelectric conversion module 301 can also be produced by the production method previously described in the first embodiment.

The foregoing description merely illustrates embodiments of the present disclosure and it goes without saying that various alterations may be made within the scope of the claims.

INDUSTRIAL APPLICABILITY

According to the present disclosure, it is possible to provide a thermoelectric conversion module that has increased generated electrical power while also having reduced size.

REFERENCE SIGNS LIST 1, 101, 201, 301 thermoelectric conversion module
1H, 201H, 301H first edge
1L, 201L, 301L second edge
2 heat source
210, 310 sheet substrate
210A, 310A front surface
10B, 210B, 310B rear surface
11, 211 substrate
11A, 211A front surface
11B, 211B rear surface
11a to 11h, 211a to 211h opening
12, 212 insulating layer
12A, 212A front surface
112B, 212B rear surface
12a to 12h, 212a to 212h opening
20 to 28, 220 to 228, 320 to 326 thermoelectric conversion element
20H to 28H, 220H to 228H, 320H to 326H first end
20L to 28L, 220L to 228L, 320L to 326L second end
31, 251, 331 first electrode
32, 248, 332 second electrode
30, 230, 330 connector
33 metal foil
34, 234 electrode layer
40 to 44, 240 to 247 electrode
50 to 53, 250, 252 to 258 electrode
60 to 68, 260 to 268 first joining member
70 to 78, 270 to 278 second joining member
280 to 287 wire
29, 29N, 29P, 229P1, 229P2 CNT sheet
301A, 301B side

The invention claimed is:

1. A thermoelectric conversion module comprising:
a sheet substrate that is electrically insulating and that has a front surface and a rear surface that are opposite to each other;
a plurality of thermoelectric conversion elements having an elongated shape extending along a first direction; and
a connector that, from a first electrode to a second electrode, electrically connects the plurality of thermoelectric conversion elements in series at a lengthwise end of each thermoelectric conversion element, wherein odd-numbered thermoelectric conversion elements among the plurality of thermoelectric conversion elements that are electrically connected in series through the connector, as counted from the first electrode, are located at a side corresponding to the front surface and are lined up along a second direction intersecting the first direction,
even-numbered thermoelectric conversion elements among the plurality of thermoelectric conversion elements that are electrically connected in series through the connector, as counted from the first electrode, are located at a side corresponding to the rear surface and are lined up along the second direction,
the plurality of thermoelectric conversion elements included in the thermoelectric conversion module are all p-type thermoelectric conversion elements,
the connector includes a plurality of wires located in the sheet substrate,
each of the plurality of thermoelectric conversion elements has a first end and a second end opposite to the first end in the first direction,
a heat source is arranged on the first end side in the first direction of each of the plurality of thermoelectric conversion elements, the heat source being configured to cause the first end of each of the plurality of thermoelectric conversion elements to be at a higher temperature than the second end thereof, and
for two thermoelectric conversion elements among the plurality of thermoelectric conversion elements that are adjacent to each other in the second direction, a wire among the plurality of wires electrically connects the first end of one of these thermoelectric conversion elements directly to the second end of the other of these thermoelectric conversion elements.

2. The thermoelectric conversion module according to claim 1, wherein the odd-numbered thermoelectric conversion elements that are located at the side corresponding to the front surface are located such as to overlap with the even-numbered thermoelectric conversion elements that are located at the side corresponding to the rear surface in plan view of the sheet substrate.

3. The thermoelectric conversion module according to claim 1, wherein the plurality of thermoelectric conversion elements included in the thermoelectric conversion module all contain carbon nanotubes.

4. The thermoelectric conversion module according to claim 1, wherein the plurality of thermoelectric conversion elements included in the thermoelectric conversion module all have rectangular shapes that are of roughly the same dimensions.

5. The thermoelectric conversion module according to claim 1, wherein, for the plurality of thermoelectric conversion elements included in the thermoelectric conversion module, respective lengths of the plurality of thermoelectric conversion elements along the first direction, respective widths of the plurality of thermoelectric conversion elements along the second direction, and respective thicknesses of the plurality of thermoelectric conversion elements are adjusted such that respective electrical resistance values of the plurality of thermoelectric conversion elements are roughly the same.

6. The thermoelectric conversion module according to claim 5, wherein the respective thicknesses of the plurality of thermoelectric conversion elements included in the thermoelectric conversion module are roughly the same, the respective lengths of the plurality of thermoelectric conversion elements differ, and the respective widths of the plurality of thermoelectric conversion elements differ.

7. The thermoelectric conversion module according to claim 6, wherein
the sheet substrate has a trapezoidal shape,
the sheet substrate has a first edge corresponding to one leg among two legs of a trapezoid and a second edge corresponding to another leg among the two legs,
a distance between the first edge and the second edge in the first direction increases along the second direction, and
the plurality of thermoelectric conversion elements extend along the first direction from the first edge to the second edge.

8. A method of producing a thermoelectric conversion module that includes:
a sheet substrate that is electrically insulating and that has a front surface and a rear surface that are opposite to each other;
a plurality of thermoelectric conversion elements having an elongated shape extending along a first direction; and
a connector that electrically connects the plurality of thermoelectric conversion elements in series at a lengthwise end of each thermoelectric conversion element, the method comprising:
an electrode layer formation step of forming an electrode layer on both of the front surface and the rear surface of the sheet substrate, the electrode layers including a first electrode and a second electrode;
an insulating layer formation step of forming an insulating layer on the electrode layers that have been formed on the substrate, where the sheet substrate has a configuration including the substrate and the insulating layer;
an element formation step of forming a thermoelectric conversion element layer on the insulating layer and on a surface of the substrate where the electrode layers are not formed;
a thermoelectric conversion element formation step of cutting a thermoelectric conversion element layer along the first direction to form the plurality of thermoelectric conversion elements lined up along a second direction intersecting the first direction; and
a connection step of connecting both lengthwise ends of each thermoelectric conversion element through a connector such that the plurality of thermoelectric conversion elements are all electrically connected, from a first electrode of one thermoelectric conversion element to a second electrode of an adjacent thermoelectric conversion element, in series,
wherein odd-numbered thermoelectric conversion elements among the plurality of thermoelectric conversion elements that are electrically connected in series through the connector, as counted from the first electrode, are located at a side corresponding to the front surface,
wherein even-numbered thermoelectric conversion elements among the plurality of thermoelectric conversion elements that are electrically connected in series through the connector, as counted from the first electrode, are located at a side corresponding to the rear surface,
wherein the plurality of thermoelectric conversion elements are all p-type thermoelectric conversion elements,
wherein the connector includes a plurality of wires located in the sheet substrate,
wherein each of the plurality of thermoelectric conversion elements has a first end and a second end opposite to the first end in the first direction,
wherein a heat source is arranged on the first end side in the first direction of each of the plurality of thermoelectric conversion elements, the heat source being configured to cause the first end of each of the plurality of thermoelectric conversion elements to be at a higher temperature than the second end thereof, and
wherein for two thermoelectric conversion elements among the plurality of thermoelectric conversion elements that are adjacent to each other in the second direction, a wire among the plurality of wires electrically connects the first end of one of these thermoelectric conversion elements directly to the second end of the other of these thermoelectric conversion elements.

9. The method of producing a thermoelectric conversion module according to claim 8, wherein the thermoelectric conversion element layer is a layer that contains carbon nanotubes.

10. The method of producing a thermoelectric conversion module according to claim 8, wherein the thermoelectric conversion element formation step is performed using a UV laser, a nanosecond laser, or a femtosecond laser.

11. The thermoelectric conversion module according to claim 1, wherein when each of the plurality of thermoelectric conversion elements generates electricity, a current flows from the first end to the second end along the first direction therein.

* * * * *